United States Patent
Irving et al.

(10) Patent No.: US 8,153,352 B2
(45) Date of Patent: Apr. 10, 2012

(54) MULTICOLORED MASK PROCESS FOR MAKING DISPLAY CIRCUITRY

(75) Inventors: Lyn M. Irving, Rochester, NY (US);
David H. Levy, Rochester, NY (US);
Lan B. Thai, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 1171 days.

(21) Appl. No.: 11/986,088

(22) Filed: Nov. 20, 2007

(65) Prior Publication Data

US 2009/0130600 A1    May 21, 2009

(51) Int. Cl.
*G03F 7/20* (2006.01)

(52) U.S. Cl. .................... 430/319; 430/321; 430/396

(58) Field of Classification Search .................... None
See application file for complete search history.

(56) References Cited

U.S. PATENT DOCUMENTS

| | | | |
|---|---|---|---|
| 5,262,893 A * | 11/1993 | Shrauger et al. | 359/565 |
| 5,391,507 A | 2/1995 | Kwasnick et al. | |
| 6,338,988 B1 | 1/2002 | Andry et al. | |
| 7,056,834 B2 | 6/2006 | Mei et al. | |
| 7,100,510 B2 | 9/2006 | Brost et al. | |
| 2004/0229411 A1 | 11/2004 | Battersby | |
| 2006/0063351 A1* | 3/2006 | Jain | 438/455 |
| 2007/0269750 A1* | 11/2007 | Irving et al. | 430/322 |

FOREIGN PATENT DOCUMENTS

JP    11-002713 A    *    1/1999

OTHER PUBLICATIONS

Computer-generated translation of JP 11-002713 (Jan. 1999).*

* cited by examiner

*Primary Examiner* — John A. McPherson
(74) *Attorney, Agent, or Firm* — J. Lanny Tucker

(57) ABSTRACT

A process for forming a pixel circuit is disclosed comprising: (a) providing a transparent support; (b) forming a multicolor mask having at least four different color patterns; (c) forming integrated electronic components of the pixel circuit having at least four layers of patterned functional material comprising a first conductor, a dielectric, a semiconductor, and a second conductor each layer of patterned functional material corresponding to the four different color patterns of the multicolor mask. The functional material is patterned using a photopattern corresponding to each color pattern.

16 Claims, 28 Drawing Sheets

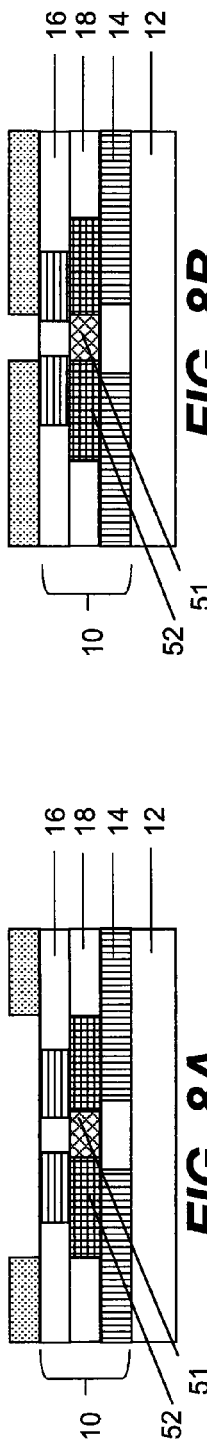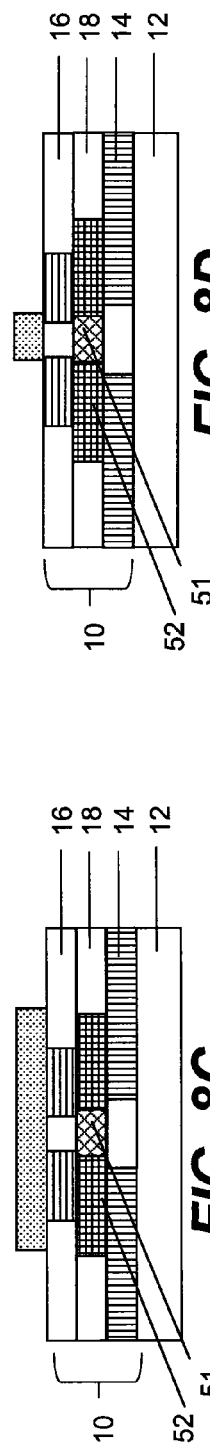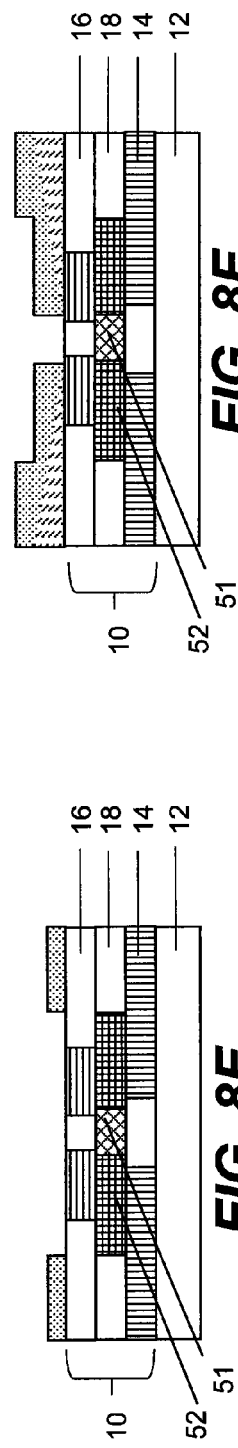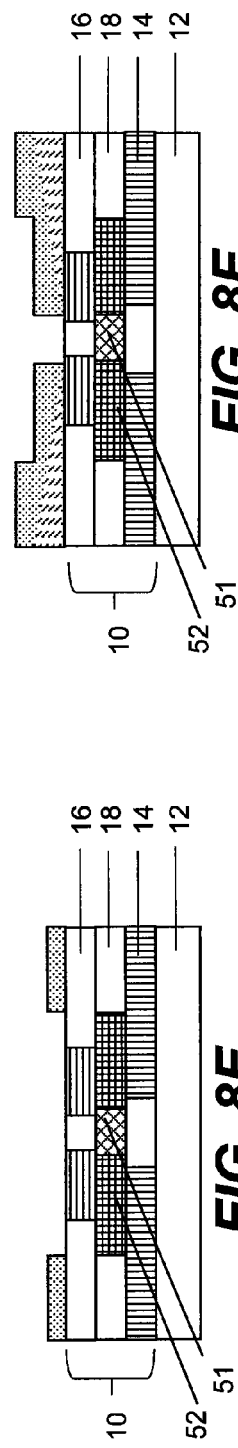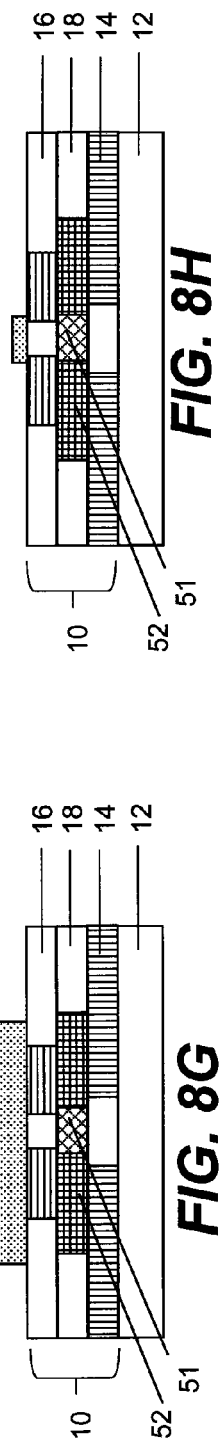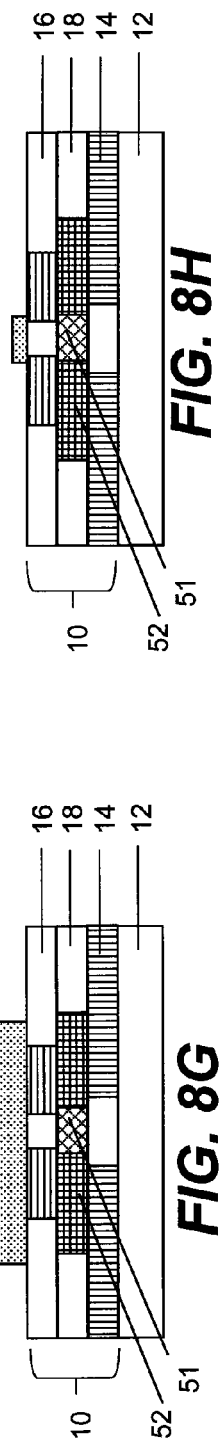

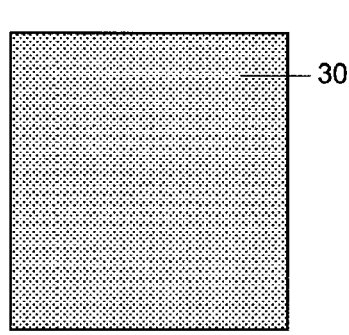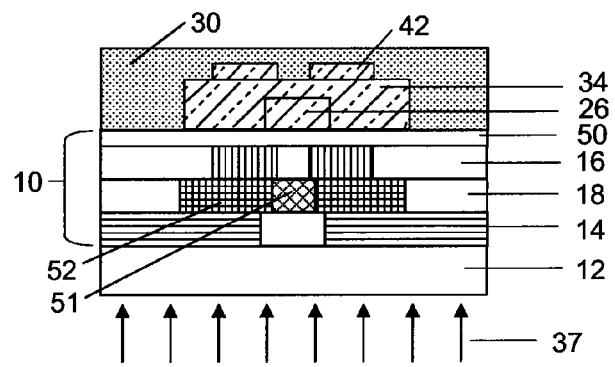
FIG. 12A  FIG. 12B
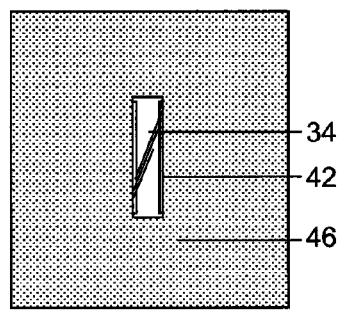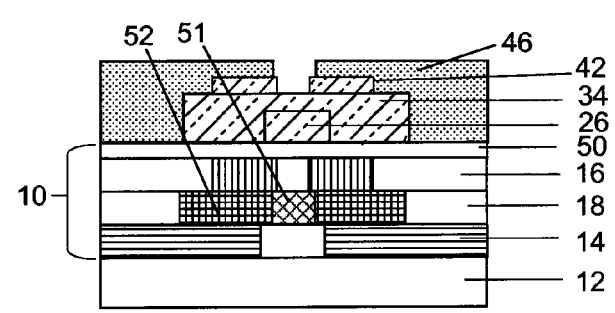
FIG. 12C  FIG. 12D
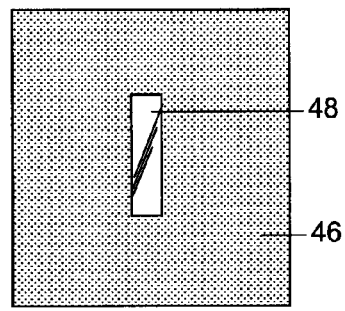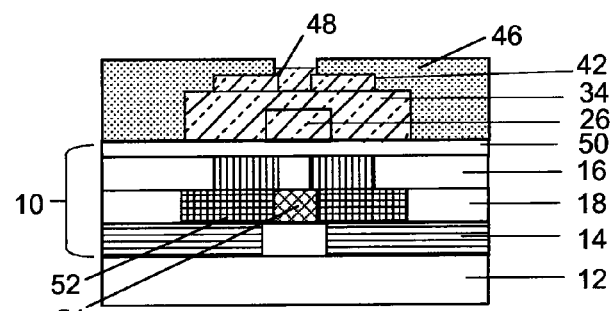
FIG. 12E  FIG. 12F
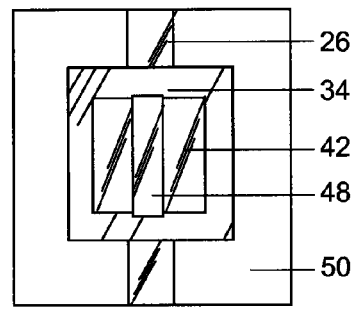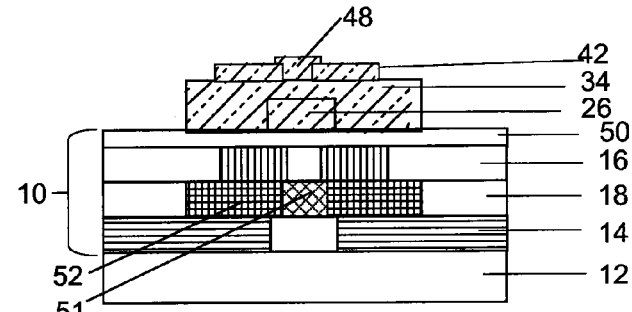
FIG. 12G  FIG. 12H

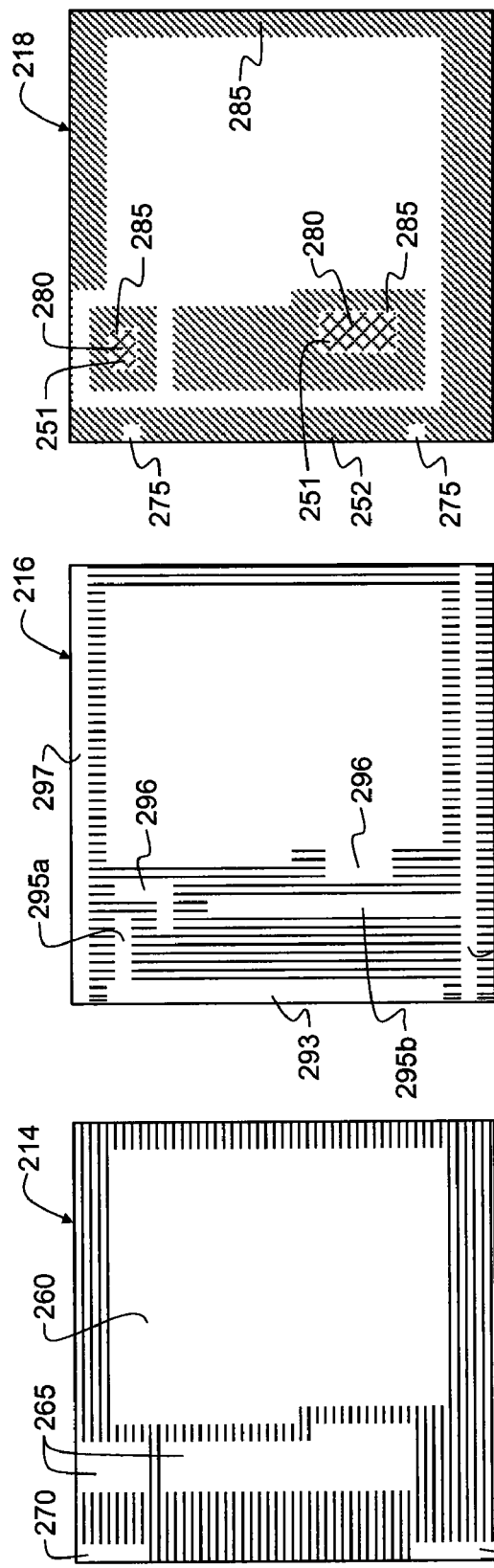

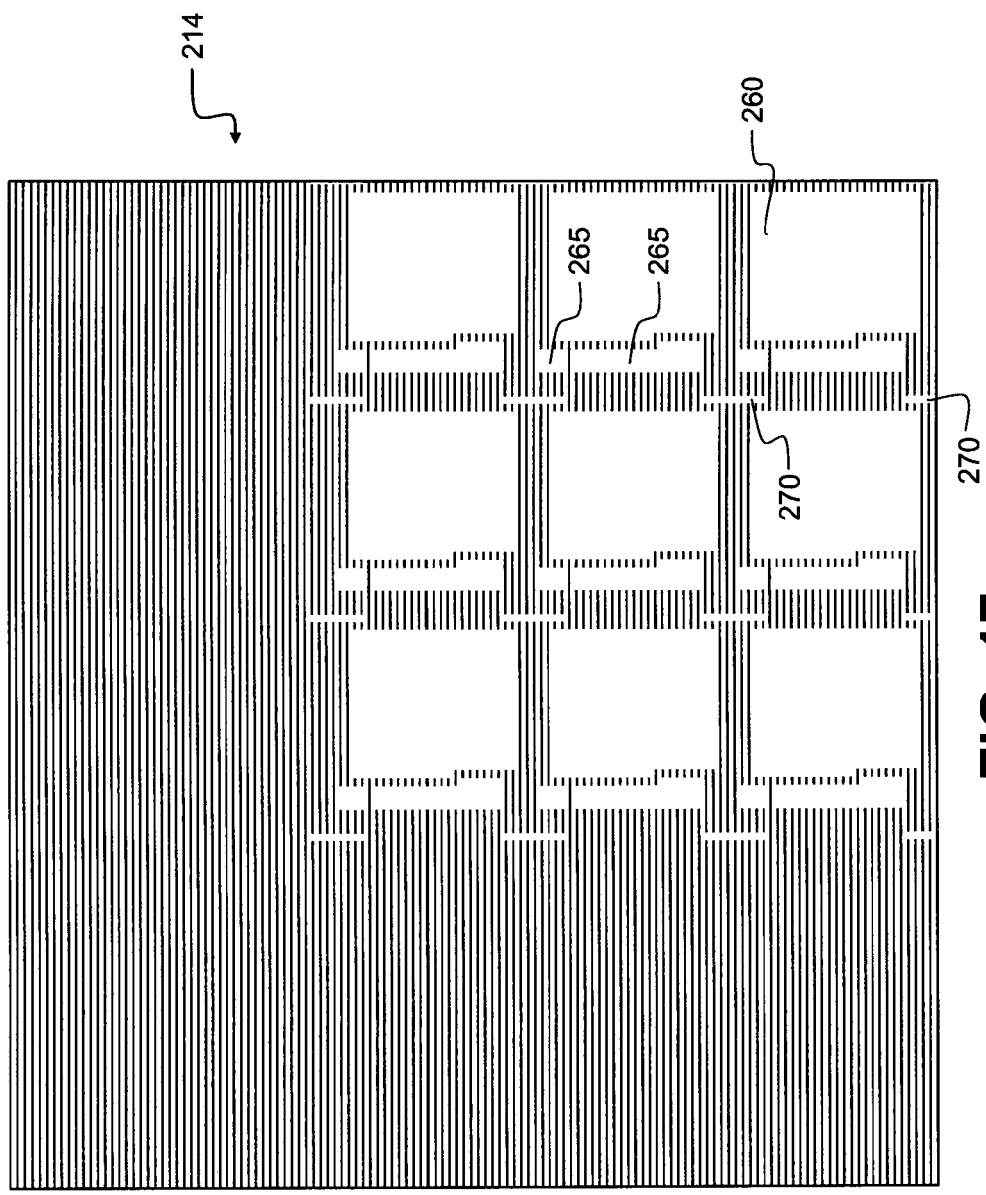

MULTICOLORED MASK PROCESS FOR MAKING DISPLAY CIRCUITRY

CROSS-REFERENCE TO RELATED APPLICATIONS

Reference is made to commonly assigned U.S. application Ser. No. 11/986,169, filed concurrently by Irving et al. and entitled, "COLORED MASK COMBINED WITH SELECTIVE AREA DEPOSITION," U.S. application Ser. No. 11/942,780, filed concurrently by Irving et al. and entitled "PHOTOPATTERNABLE DEPOSTION INHIBITOR CONTAINING SILOXANE," U.S. application Ser. No. 11/986,102, filed concurrently by Irving et al. and entitled "MULTICOLOR MASK," U.S. application Ser. No. 11/986, 068, filed concurrently by Irving et al. and entitled "INTEGRATED COLOR MASK," U.S. application Ser. No. 11/986,189, filed concurrently by Irving et al. and entitled, "GRADIENT COLORED MASK," and U.S. application Ser. No. 11/986,155, filed concurrently by Irving et al. and entitled, "COLORED MASK FOR FORMING TRANSPARENT STRUCTURES." All the above-identified applications incorporated by reference in their entirety.

FIELD OF THE INVENTION

The invention relates to a colored masking technique useful for forming display circuitry.

BACKGROUND OF THE INVENTION

Manufacture of many electronic components, including flat panel displays, RFID tags, and various sensing applications, relies upon accurately patterning layers of electrically active materials applied to a relatively large substrate. These products are composed of several layers of different patterned materials, where it is important the layers be in specific registration. The reasons for patterning accuracy are twofold. First of all, patterned features must be reproduced across large areas of a substrate while having precise control over their dimensions. Secondly, products built with these features typically are composed of several layers of different, but interacting patterned layers, where it is important that the layers be in specific registration or alignment.

Traditionally, the precise layer alignment required for fabrication of electronic components and devices is accomplished using conventional photolithography. An electrically active layer and a photoresist layer are deposited on a substrate, the position of an existing pattern on the substrate is detected, and an exposure mask is aligned to that existing pattern. The photoresist is exposed, developed, and the electrically active material is etched. Small variations in temperature and humidity in this precise operation may be enough to introduce alignment errors; rigid glass substrates are used with stringent environmental controls to reduce these variations. At the other extreme, conventional printing techniques such as offset lithography, flexography, and gravure printing also apply multiple layers at extremely high speeds, although at substantially lower overlay accuracy.

There is a growing interest in advancing printing technology toward fabrication of thin film electrical components (such as TFTs) on flexible or plastic substrates. These substrates would be mechanically robust, lighter weight, and eventually lead to lower cost manufacturing by enabling roll-to-roll processing. In spite of the potential advantages of flexible substrates, there are many issues affecting the performance and ability to perform alignments of transistor components across typical substrate widths up to one meter or more. In particular, for example, the overlay accuracy achievable using traditional photolithography equipment can be seriously impacted by substitution of a flexible plastic substrate for the rigid glass substrates traditionally employed. Dimensional stability, particularly as the process temperature approaches the transition glass temperature (Tg) of a support, water and solvent swelling, anisotropic distortion, and stress relaxation are all key parameters in which plastic supports are inferior to glass.

Typical fabrication involves sequential deposition and patterning steps. Three types of registration errors are common in these fabrication processes: fixed errors, scale errors, and local misalignments. The fixed error, which refers to a uniform shift of one pattern to another, is typically dominated by the details of the motion control system. Specifically, mechanical tolerances and details of the system integration ultimately dictate how accurately the substrate may be aligned to a mask, or how accurately an integrated print device may be positioned with respect to a registration mark on a moving web. In addition to fixed errors, scale errors may also be substantial. Errors in pattern scale are cumulative across the substrate and arise from support dimensional change, thermal expansion, and angular placement errors of the substrate with the patterning device. Although the motion control system impacts angular placement, pattern scale mismatch is largely driven by the characteristics of the support. Thermal expansion, expansion from humidity or solvent exposure, shrinkage from high temperature exposure, and stress relaxation (creep) during storage of the support all contribute to pattern scale errors. Further, local pattern mismatch arising from nonisotropic deformations may also occur, particularly since the conveyance process involves applying tension. A flexible support used in roll-to-roll manufacturing will typically stretch in the conveyance direction and narrow in width.

There are several approaches to address the registration problem for fabrication of electronics on flexible substrates, but at this point a leading methodology has yet to emerge. Attach/detach technology has been explored by French et al, wherein a flexible substrate is laminated to a rigid carrier and runs through a traditional photolithographic process (I. French et al., "Flexible Displays and Electronics Made in AM-LCD Facilities by the EPLaRTM Process" SID 07 Digest, pp. 1680-1683 (2007)). Unfortunately, these technologies ultimately produce a flexible electronics component only with the cost structure of current glass based processing. US Patent Publication No. 2006/0063351 describes coating the front side and back side of a substrate with one or more resist layers that may be activated simultaneously to impart distinct pattern images within each resist layer. The precoated substrate is inserted between a set of prealigned masks, or alternatively a dual wavelength maskless direct laser writing lithography system is used, to simultaneously expose the front and back sides. Active alignment systems to detect previously existing patterns and compensation schemes for deformation have also been suggested in U.S. Pat. No. 7,100, 510 by Brost et al. With this approach, instead of attaining accurate pattern overlay by maintaining tight specs on support dimensional stability and strict environmental control, the motion control system performs multiple alignments per substrate to compensate for distortion. The proposed solution of Brost et al. to adapt traditional printing equipment for active alignment may be viewed as exchanging the lens, mask, and lamp of a modern stepper with an integrated print device. It is difficult to imagine significant equipment cost difference or throughput advantage, particularly if the added task of distortion compensation is included. A fabrication cost advantage would likely come primarily from materials usage savings or removal of expensive vacuum deposition steps.

Another approach, which would potentially enable high speed processing with low capital investment, is to employ a self-aligning fabrication process. In a self-aligning process, a template for the most critical alignments in the desired structure is applied in one step to the substrate and from that point forward alignment of subsequent layers is automatic. Various methods have been described for fabricating self-aligned TFTs. Most of these methods allow self alignment of one layer to another layer, but do not significantly remove the need for very sophisticated alignment steps between several layers. For example, the gate electrode in some a-Si TFT processes is used as a "ask" to protect the channel area from doping and laser annealing of the silicon on either side of the channel region. The concept of self-aligned fabrication can be understood from U.S. Pat. No. 5,391,507 by Kwasnick et al., U.S. Pat. No. 6,338,988 by Andry et al., and US Patent Publication No. 2004/229411 by Battersby.

One published technique offering the potential for a fully self aligned process that eliminates the need for complex registration is Self-Aligned Imprint Lithography (SAIL), as illustrated in U.S. Pat. No. 7,056,834 by Mei et al. In imprint lithography, a variable-thickness resist is prepared on the electronically active layers and a sequencing of chemical etch and materials deposition is matched to controlled erosion of the photoresist to produce TFT structures. There are difficulties with the SAIL process, however. First, a robust nanoimprint technology is needed for webs. Second, the SAIL process requires high accuracy etch depth control, which may not be consistent with a low cost process. Finally, a significant limitation of the SAIL process is that layers produced by the mask cannot be fully independent. As an example, it is particularly challenging to form openings under continuous layers with this approach, an essential element in a matrix backplane design.

Active matrix displays are particularly challenging for electronic component registration and alignment issues, as displays move toward higher resolution, driving the display toward smaller pixel sizes, often with smaller associated electronics. Typically, active matrix displays include liquid crystal displays (LCDs) and elelctroluminescent displays such as organic light emitting diodes (OLEDs). In an active matrix layout, each pixel is driven by multiple circuit elements such as one, two, or even more transistors, one or more capacitors, and signal lines. For multicolor devices, a pixel is divided into subpixels each with a complete set of circuit elements. For a RGB (red, green, blue) device, each pixel consists of three subpixels, which emit red, green, and blue light. Examples of active matrix OLED devices are provided in U.S. Pat. Nos.: 5,550,066; 6,281,634; and 6,456,013; and EP Publication No. 1102317.

In the simplest form, an electroluminescent (EL) device is comprised of an anode for hole injection, a cathode for electron injection, and an electroluminescent media sandwiched between these electrodes to support charge recombination that yields emission of light. In the case where the electroluminescent media is organic, these devices are also commonly referred to as organic light emitting diodes, or OLEDs. A basic organic EL element is described in U.S. Pat. No. 4,356,429 by Tang. Recently, inorganic and inorganic-organic hybrids have become viable technologies for electroluminescent displays and lighting applications, as shown for example in "Tuning the performance of hybrid organic/inorganic quantum dot light-emitting devices," by Seth Coe-Sullivan et. al. in Organic Electronics, Volume 4, Issues 2-3, September 2003, Pages 123-130.

In order to construct a pixelated EL display useful, for example, in a television, computer monitor, cell phone display, or digital camera display, individual EL elements can be arranged as pixels in a matrix pattern. These pixels can all be made to emit the same color, thereby producing a monochromatic display, or they can be made to produce multiple colors such as a red, green, blue (RGB) display. For present disclosure purposes, a pixel is considered the smallest individual unit which can be independently stimulated to produce light. As such, the red pixel, the green pixel, and the blue pixel are considered as three distinct pixels.

Color EL displays have also recently been described that are constructed so as to have four differently colored pixels. One type of display having four differently colored pixels that are red, green, blue, and white in color is known as an RGBW design. Examples of such four pixel displays are shown in U.S. Pat. No. 6,771,028 by Winters, U.S. Pat. No. 7,012,588 by Siwinski, and U.S. Pat. No. 7,230,594 by Miller et al. Such RGBW displays can be constructed using a white organic EL emitting layer with red, green, and blue color filters. The white pixel area is left unfiltered. This design has the advantage of lower power consumption and current density compared to a three-color filtered white-emitting organic EL displays by using the higher efficiency white pixels to produce a portion of gray scale colors.

EL displays are sometimes driven with active matrix circuitry. Active matrix circuitry typically consists of active circuit components such as multiple transistors and one or more capacitors per pixel. Active matrix circuitry components also comprises signal lines such as power lines for supplying electric power to the pixels, data lines for supplying a voltage or current signal to adjust the brightness of the pixels, and select lines for sequentially activating a row of pixels thereby causing the pixels of each row to adjust in brightness in response to the signal of the data lines. The signal lines are typically shared by either a row or a column of pixels. These circuit components permit the pixels to remain illuminated even when the pixels are not being directly addressed.

There is an increase in interest in flexible active matrix displays and other electronics. Consequently, there is a growing interest in depositing and patterning thin film semiconductors, dielectrics, and conductors on flexible substrates, particularly because these supports would be more mechanically robust, lighter weight, and potentially lead to more economical manufacturing by allowing roll-to-roll processing. The present invention facilitates highly accurate patterning of thin films applied to various supports, in a simple and advantageous way, and can solve one or more of the aforesaid problems using various supports including flexible supports that allow flexible active matrix displays.

PROBLEM TO BE SOLVED BY THE INVENTION

The problems addressed by the current invention are to reproduce patterned features across even large areas while having precise control over the feature dimensions and the registration and alignment patterned features that are in different layers. Additionally, it is highly desirable to overcome these problems in a way that does not require expensive equipment or expensive processes.

SUMMARY OF THE INVENTION

The invention generally is accomplished by a. 1. A process for forming a pixel circuit, comprising:

(a) providing a transparent support having a first side;

(b) forming a multicolor mask having at least four different color patterns;

(c) forming integrated electronic components of the pixel circuit having at least four layers of patterned functional material comprising a first conductor, a dielectric, a semiconductor, and a second conductor each layer of patterned functional material corresponding to said at least four different color patterns of the multicolor mask, each layer of patterned functional material formed by:

(i) coating a layer of a photopatternable material sensitive to visible light on the first side of the transparent support after forming the multicolor mask;

(ii) exposing the layer of photopatternable material through the multicolor mask with visible light to form a photopattern corresponding to one color pattern of said color patterns of the multicolor mask, wherein the photopattern is composed of photopatternable material in a second exposed state that is different from a first as-coated state;

(iii) depositing a layer of a functional material before or after coating the photopatternable material; and (iv) patterning the functional material using the photopattern such that the resulting patterned functional material corresponds to said one color pattern;

wherein the multicolor mask comprises:

(i) a first color pattern corresponding to the first conductor, wherein a color portion of the first color pattern comprises a negative copy of the first conductor's pattern;

(ii) a second color pattern corresponding to the dielectric, wherein a color portion of the second color pattern comprises a positive copy of the dielectric's pattern;

(iii) a third color pattern corresponding to the semiconductor, wherein a color portion of the third color pattern comprises positive copy of the semiconductor's pattern; and (iv) a fourth color pattern corresponding to the second conductor, wherein a color portion of the fourth color pattern comprises a positive or negative copy of the second conductor's pattern.

Another aspect of the present invention is directed to an electronic display that can be made using the above-described process. In one embodiment, the invention is directed to an electronic display comprising:

(a) a transparent substrate;

(b) a multicolor mask having at least two color patterns formed on the transparent substrate; and (c) an array of pixels formed on the transparent substrate, each pixel having a pixel electrode and at least one thin film transistor having source-and-drain unit, semiconductor, and gate; wherein at least two of the source-and-drain unit, semiconductor and gate are vertically aligned with two different color patterns of the multicolor mask.

ADVANTAGEOUS EFFECT OF THE INVENTION

The invention provides a method for forming aligned layers without the need for expensive alignment equipment and processes. In particularly, the invention can provide a means for making electronic components for active matrix displays with less expensive alignment equipment and processes. Another advantage of the present invention is that it can provide a robust process for forming active matrix electronic components on flexible substrates.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein:

FIGS. 8A-8H illustrate different embodiments of the present invention for forming patterns using a blue colorscale mask by selection of resist and exposure conditions;

FIGS. 9A-12H show a sequence of exposure, processing, and deposition steps to form a multilayer electronic device using transparent components and a multilevel multicolor mask, wherein the sequence employs two etch patterning processes, a selective deposition process and a liftoff patterning process, further utilizing both the low density and high density regions of the blue color absorber pattern of the multicolor mask to form independent patterns of functional material;

FIGS. 16A-16D illustrate a color pattern in a multicolor mask useful for forming an active matrix display pixel;

FIG. 17 shows a color pattern for a 3×3 pixel design for forming a gate, pixel electrode, and underpass;

DETAILED DESCRIPTION OF THE INVENTION

Figure 1:
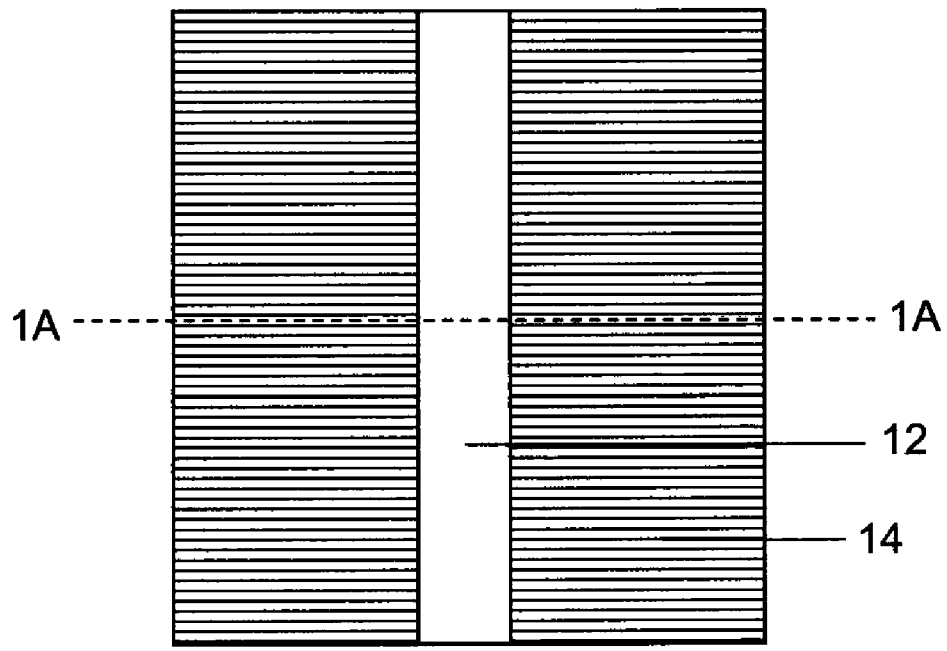
FIGS. 1 and 1A show a pattern of red color absorber on a transparent support.

For ease of understanding, the following terms used herein are described below in more detail.

"Vertical" means substantially perpendicular to the surface of a substrate.

"Transparent" generally denotes a material or construct that does not absorb a substantial amount of light in the visible portion (and/or infrared portion in certain variants) of the electromagnetic spectrum. In this invention, the transparency of a materials is only with reference to the colors of light that are being used in a particular process step. Transparent means at least 65% of the reference light passes through the member.

"Photopatternable" refers to a material that, upon exposure to light, changes in state, for example, in terms of solubility, tackiness, mechanical strength, permeability to etchants or gases, surface reactivity and/or index of refraction, to form a photopattern.

"Positive" refers to a pattern, which contains material in those areas above the colored parts of the photomask.

"Negative" refers to a pattern, which contains material in those areas above the transparent parts of the photomask.

"Multicolor mask" refers to the vertically aligned set of color absorbing patterns in the patterned structure. The color patterns of a multicolor mask may be in separate layers or in the same layer.

"Colorscale" refers to a color pattern of variable density at a particular or selected absorbance spectral range. The term is used similarly to the well-known term "grayscale."

A thin film transistor (TFT) is a likely electronic element that can benefit from the patterning process of this invention. The next three definitions refer specifically to thin film transistors.

As used herein, the terms "over," "above," and "under" and the like, with respect to layers in the thin film transistor, refer to the order of the layers with respect to the support, but do not necessarily indicate that the layers are immediately adjacent or that there are no intermediate layers.

"Gate" generally refers to the insulated gate terminal of a three terminal FET when used in the context of a transistor circuit configuration.

The preceding term descriptions are provided solely to aid the reader, and should not be construed to have a scope less than that understood by a person of ordinary skill in the art or as limiting the scope of the appended claims.

The process of this invention can be used to generate any variety of multilayer structures containing patterned layers with fixed vertical registration. This process is therefore capable of producing monolithically integrated structures that can be designed to function as conductors, inductors, capacitors, transistors, diodes, photodiodes, light emitting diodes, and other electronic or optoelectronic components. Furthermore, the patterning technology can be used to simultaneously produce a number of these devices arranged in a way to produce useful electronic circuitry.

In the preferred embodiment, accurate pattern overlay over large areas and on flexible supports can be enabled by use of a color-encoded mask, which is prepared directly on the support, in combination with spectrally sensitized photoresists. The color-encoded mask can contain, either in one structure, or in multiple portions, all or most of the patterning information for the system. Transparent electronic materials can be subsequently deposited in layer-by-layer fashion. Spectrally sensitized photoresists can be selectively exposed through the multicolored mask to form photoresist patterns on the front side of the support, vertically aligned to the color mask. Patterning of the electrically active layers can be accomplished by using etch, liftoff, or selective deposition process to pattern the gate, dielectric, semiconductor, and source/drain layers. The multicolor mask can be part of the substrate, and is formed on either only the side of the active layers or on both sides of the substrate. The multicolor mask can contain pattern information for all of the layers in a process. Fabrication using the present invention can be fully self-aligning, and catastrophic overlay errors arising from dimensional change of supports, web weave, and transport errors can be avoided.

In one embodiment of the present invention, the entire multicolor mask remains as part of the final device. In another embodiment of the invention, only a first portion of the multicolor mask remains in the final device. These embodiments will be better understood with respect to the figures.

The figures and following description illustrate a masking scheme of the current invention. Illustrative example of this description utilizes three masking layers, composed of different color absorbing materials, and utilizes photopatternable materials, sensitive to colored light, to pattern transparent functional layers. The figures are intended to illustrate the present invention and should not be considered limiting. Multicolor masks of two masking layers, as well as multicolor masks of greater than three masking layers are alternative embodiments of the present invention. Additionally, the figures illustrate the color patterns of the multicolor mask as separate layers for descriptive clarity. In other embodiments of the present invention all of the color patterns to reside in a single layer can be easily understood with respect to the figures in this disclosure. Furthermore, embodiments where a multiple, but not all, color patterns are in a single layer fall within this invention.

Light used for exposing can be panchromatic or colored. Panchromatic light refers to light that has some spectral intensity over the visible spectrum. Panchromatic light should be recognized by one skilled in the art as light that contains multiple colors. Colored light generally refers to light that has high intensity in certain spectral regions and lower intensities in others. Colored light can be described by the wavelength of the maximum intensity ($\lambda_{max}$) and by the FWHM (full width at half the maximum), or by the bandpass. Color patterns, may be described by their absorbance as a function of wavelength, or by their absorption spectral range. The absorption spectral range for a typical color pattern can be defined for present purposes as the wavelengths where the absorbance value is in the range of the maximum absorbance to 10% of the maximum absorbance. Preferred color absorbers are those materials with maximum absorption in a selected portion of the visible band and maximum transmission in remaining portions.

Figure 1A:
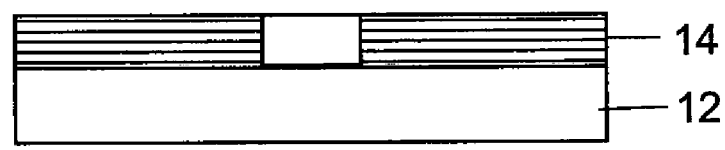
Figure 2:
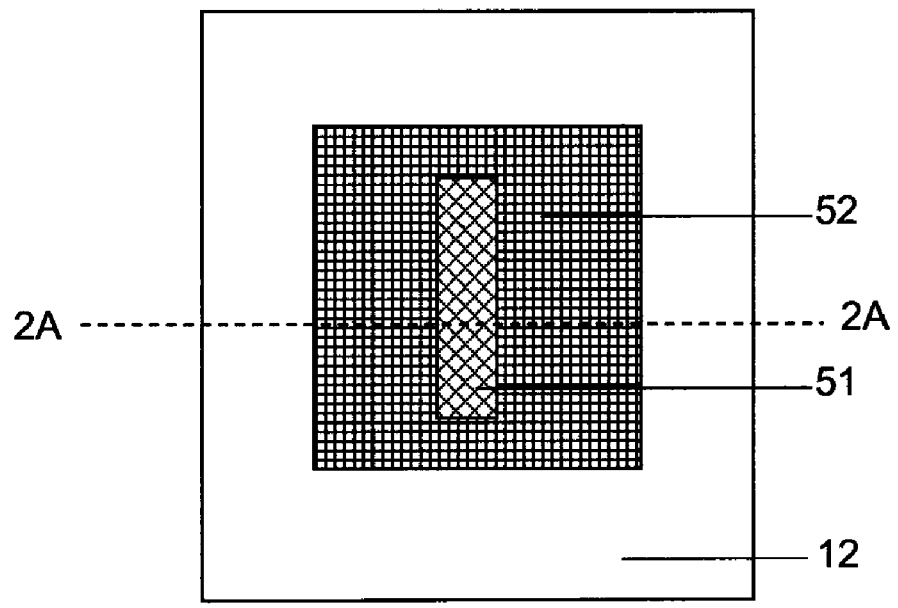
FIGS. 2 and 2A show a variable density pattern of blue color absorber on a transparent support.
Figure 2A:
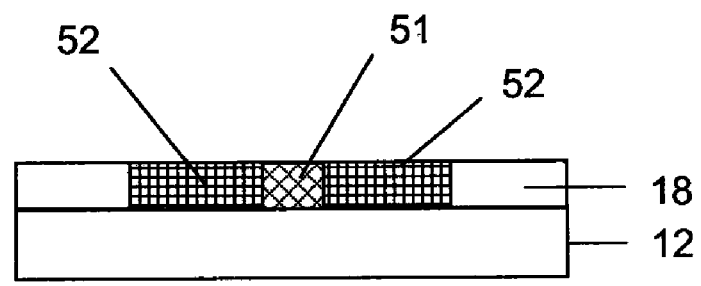
Figure 3:
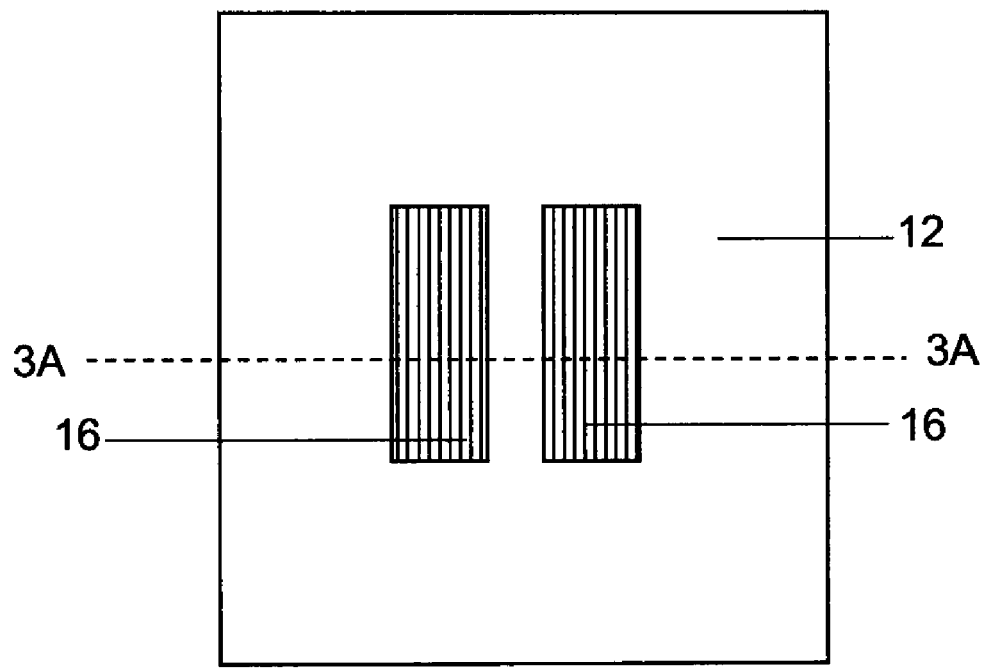
FIGS. 3 and 3A are a pattern of green color absorber on a transparent support.
Figure 3A:
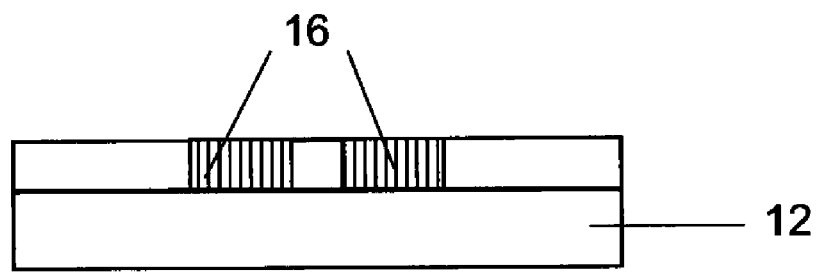
Figure 4:
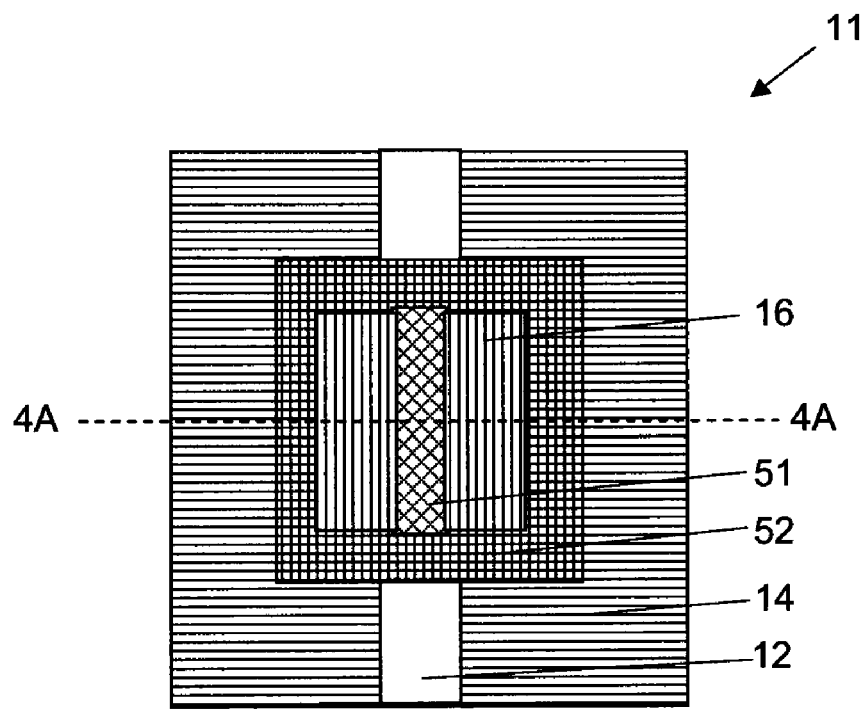
FIGS. 4 and 4A show the individual color absorber layers in a layered structure on support material forming a multicolor mask.
Figure 4A:
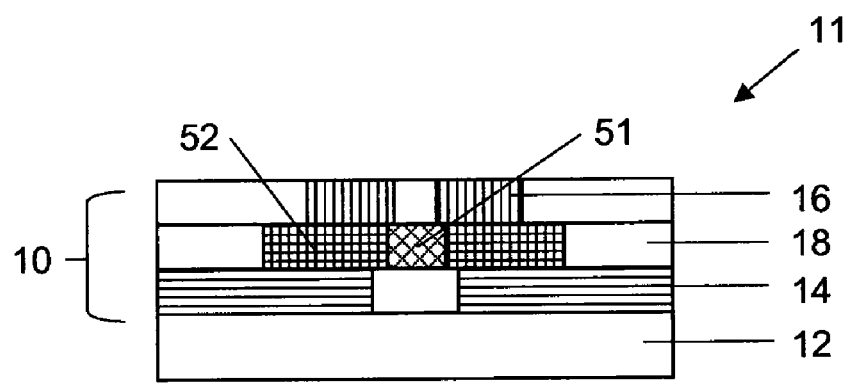

Referring now to the drawings, FIGS. 1-3A show the patterns of three mask layers. FIGS. 1 and 1A show the pattern of a first mask layer as a pattern of a red color absorber (14) on transparent support (12). FIGS. 2 and 2A show the pattern of a second mask layer as a pattern of a blue color absorber having variable density (18) on transparent support (12). As shown in FIGS. 2 and 2A, the blue variable density, or colorscale, mask layer has two sections 51 and 52 each with a different optical density. FIG. 3 and 3A show the pattern of a third mask layer as a pattern of a green color absorber (16) on transparent support (12). FIGS. 4 and 4A show an article 11 composed of individual color absorber layers (14, 16, 18) in a layered structure on support material forming multicolor mask (10).

An advantageous feature is that the multicolor mask can contain in one structure most or all of the patterning information for the system in a color-encoded form. This is significant because the entire article, including support (12) may be exposed to varying temperature, pressure, solvent, and humidity treatments during the fabrication and coating steps, naturally leading to variations in dimension (such as shrinkage or thermal expansion) of the support. Web transport systems apply tension to the support, leading to dimensional instability as well. In fact, the lowest cost and potentially cheapest support materials are likely to have a higher degree of dimensional instability. For example, polyester film has a thermal expansion coefficient of 0.0018% per ° C., such that a 5° C. change will result in a dimensional change of 90 µm over 1 meter. The effect of humidity expansion and thermal expansion need not lead to cumulative and catastrophic alignment errors when a multicolor mask element (10) is provided. Simply, the patterning information is contained in the color absorbing layers that are attached to the support, and thus remain in fixed vertical alignment as the support shrinks or expands and are not impacted by support dimensional change.

FIGS. 5A-8H show embodiments of processes for selectively forming patterns of photopatternable material registered with a specific color absorber pattern of multicolor mask (10). The specific pattern to be formed can be selected by adjusting the sensitivity distribution of the photopatternable film. A photopatternable layer with a sensitivity to blue, green, or red light can be coated on the multicolor mask. This photopatternable layer is exposed with light through the multicolor mask. The color absorbers of the multicolor mask selectively transmit the illuminating light, thereby exposing the photopatternable layer to a pattern of colored light. For example, a cyan mask absorbs red light while transmitting blue and green light. Similarly, a magenta mask absorbs green light while transmitting red and blue light and a yellow mask absorbs blue light while transmitting red and green light. Thus, by combining the properties of such individual masks, a multicolor mask may be formed to provide patterns of selectively transmitted light.

The sensitivity distribution of the photopatternable layer, in a preferred embodiment, is completely contained within the absorption spectrum of one of the color absorbing materials used in multicolor mask (10) and completely isolated from the absorption spectrum of the other color absorbing materials in multicolor mask (10). In a preferred embodiment of the invention, the photopatternable layer contains a either a polymerizable compound or a photosolulizable matrix and a photoinitiator responsive only to specific wavelengths of colored light. Absorption of colored light by the photoinitiator initiates the photopolymerization or photosolubilization reaction.

The photopatternable layer may contain additional components that include but are not limited to polymeric binders, fillers, pigments, surfactants, adhesion modifiers, antioxidants, co-initiators, chain transfer agents, and the like. One convenient way to modify the sensitivity distribution of the photopatternable layer is with the identity of the photoinitiator. The spectral distribution of illuminating light may be specifically selected to minimize effects from unwanted absorption of the color absorbing material and/or unwanted sensitivity of the photopatternable layer. Following exposure, the photopatternable layer is developed. The remaining pattern may be the positive image of the mask layer, or the negative pattern depending on the type of photopatternable material used.

Figure 5A:
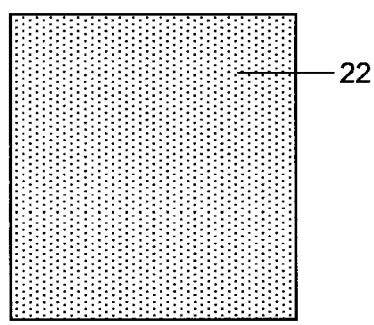
FIGS. 5A-5D show a process for selectively forming a pattern of material registered with the red color absorber pattern of the multicolor mask.
Figure 5B:
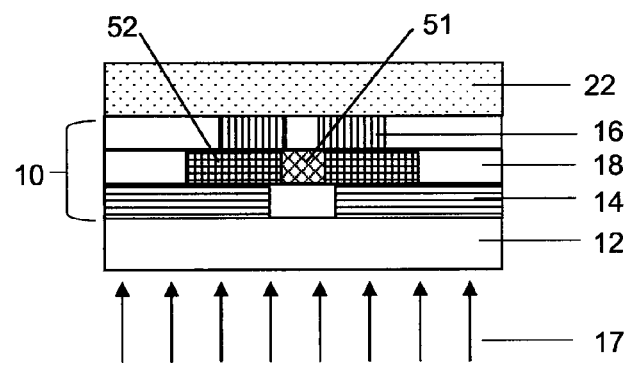

FIGS. 5A-5D show a process for selectively forming a pattern of material registered with the red color absorber pattern of the multicolor mask. Referring now to FIGS. 5A and 5B, there is illustrated a schematic plan view and cross-sectional view of the multicolor mask (10) that has been coated with a red photopatternable layer (22) and exposed with a light source containing red light. This light source may provide red light, white light, or panchromatic light. In this embodiment, the photopatternable material of the photopatternable layer is negative working.

Figure 5C:
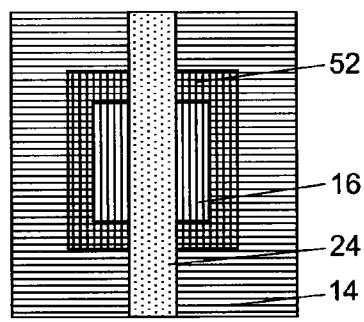
Figure 5D:
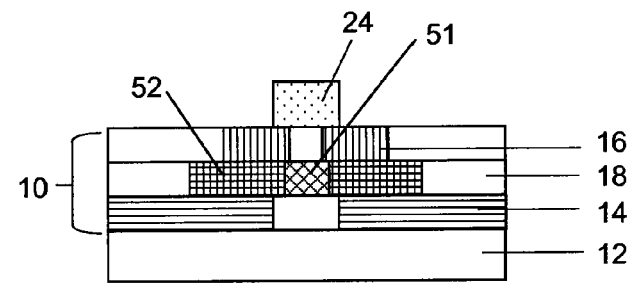

FIGS. 5C and 5D show a schematic plan view and cross-sectional view of the resulting structure after the exposed red photopatternable film from FIG. 5A has been developed, forming a photopattern of red photosensitive material (24) registered with the red color absorber pattern (14) of multicolor mask (10).

Figure 6A:
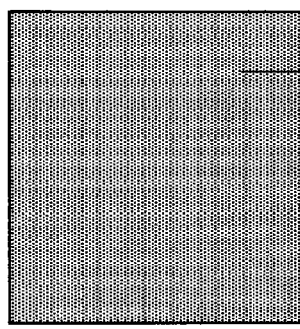
FIGS. 6A-6D show a process for selectively forming a pattern of material registered with the green color absorber pattern of the multicolor mask.
Figure 6B:
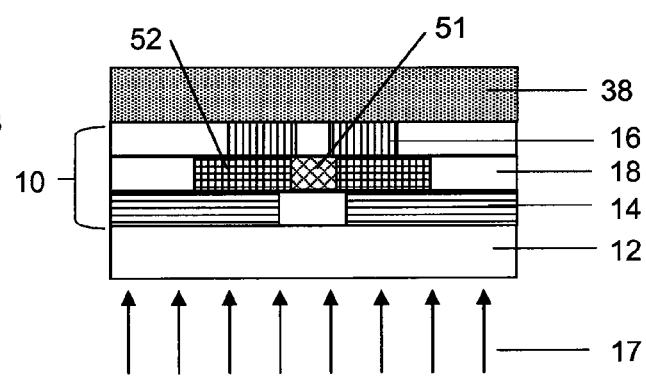
Figure 6C:
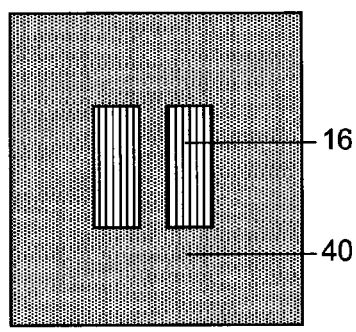
Figure 6D:
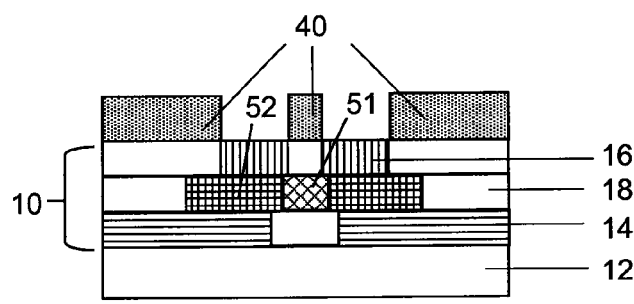

FIGS. 6A-6D show a process for selectively forming a pattern of material registered with the green color absorber pattern of the multicolor mask. Referring now to FIGS. 6A and 6B, there is illustrated a schematic plan view and cross-sectional view of the multicolor mask (10) was coated with a green photopatternable layer (38) and exposed with a light source containing green light. This light source may provide green light, white light, or panchromatic light. In this embodiment, the photopatternable material of the photopatternable layer is negative working.

FIGS. 6A and 6B show a schematic plan view and cross-sectional view of the resulting structure after the exposed green photopatternable film has been developed, forming a pattern of green photopatterned material (40) registered with the green color absorber pattern (16) of multicolor mask (10).

FIGS. 7A-8H illustrate the use of variable-density color filters, or colorscale masks, in photopatterning processes to form multiple patterns. Variable-density color filters, or colorscale masks, increase the addressability of the color mask process. When using a conventional photoresist with a distinct exposure threshold, a variable density color mask can be used to create multiple patterns. Conventional photoresist with a distinct exposure threshold can be considered "binary resists." Typically, in order to form distinct patterns with a binary resist and a multilevel mask, the resist should transition from soluble to insoluble, or vise-versa, over a narrow exposure range. The exposure of the standard photoresist is then placed selectively at a particular lightness level of the mask.

For the sake of simplicity, "effectively exposed" for binary resists can be used to mean exposure levels sufficient to cause the resist to transition from an as-coated state to a second state, for example, either soluble to insoluble, or vise-versa. When a low contrast resist material is used with a variable density color mask, 3-D structures in the photoresist layer may be produced. Low contrast resist materials can be referred to as "multilevel resists." As would be understood by one skilled in the art, multilevel resists are formulated such that the amount of material transitioned from the as-coated state to a second state varies as a function of exposure. This relationship between transitioned material and exposures yields different heights of developed resist based the on exposure level, allowing for 3D structure formation. Multilevel resists are considered to have a "threshold exposure" taken here to mean the exposure level sufficient to cause some portion of the resist to transition from the as-coated state to a second state, for example, either soluble to insoluble or insoluble to soluble.

FIGS. 7A-7F show a process for selectively forming a pattern of material registered with the variable density blue color absorber pattern of the multicolor mask. The variable density blue color absorber 18 has two sections 51 and 52 each with a different optical density. For the purposes of this example, section 51 is higher in optical density than section 52, but with the same absorbance spectral range. It should be understood that any pattern having sections of different optical densities with the same absorbance spectral range is considered a variable density color mask of the present invention. Colorscale masks may also vary gradually in density or in a step-wise fashion as illustrated by portions 51 and 52.

Figure 7A:
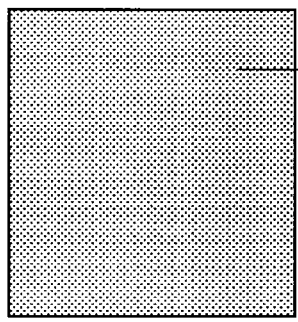
FIGS. 7A-7F illustrate the use of variable-density color filters, or colorscale masks, in photopatterning processes to form multiple patterns.
Figure 7B:
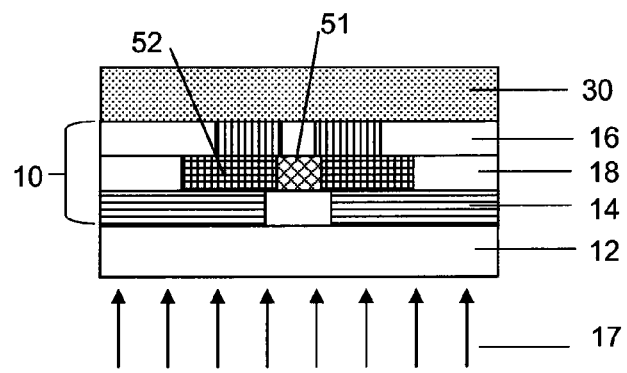

FIGS. 7A and 7B show a schematic plan view and cross-sectional view of the multicolor mask (10) that has been coated with a blue sensitized photopatternable film (30) and exposed with a light source containing blue light. This light source may provide blue light, white light, or panchromatic light.

Figure 7C:
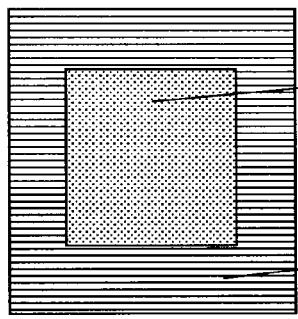
Figure 7D:
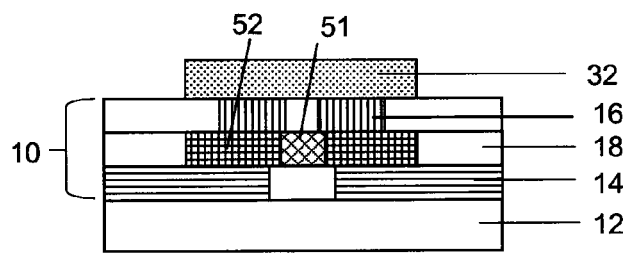

In one embodiment, a binary positive working blue photopatternable material is exposed with an exposure level such that the resist is effectively exposed only where there is no blue absorber, as shown in FIGS. 7A and 7D, as the combination of sections 51 and 52.

Figure 7E:
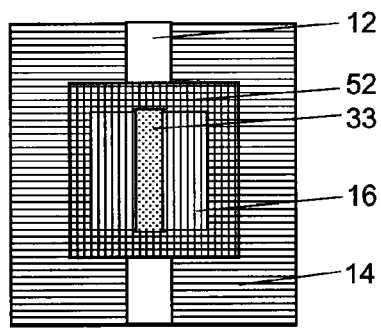
Figure 7F:
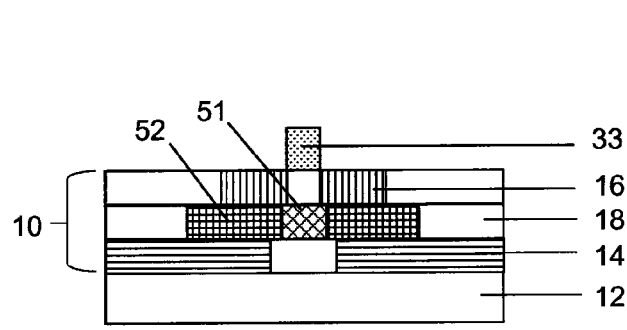

FIGS. 7C and 7D show a schematic plan view and cross-sectional view of the resulting structure after the binary resist has been developed, forming a pattern of blue resist material (32) registered with the entire variable density blue color absorber pattern (18) of multicolor mask (10). In another embodiment, a binary positive working blue photopatternable material is exposed with an exposure level such that the resist is effectively exposed where there is no blue absorber and in the low density section 52 of variable density blue color mask 18, as shown in FIG. 7E. FIGS. 7E and 7F show a schematic plan view and cross-sectional view of the resulting structure after the binary resist has been developed, forming a pattern of blue resist material (33) registered with the high density portion 51 of the variable density blue color absorber pattern (18) of multicolor mask (10). A photoresist exposure process is said to obey the law of reciprocity if the photosensitive material responds to the total exposure received, the integral of illumination over time. One skilled in the art will recognize that the specific exposures required to selectively form the structures of FIGS. 7C and 7E depend on the exposure threshold of the photosensitive material employed as well as the optical density of separate regions 51 and 52 in colorscale mask layer 18, and may possibly also depend on the intensity of the light source employed.

There are a number of different ways to use a variable density color mask, as will be better understood with respect to FIGS. 8A through 8H. Shining blue light through the color mask transmits two-levels yellow pattern (in this case, low density portion 52 or high density portion 51 depending on the sensitivity of the resist and the exposure time). All FIGS. 8A through 8H show the final resist pattern after development. FIGS. 8A and 8B illustrate using a binary negative resist with different exposure levels. In FIG. 8A, the exposure level is chosen so that the both portions of the variable density color mask 18 (51 and 52) filter the light to the resist, and the resist is only effectively exposed through the clear portions of color mask 18. In FIG. 8B, the exposure level is chosen so that only the high density portion 51 of color mask 18 filters the light to the resist, and the resist is effectively exposed through the clear portions of mask 18 and the low density portion 52.

FIGS. 8C and 8D are analogous to FIGS. 8A and 8B using a binary positive working resist and should be understood from the previous description. FIGS. 8E and 8F illustrate the use of a multilevel negative resist at different exposure levels. FIG. 8E shows an exposure level chosen such that the both portions of the variable density color mask 18 (51 and 52) filter the light to the resist, and the resist is only exposed above the threshold value through the clear portion of mask 18. FIG. 8F, the exposure level is chosen so that the high density portion 51 of color mask 18 filters the light to the resist to below the threshold level, and the resist is exposed through the clear portions of mask 18 and the low density portion 52.

As seen in FIG. 8F, the resist above the clear portion of the mask 18 received a higher exposure level resulting in a greater % transition, in this case from soluble to insoluble. Similarly, the resist above the low density portion 51 received an exposure such that only a portion of the resist transitioned from soluble to insoluble. FIGS. 8G and 8H are analogous to FIGS. 8E and 8F using a multilevel positive working resist where the transition of the resist is from insoluble to soluble as a function of exposure; these figures should be understood from the previous descriptions.

An advantageous aspect of this process is the ability to use one of the color patterns of the multicolor mask to form an aligned pattern of a functional material on at least a portion of the multicolor mask. A number of methods can be used to cause this patterning. Therefore, both functional materials and photopatternable materials are applied to the multicolor mask and patterned using colored light. General classes of functional materials that can be used include conductors, dielectrics or insulators, and semiconductors. The spectral distribution of illuminating light is modulated by the transmittance of all previously applied and patterned layers. For the purposes of this discussion, a multicolor mask includes all color absorbing portions of the patterned structure with the exception of the photopatternable film.

Because the colored light photopatterning process described above and illustrated using FIGS. 1-8H results in a change in permeability, solubility, tackiness, mechanical strength, surface reactivity, or index of refraction of the photopatterned material, these properties may be exploited in subsequent fabrication steps. Particularly useful methods to pattern functional and electronic materials using this invention are referred to as liftoff, selective etch, and selective deposition processes.

FIGS. 9-12H show a possible sequence of exposure, processing, and deposition steps that would allow construction of a multilayer electronic device as seen in FIGS. 12G and 12H.

Figure 9A:
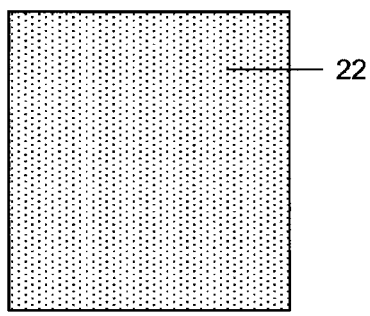
Figure 9B:
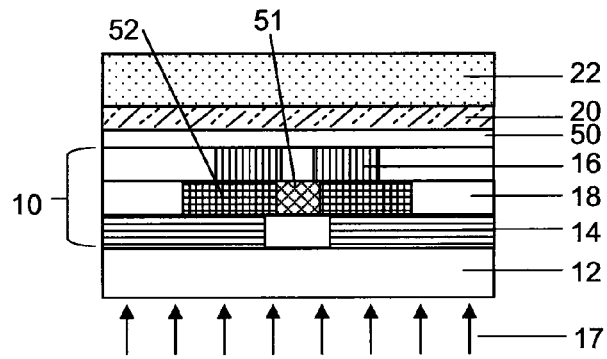
Figure 9C:
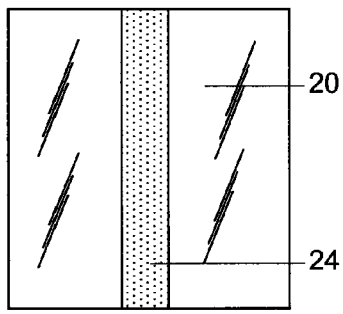
Figure 9D:
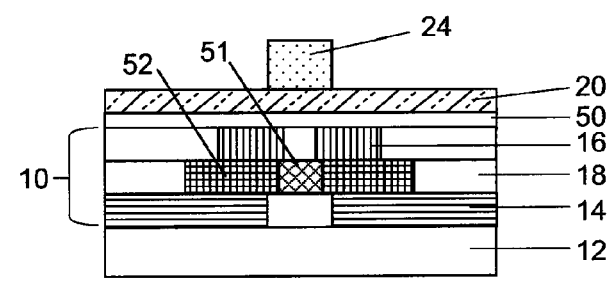
Figure 9E:
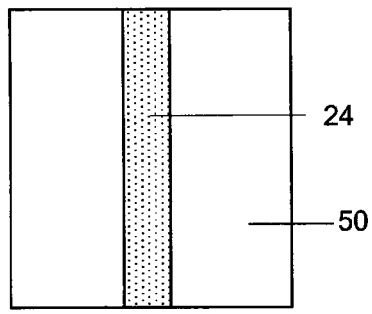
Figure 9F:
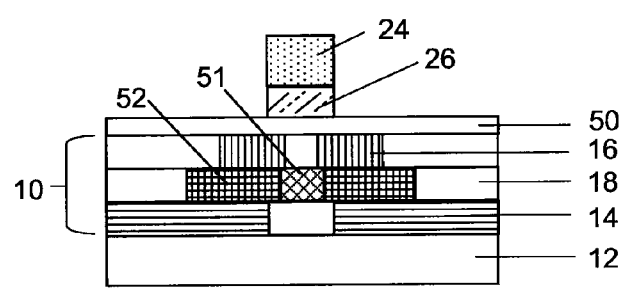
Figure 9G:
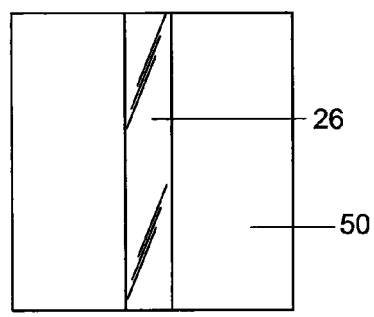
Figure 9H:
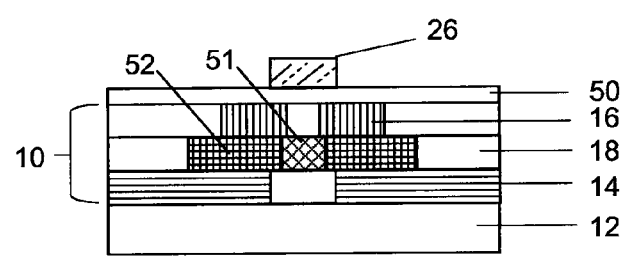

FIGS. 9A-9H illustrate the coating and patterning steps for the first transparent layer of the electronic device using a red photopatternable coating and a selective etch process. FIGS. 9A and 9B show multicolor mask (10) coated with a first transparent functional material (20) and a red photopatternable material (22). This structure is exposed with a light source containing red light. By way of illustration, the functional material (20) could be a transparent conducting oxide material such as ITO or aluminum doped ZnO. Because the photopatternable coating (22) drawn in this structure is sensitive only to red light, the light source may be a white light source, or a colored light source containing red light. Referring now to FIGS. 9C and 9D, there is illustrated the resulting structure after the exposed red photopatternable film has been developed, forming a pattern of red cured material (24) registered with the red color absorber pattern (14) of multicolor mask (10). FIGS. 9E and 9F show the structure after an etch step wherein exposed portions of transparent functional material (20) are removed in, for example, an acid bath, forming a pattern of transparent functional material (26) registered to the red color absorber pattern (14) of multicolor mask (10). FIGS. 9G and 9H show the structure of FIG. 9E after the pattern of red cured material (24) is removed using, for example, an oxygen plasma treatment.

Figure 10A:
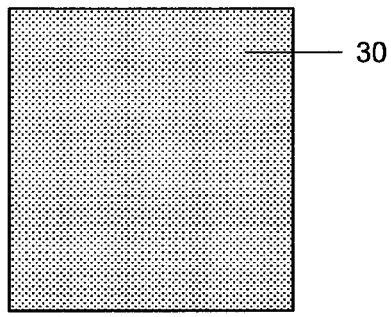
Figure 10B:
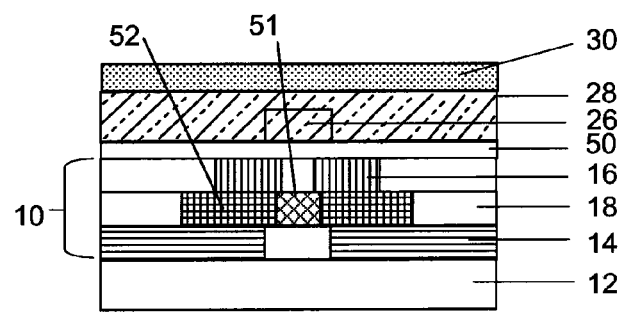

FIGS. 10A-10H illustrate coating and patterning steps for the second transparent layer of the electronic device using a blue photosensitive material using a selective etch process. Alternatively, the second transparent layer could be patterned be a selective deposition process, a liftoff process, or a light curing process. FIGS. 10A and 10B show the multicolor mask (10), and the first patterned transparent layer 26, coated with a uniform layer of transparent functional material (28) and a blue photopatternable layer (30). In the embodiment of FIG. 10A, blue photopatternable layer (30) is a binary positive resist. As shown, the structure is exposed with a light source containing blue light at an exposure level chosen so that the both portions of the variable density color mask 18 (51 and 52) filter the light to the resist, and the resist is only effectively exposed through the clear portions of color mask 18.

Figure 10C:
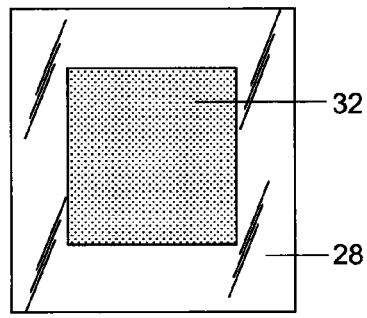
Figure 10D:
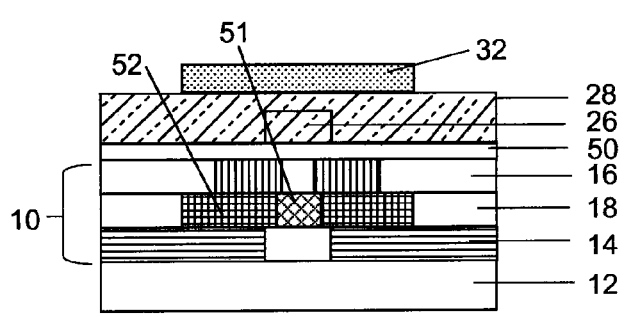

By way of example, the transparent functional material (28) could be a dielectric material such as aluminum oxide or alternatively a semiconducting layer such as zinc oxide. This material could be a dielectric or semiconducting layer precursor that is converted in an annealing step to form the electrically functional material. Multiple layers of transparent functional layers could potentially be coated at this step. By way of example, a transparent coating of a dielectric material could be first applied and a second transparent coating of semiconductor material could be subsequently applied. Because the photopatternable coating (30) shown in FIGS. 10A and 10B is sensitive only to blue light, the light source may be a blue light, a white light source, or a colored light source containing blue light. FIGS. 10C and 10D show the resulting structure after the exposed blue photopatternable material (30) from FIG. 10A has been developed, forming a pattern of blue photopatterned material (32) registered with the blue variable density color absorber pattern (18) of multicolor mask (10).

Figure 10E:
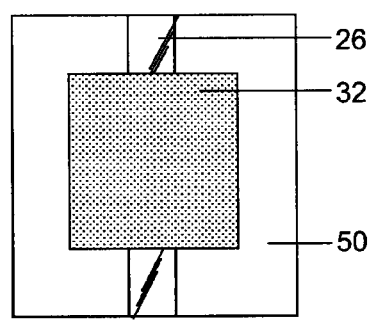
Figure 10F:
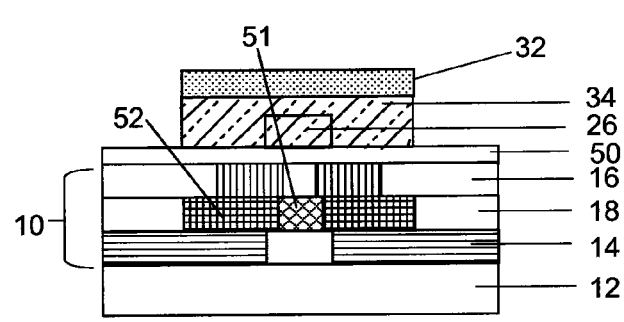
Figure 10G:
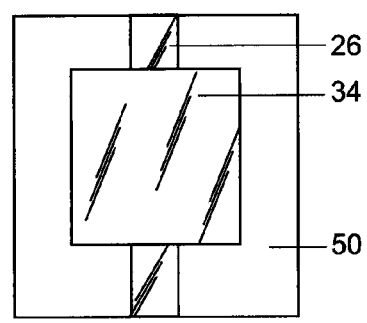
Figure 10H:
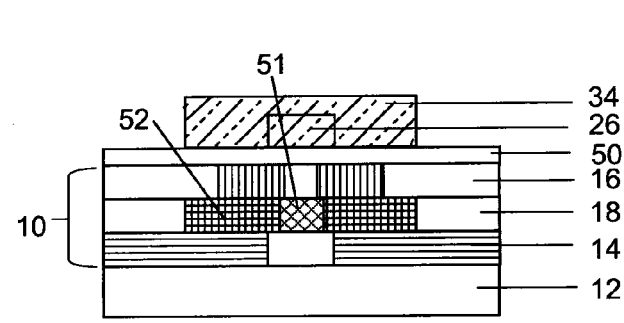

Referring now to FIGS. 10E and 10F, there is illustrated the structure of FIG. 10C after the exposed portions of transparent functional material (28) are removed in an etch step, forming a pattern of transparent functional material (34) registered to the blue variable density color absorber pattern (18) of multicolor mask (10). FIGS. 10G and 10H show the structure of FIG. 10E after the pattern of blue developed material (32) is removed using, for example, an oxygen plasma treatment.

Figure 11A:
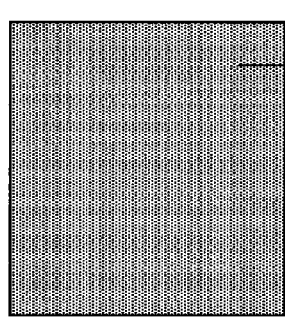
Figure 11B:
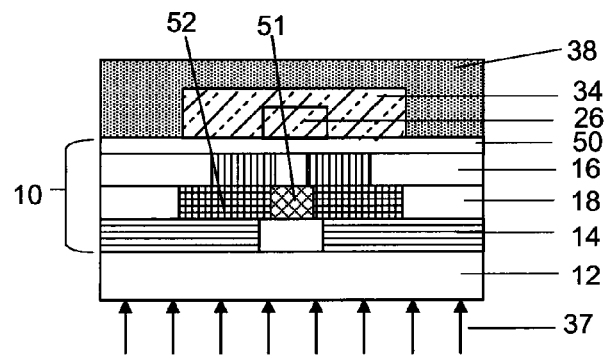
Figure 11C:
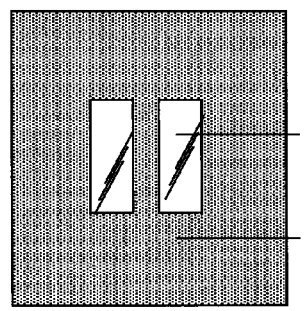
Figure 11D:
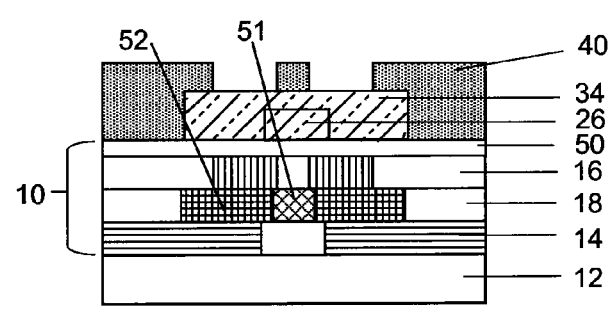

FIGS. 11A-11H illustrate coating and patterning steps for the third transparent layer of the electronic device using a green photopatternable coating using a liftoff process. Alternatively, the third layer could be patterned be a selective deposition process, a selective etch process, or a light curing process. FIGS. 11A and 11B show the multicolor mask (10) and the first and second patterned transparent layers, coated with a uniform layer of a negative-working green photopatternable material (38). This structure is exposed with a light source containing green light to form a pattern of photopatterned material (40) registered with green color absorber pattern (16) after development as shown in FIGS. 11C and 11D.

Figure 11E:
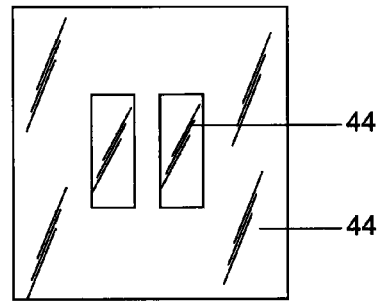
Figure 11F:
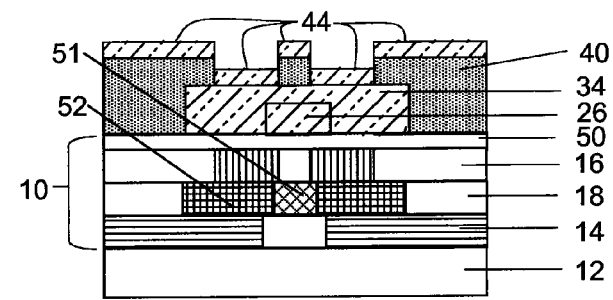
Figure 11G:
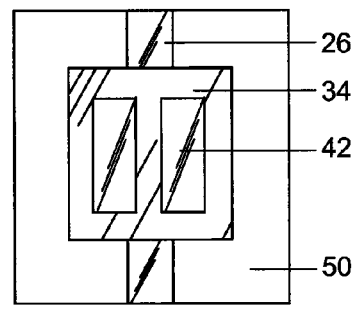
Figure 11H:
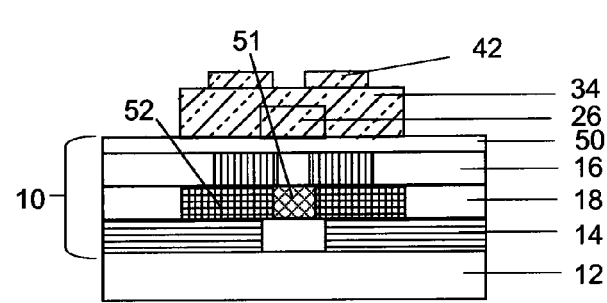

Referring now to FIGS. 11E and 11F, a uniform coating of transparent functional material (44) is applied over the pattern of photopatterned material (40). FIGS. 11G and 11H show the final step in a liftoff sequence when the photopatterned material (40) and portions of transparent functional material on top of the photopatterned material are removed. This is accomplished, for example, by treating the sample with a material that selectively attacks the remaining cured material under the functional material. This leaves patterned functional material 42 where there was originally no photopatterned material. By way of example, the transparent functional material (44) could be a layer of indium-tin oxide or silver nanoparticles. Because the photopatternable coating (40) drawn in this structure is sensitive only to green light, the light source may be a white light source, or a colored light source containing green light.

FIGS. 12A-12H illustrates coating and patterning steps for another layer of the electronic device using a blue photosensitive material and a selective deposition process. Alternatively, the second transparent layer could be patterned be a selective etch process, a liftoff process, or a light curing process. FIGS. 12A and 12B show the electronic device as formed up through FIG. 11G, coated with a uniform layer of blue photopatternable deposition inhibitor material (30). As shown in FIG. 12A, blue photopatternable deposition inhibitor material layer (30) is a binary negative resist. The structure is exposed with a light source containing blue light at an exposure level so that only the high density portion 52 of the variable density color mask 18 filters the light to the resist, and the resist is effectively exposed through the combination of the clear portions of color mask 18 and low density portion 51. The resulting structure is shown in FIGS. 12C and 12D. FIGS. 12E and 12F illustrate the resulting structure after the subsequent step of depositing a transparent functional material (48), such that the material is selectively deposited on regions are not covered by the pattern of cured material (46).

Referring now to FIGS. 12G and 12H, a subsequent step is illustrated where the pattern of blue photopatternable deposition inhibitor material (30) is removed. The pattern of functional material (48) is registered with the high density portion 52 of the variable density color mask 18. By way of example, the transparent functional material (28) could be a dielectric material such as aluminum oxide or alternatively a semiconducting layer such as zinc oxide. This material could be a dielectric or semiconducting layer precursor that is converted in an annealing step to form the electrically functional material. Multiple layers of transparent functional layers could potentially be coated at this step. By way of example, a transparent coating of a dielectric material could be first applied and a second transparent coating of semiconductor material could be subsequently applied.

Because the photopatternable coating 30 shown in FIGS. 12A and 12B is sensitive only to blue light, the light source may provide a blue light, a white light source, or a colored light source containing blue light.

FIGS. 9A-12H also illustrate another feature that can be used in the present process. Multicolor mask 10 (as shown) may optionally have a transparent coating 50 on the top surface. The transparent coating 50 may have insulating, smoothing, planarizing or other properties, which improve the performance of the end device that will be formed over the multicolor mask 10.

Additionally, a process for forming a TFT should be understood from the descriptions of FIGS. 9A to 12H. As shown in FIG. 12G a bottom gate TFT has a conductive gate 26, patterned dielectric 34, source/drain electrodes 42, and a semiconductor channel 48. It should be understood by one skilled in the art that other TFT configurations and electronic component can be formed using embodiments of the present invention that are variants on the processes described above.

FIGS. 12G and 12H serve to further illustrate a device made by an embodiment of the present process wherein the entire color mask 10 remains in the final structure. In an alternative embodiment, only a portion of color mask 10 remains in the final structure. A device made by one preferred embodiment of the present process has a transparent support, and a color mask on the support; wherein the color mask has an associated absorption spectral range and wherein within the absorption spectral range of the color mask has at least an effectively transparent portion and a partially absorptive portion, the partially absorptive portion including at least two portions having different optical densities within the absorption spectral range; and, further, at least one patterned functional layer on the same side of the support as the color mask and in register with the at least one portion of said two portions.

Figure 13A:
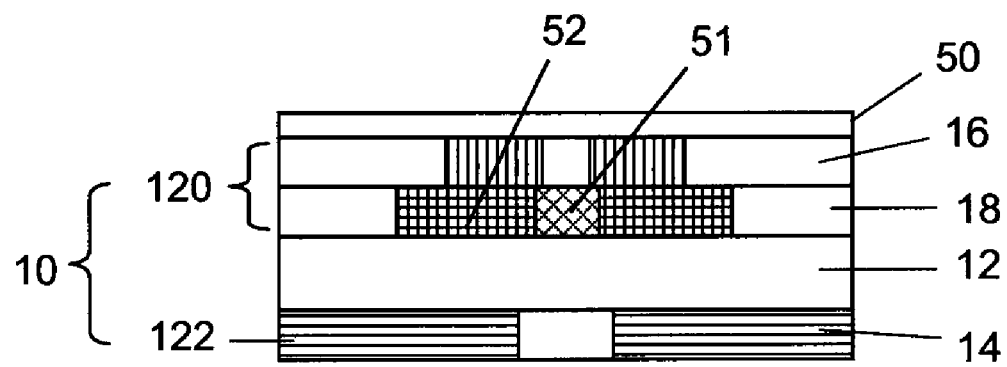
FIGS. 13 and 13A illustrate another embodiment of a multicolor mask of the present invention.
Figure 13B:
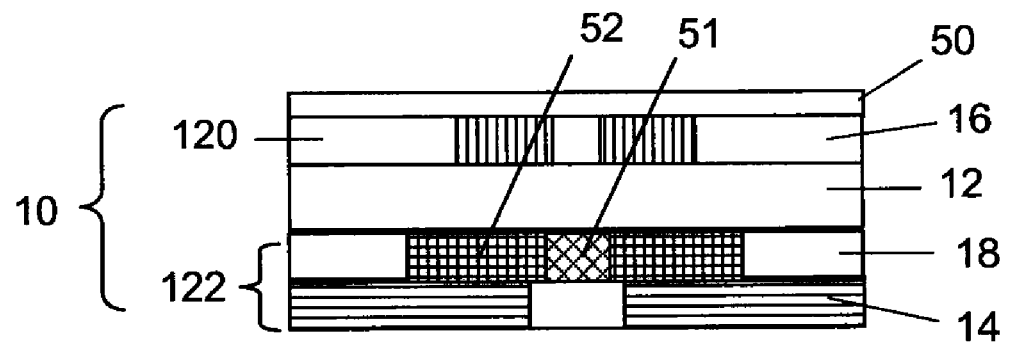

FIGS. 13A and 13B illustrate alternative arrangements of multicolor mask 10 according to the present invention. In these embodiments, multicolor mask 10 is made up of a first mask portion 120 formed on the first side of substrate and a second mask portion 122 formed on the backside of the substrate. This alternative arrangement has the advantage of allowing for the removal of a portion of the multicolor mask. The first mask portion 120 can remain in the final device, while the second mask portion 122 may be removed after completion of the final device. This may particularly useful in display devices that are viewed through the transparent substrate. The use of these alternative multicolor mask structures should be easily understood with respect to the previous Figures.

Figure 14:
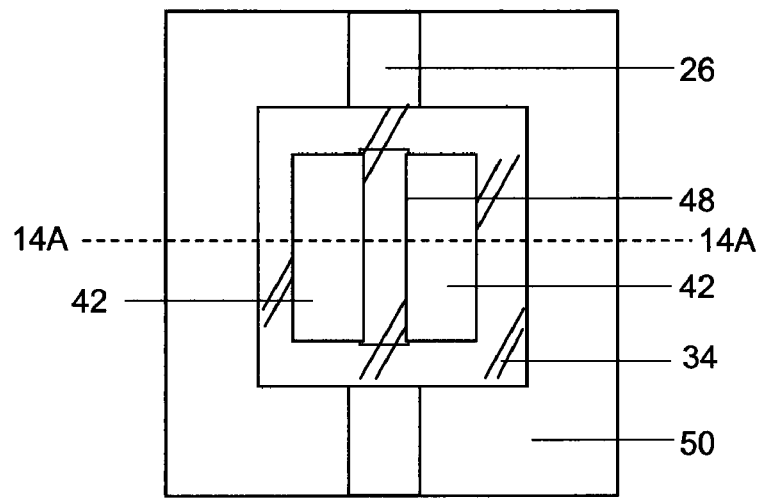
FIGS. 14, 14A, and 14B show another embodiment of a layer electronic device formed using a multicolor mask of the present invention.
Figure 14A:
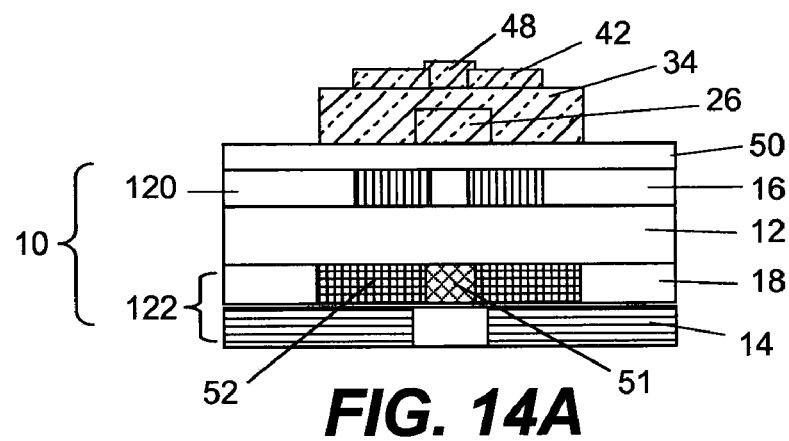
Figure 14B:
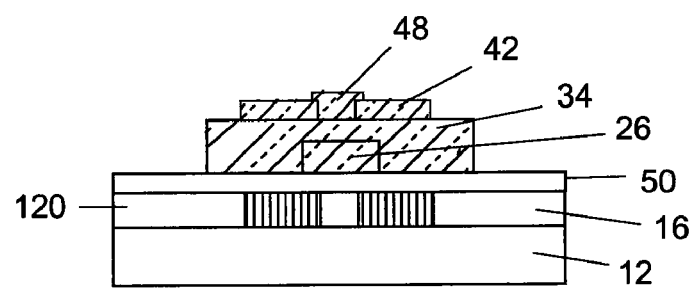

FIGS. 14 and 14A are analogous to FIGS. 12G and 12H and illustrate a completed device formed using a multicolor mask with a first mask portion 120 formed on the first side of substrate and a second mask portion 122 formed on the backside of the substrate. FIG. 14B illustrates the completed device after the additional step of removing the second mask portion 122. Items in the figures similar to items in previous figures are similarly numbered.

Figure 15A:
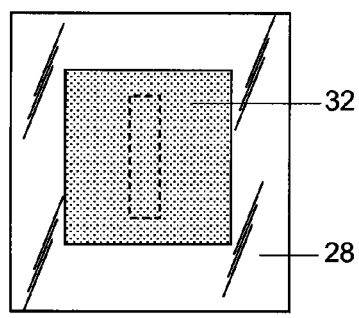
FIG. 15A-15H illustrate a sequence of exposure, processing, and etch steps to form two distinct patterned layers in an electronic device using transparent components and a multilevel multicolor mask.
Figure 15B:
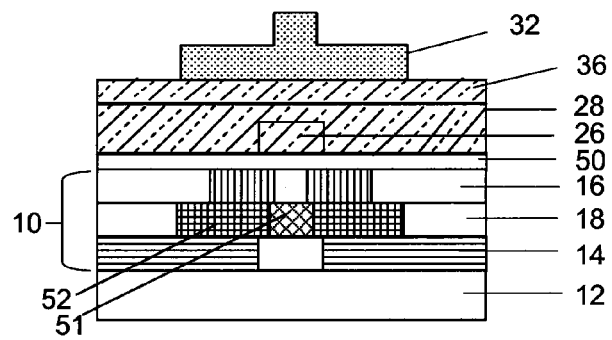

FIGS. 15A-15H illustrate another embodiment of a coating and patterning process for patterning the dielectric and semiconductor layers in a thin film transistor structure. In this alternative process, coatings of second transparent material (28), third transparent material (36), and a multilevel blue-photopatternable material are coated over the structure of FIG. 10C. The blue photopatternable material is patterned according to the method previously described for FIG. 8G. The resulting structure is shown in FIGS. 15A and 15B.

Figure 15C:
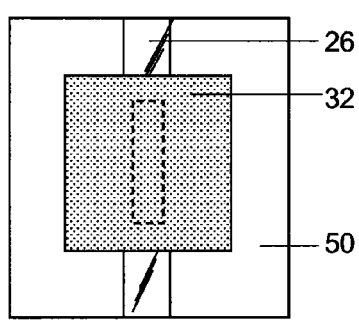
Figure 15D:
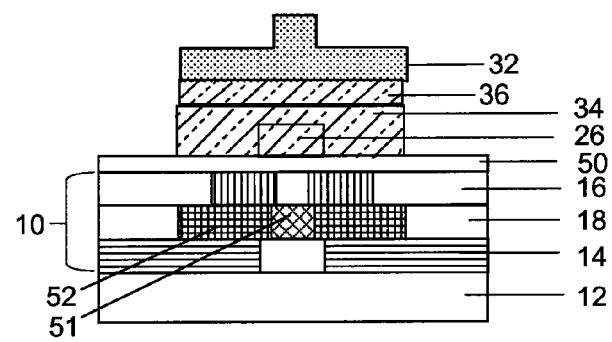
Figure 15E:
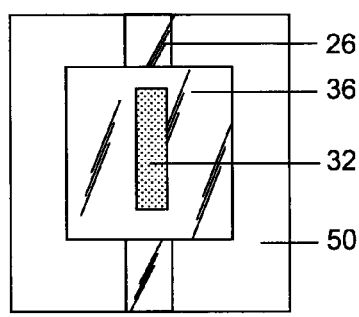
Figure 15F:
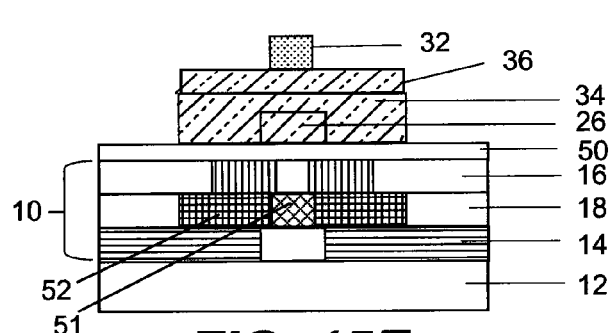
Figure 15G:
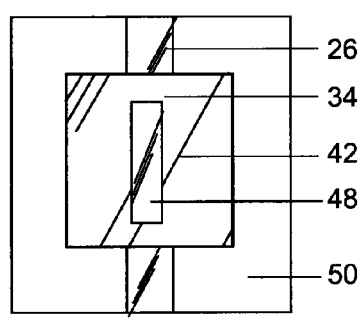
Figure 15H:
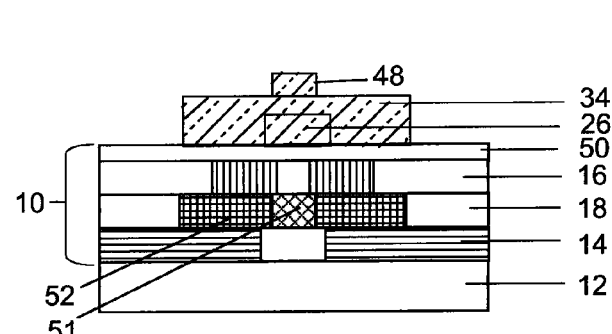

Referring now to FIGS. 15C and 15D, second and third transparent functional materials (28) and (30) are etched. FIGS. 15E and 15F illustrate the resulting structure after photoresist pattern (32) is partially removed using, by way of example, an oxygen plasma treatment. FIGS. 15G and 15H show the final step in this patterning sequence when third transparent material is removed in an etch step and the photoresist is removed. By way of example, the transparent functional material 34 could be a dielectric material and transparent functional material 36 could be a semiconductor layer in a thin film transistor. The transistor fabrication would then be completed using the cyan color absorber pattern 16 by etch, selective deposition, or liftoff process employing a red-sensitive photopatternable material.

It should be clear from the above description and previous figures that multicolor masks are advantaged in alignment and registration over traditional mask processes for constructing electronic and optical devices. In some cases, however it is necessary to carefully design multicolor mask such that selected portions are left clear, and without color. Alternatively, it may be advantageous in some instances to design a color mask such that a color remains in a given portion. The present embodiment relates to using a multicolor mask to form the electronic components of a display or lighting device. In a preferred embodiment, the display is viewed through the substrate.

In one embodiment, a multicolor mask can be used to form electronic components for an active matrix light emitting device. Light emitting devices include displays and other lighting devices. For example, a light emitting device has a pixel circuit including various electronic components (to be described later) and a light emitting layer. The light emitting layer can be used in monochrome, multi-color or full color displays. The term "multicolor" describes a display panel that is capable of emitting light of a different hue in different areas. In particular, it is employed to describe a display panel that is capable of displaying images of different colors. These areas are not necessarily contiguous.

The term "full color" is commonly employed to describe multicolor display panels that are capable of emitting in at least the red, green, and blue regions of the visible spectrum and displaying images in any combination of hues. The complete set of colors that can be generated by a given display is commonly called the color gamut of the display. The red, green, and blue colors constitute the three primary colors from which all other colors can be generated by appropriate mixing. However, the use of additional colors to extend the color gamut or within the color gamut of the device is possible. Additionally, there are practical applications for displays that emit outside of the visible range. Therefore, each light emitting element or device can be selected to have an emission wavelength that suits the application. These wavelengths can be ultraviolet, blue, cyan, green, yellow, magenta, red, or infrared in characteristic, or any combination thereof.

The term "pixel" is employed in its art-recognized usage to designate an area of a display panel that can be stimulated to emit light independently of other areas. The term "light emitting element," for the purposes of this discussion is synonymous with pixel. It is also noted that no physical size requirements should be inferred from either term: pixel or light emitting element. A device may consist of a single large light emitting element, millions of small light emitting elements, or any practical configuration in between. It is recognized that in full-color systems, several pixels of different colors will be used together to generate a broad range of colors, and a viewer can term such a group a single pixel. For the purposes of this disclosure, such a group will be considered several different light emitting elements or pixels.

A light transmissive substrate is desirable for viewing the light emission through the substrate; these devices are also commonly referred to as bottom emitting devices. Transparent glass or plastic are commonly employed in such cases. A bottom emitting light emitting device can be formed on a substrate that is transparent. In general, the first electrode (either anode or cathode) is deposited over the substrate and is transparent. The light emitting layer is then formed over the transparent first electrode, and a second electrode (either cathode or anode), which is reflective, is formed over the light emitting layer.

Bottom emitting devices can be active-matrix devices, and as such can be considered to be electronic displays. The term "electronic display" refers to a display wherein electronic entities control the intensity of the different areas of the display. In order for a device to have independently controllable, separate light emitting areas, at least one of the electrodes must be patterned. These patterned electrodes can be controlled by the thin film electronic components, or by a driver circuit(s) formed externally to the substrate. Alternatively, a substrate can be an active-matrix substrate with thin film transistors (TFTs), such as low-temperature polysilicon, amorphous-silicon, or zinc-oxide based TFTs. Electronic components on a substrate are not limited to transistors. A substrate can contain other active electronic components such as thin film electronic components that are composed of crystalline, polycrystalline or amorphous semiconductor materials. Such thin film electronic components include, but are not limited to: TFTs, capacitors, diodes, switches and resistors.

Figure 23:
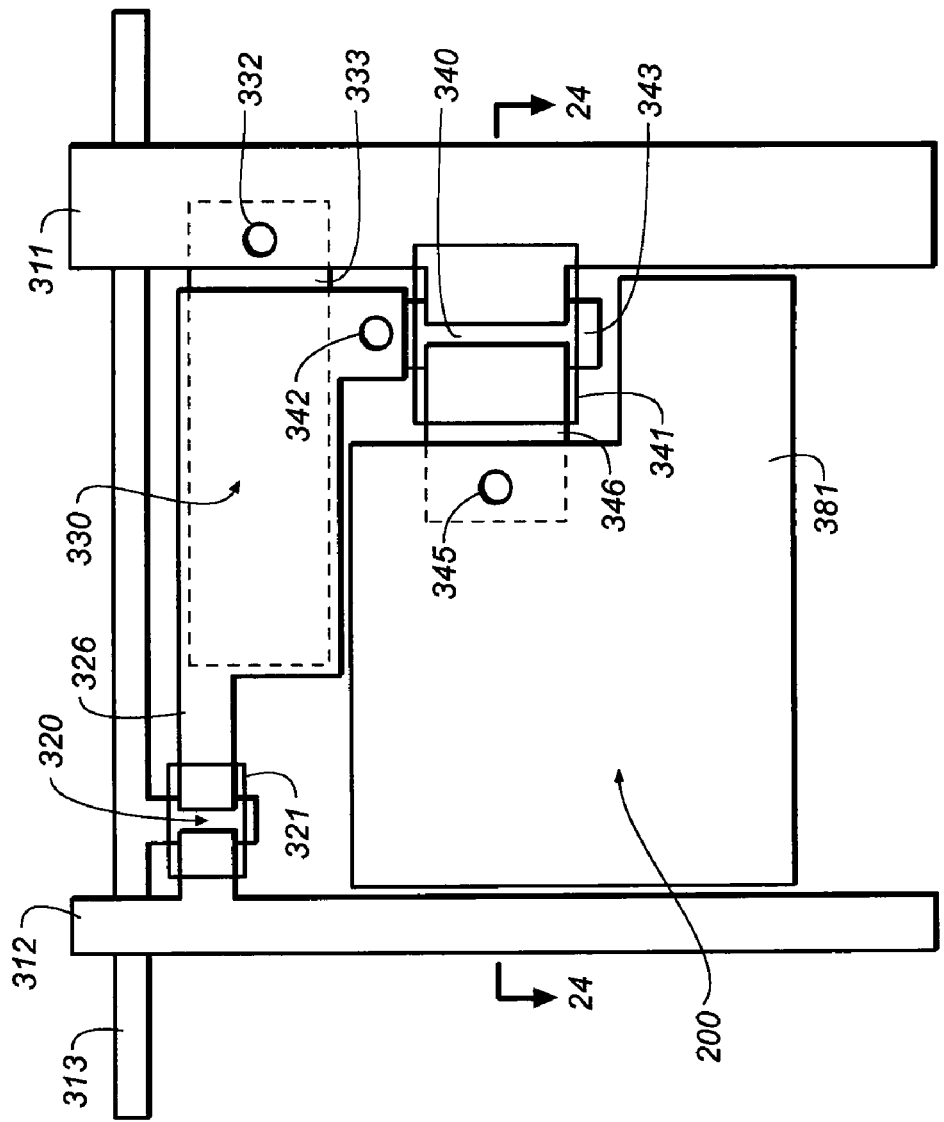
FIG. 23 shows a EL pixel layout.

For the purpose of understanding the components that can be formed using the multicolor mask, it is useful to first look at a representative light emitting device as shown in FIGS. 23 and 24. There are many potential pixel designs for a bottom emitting active matrix device. A representative physical layout view of one design for pixel 200 using amorphous silicon type TFTs is shown in FIG. 23. The construction of the various circuit components such as a select transistor 320, a storage capacitor 330, and a power transistor 340 can be seen in FIG. 23. The drive circuitry components are fabricated using conventional integrated circuit and thin film transistor fabrication technologies. A select line 313 is formed in with a conductor layer. A power line 311 and a data line 312 are formed in another conductor layer. An insulator is formed there between in order to electrically isolate these two conductor layers.

This configuration permits the data lines and power lines to cross without electrically connecting thereby forming the matrix of pixels. Electrical connections between features formed in the different conductor layers are achieved by forming contact holes, also referred to as vias, through the insulator layers disposed between the conductor layers. The term electrical connection is used in this disclosure to indicate a connection that enables the flow of electrical current. This can be a direct physical connection of two conductive elements. An electrical connection can have electrical resistance. An electrical connection can also be indirectly provided through other circuit components such as transistors or diodes.

A portion of the select line 313 extends to form the gate of select transistor 320. Over this first conductor layer is a first insulator layer (not shown), which is also referred to as the gate insulator layer. Select transistor 320 is formed from a first semiconductor region 321 using techniques well known in the art. The first terminal, which can be either the source or drain terminal, is formed from a portion of data line 312. A second terminal of select transistor 320, terminal 326, extends to form the second capacitor electrode of storage capacitor 330 and also to electrically connect to a power transistor gate electrode 343 of power transistor 340 through a contact hole 342. The transistors, such as select transistor 320, are shown as bottom gate type transistors, however, other types such as top gate and dual-gate transistors are also known in the art and can be employed. Similarly, power transistor 340 is formed in a second semiconductor region 341. The first semiconductor region 321 and second semiconductor region 341 are typically formed in the same semiconductor layer over the gate insulator layer.

The semiconductor layer is any semiconductor that satisfies the requirements of the process and final device, preferable and oxide semiconductor, most preferably a zinc oxide containing semiconductor. This semiconductor layer can be amorphous, or can also be polycrystalline or crystalline or known semiconductor materials such as organic semiconductors. The power transistor gate electrode 343 of power transistor 340 is formed in the first conductor layer. The first terminal of power transistor 340 is formed from a portion of power line 311, as shown. A second terminal 346 of power transistor 340 is formed in the second conductor layer. Storage capacitor 330 is formed between a first capacitor electrode 333 formed in the first conductor layer and the second capacitor electrode formed as a portion of terminal 326 as described above. The gate insulator layer (not shown) is deposited between the first capacitor electrode and the second capacitor electrode. The first capacitor electrode 333 is electrically connected to power line 311 through a contact hole 332. Alternate configurations are known in the art where the storage capacitor is not directly connected to the power line but is instead provided a separate capacitor line, which can be maintained at a different voltage level or the same voltage level relative to the power line.

A lower electrode 381 of the light emitting device is formed from a third conductor layer formed over the first and second conductor layers. A second insulator layer (not shown) is located between the lower electrode 381 and the second conductor layer. The lower electrode 381 of the light emitting device is connected to power transistor 340 through a contact hole 345 formed in this second insulator layer.

Lower electrode 381 serves to provide electrical contact to the electroluminescent media (not shown) of the light emitting diode. Over the perimeter edges lower electrode 381, an inter-pixel insulator layer (not shown) can also be formed to cover the edges of the electrodes and reduce shorting defects as is known in the art. Examples of such inter-pixel insulator layers can be found in U.S. Pat. No. 6,246,179 by Yamada.

Figure 24:
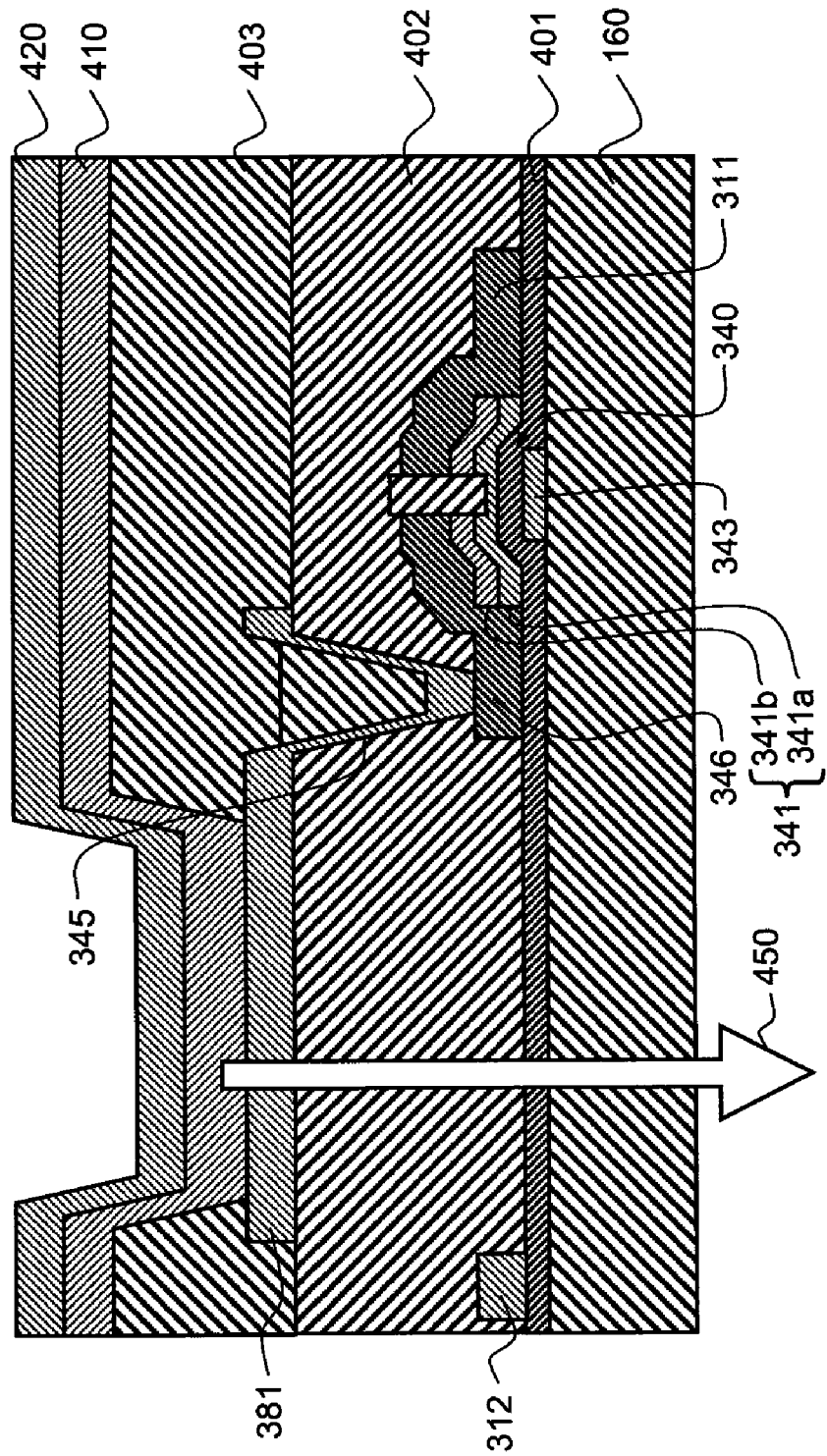
FIG. 24 shows a cross-section of the EL pixel of FIG. 23.

A cross-sectional illustration of the device of FIG. 23 along line 24-24 is shown in FIG. 24. In this cross-sectional view, the position of the insulating substrate 160 as well as the positions of a first insulator layer 401 (also referred to as the gate insulator layer) and a second insulator layer 402 can be seen. These insulator layers are shown as single layers but can actually include several sub-layers of different insulating materials. The construction of the power transistor 340 is shown. The second semiconductor region 341 is shown with an intrinsic sub-layer 341a and a doped sub-layer 341b.

The placement of an inter-pixel insulator 403 over the edges of lower electrode 381 is shown. Over lower electrode 381, the inorganic electroluminescent media 410 is formed. The electroluminescent media 410 includes all of the layers between the anode and cathode. In FIG. 24, the electroluminescent media 410 is shown as a single layer, but it is typically composed of a plurality of sub-layers such as a light emitting layer and one or more inorganic charge transport layers. Above the electroluminescent media 410, an upper electrode 420 is formed. Upper electrode 420 is typically common in such active matrix arrangements and serves to provide an electrical connection to the second voltage level. The lower electrode 381 and upper electrode 420 serve as spaced apart electrodes that provide electrical current to the electroluminescent media 410 disposed between the electrodes. When electrically stimulated, the electroluminescent media 410 above the lower electrode 381 in the area defined by the opening of the inter-pixel insulator 403 will emit light 450. Light 450 is shown as exiting the bottom of the device (through the substrate 160).

Since FIG. 24 shows a bottom-emitting configuration, the lower electrode 381 should be at least partially transparent. As such, lower electrode 381 is commonly constructed of materials such as indium tin oxide (ITO), indium zinc oxide (IZO), or thin (less than 25 nm) layers of metal such as aluminum or silver, or combinations, thereof. The upper electrode is typically reflective in such a configuration, being constructed at least in part of a reflective metals such as aluminum, aluminum alloys, silver or silver alloys. The upper electrode can be a thin metal or transparent material to allow for light emission from the top of the light emitting material. Although not shown, it should be understood by one skilled in the art that additional pixel layout arrangements are applicable to the current invention. Multicolor masks of the current invention can also be used to for pixel circuits for light emitting devices where each of the functional layers is vertically aligned (either positively or negatively) to a color pattern in the multicolor mask.

Figure 16D:
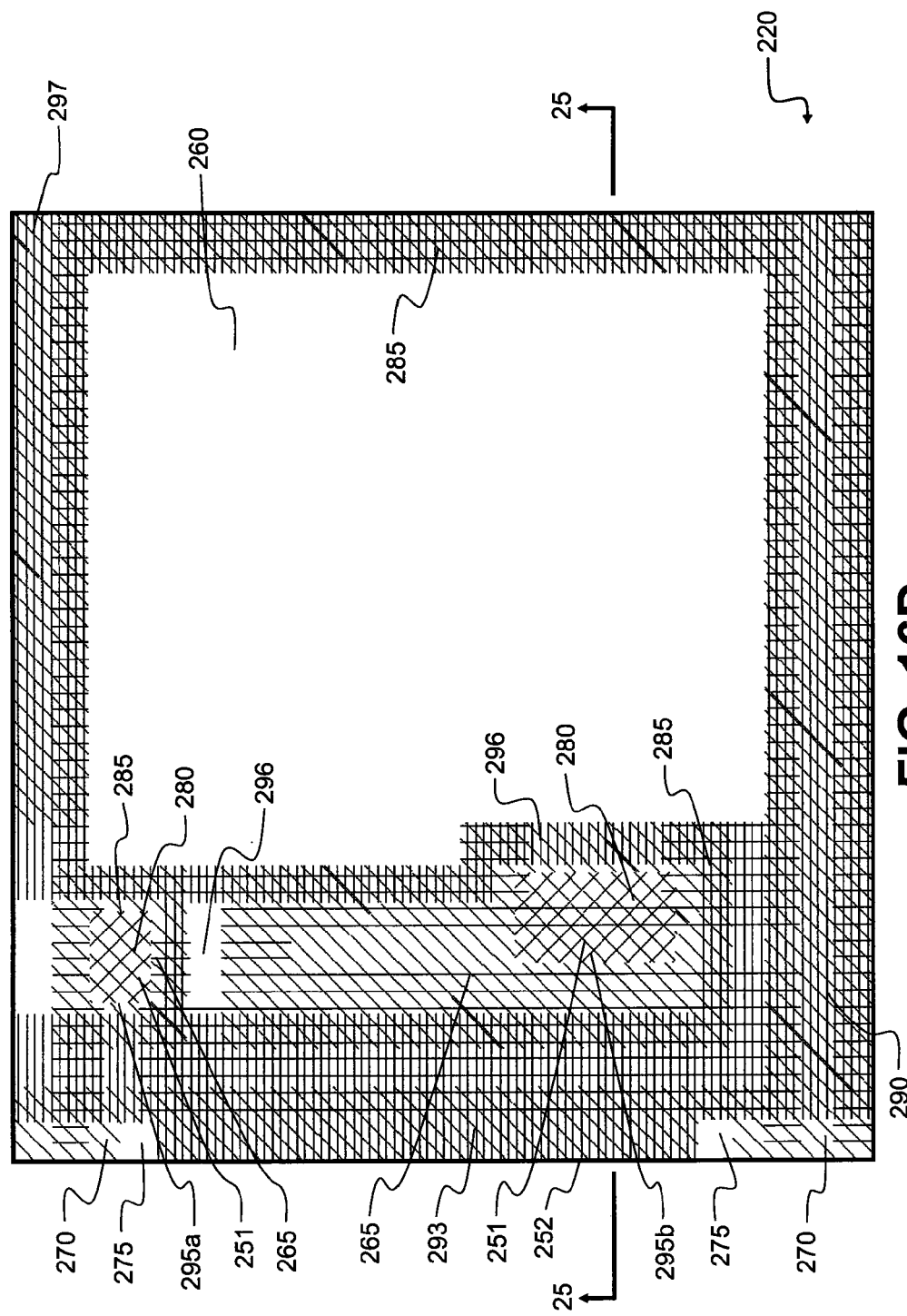

FIGS. 16A-16D illustrate the color patterns in a multicolor mask useful for forming an active matrix display pixel. As illustrated, FIGS. 16A-16D show a design for a bottom emitting electroluminescent device functionally similar to the device described above. It should be recognized that other pixel designs and other display devices may be fabricated in accordance with this invention. FIG. 16D is the full multicolor mask used to form the electronics for a single pixel of such a bottom emitter device. Although shown schematically, it should be understood that where the different color patterns overlap, the multicolor mask will appear as the "sum" of those color patterns. For example, where the yellow (blue absorbing) and magenta (green absorbing) color patterns overlap, the multicolor mask will appear red in color. FIG. 16D is easiest understood by the description of the individual color patterns illustrated in FIGS. 16A-16C and by the description of the functional materials and electronic components as shown FIG. 25.

FIG. 16A shows a red color pattern 214 used for forming the first conductor layer. As shown, the first conductor layer is transparent and forms the gate 265 of both a drive and a select TFT, as well as a first portion of the pixel electrode 260 (anode or cathode). Additionally, the red color pattern shown in FIG. 16A has the information for forming the electrical interconnects 270 for a V-data line. Red color mask 214 is designed to be used in a negative patterning process, such that the functional material is formed as the negative pattern of the red color mask. A representative negative process can be understood from the previous description of FIGS. 9A-9H.

In this embodiment, a uniform coating of a transparent conductor such as ITO is deposited, followed by a uniform coating of a red negative working photopatternable layer. The photopatternable layer is exposed through the color mask and then developed. The unwanted ITO is removed via an etch step, followed by a removal of any remaining photopatternable material.

FIG. 16C shows a multilevel blue color pattern (colorscale mask) used for forming the patterned dielectric 285 and semiconductor 280 layers. In forming the electronic components shown in FIG. 25, the dielectric layer 285 is formed using a positive patterning process, such that the functional material is formed as the positive pattern of both density portions of the multilevel pattern. A representative positive process can be understood from the previous description of FIGS. 10A-10H. In this embodiment, a uniform coating of a transparent dielectric material, such as Al$_2$O$_3$, is deposited followed by a uniform coating of a blue positive working photopatternable layer. The photopatternable layer is exposed through the multilevel color mask 218 with an exposure level sufficient to expose the positive resist only in the clear areas of the multilevel color pattern 218. After developing the exposed photopattern, the unwanted Al$_2$O$_3$ can be removed via an etch step, followed by the removal of any remaining photopatternable material.

In one current embodiment, after the formation of the pattered dielectric 285 the second conductor layer is deposited using the green color pattern 216 shown in FIG. 16B. The second conductor layer is also transparent and forms the source 295a, 295b and drain 296 terminals for both TFTs as well as the bus structures power line 290, select line 297 and data line 293. The second conductor layer also completes the capacitor in this pixel circuit; the capacitor is defined by the overlap of the gate electrode 265 and the source-capacitor 295b of the drive transistor. Additionally, the second conductor layer adds an additional thickness of conductor over pixel electrode 260. The green color mask 216 can be used in a negative working process that can be understood with reference to FIGS. 9A-9H.

In this embodiment, a uniform coating of a transparent conductor such as ITO is deposited, followed by a uniform coating of a green negative working photopatternable layer. The photopatternable layer is exposed through the color mask and then developed. The unwanted ITO can be removed via an etch step, followed by a removal of any remaining photopatternable material.

Following the formation of the second conductor layer, the semiconductor layer can be formed by a selective area deposition process using the blue multilevel mask 218 shown in FIG. 16C. The semiconductor pattern 280 is a positive pattern of the high density portion 251 of the colorscale mask 218. The formation of the semiconductor layer can be understood with reference to FIGS. 12A-12H. In this embodiment, a uniform coating a blue positive working photopatternable layer is deposited. The photopatternable layer is exposed through the multilevel color mask 218 with an exposure level sufficient to expose the positive resist in the clear areas and the low density portion 252 of the multilevel color pattern 218. After developing the exposed photopattern, a semiconductor material, such as a material comprising an oxide of zinc, with optional other metals, is deposited so that it only is deposited where the photopattern is not. In order to complete the structure, any remaining photopatternable material is removed after the semiconductor deposition.

Figure 25:
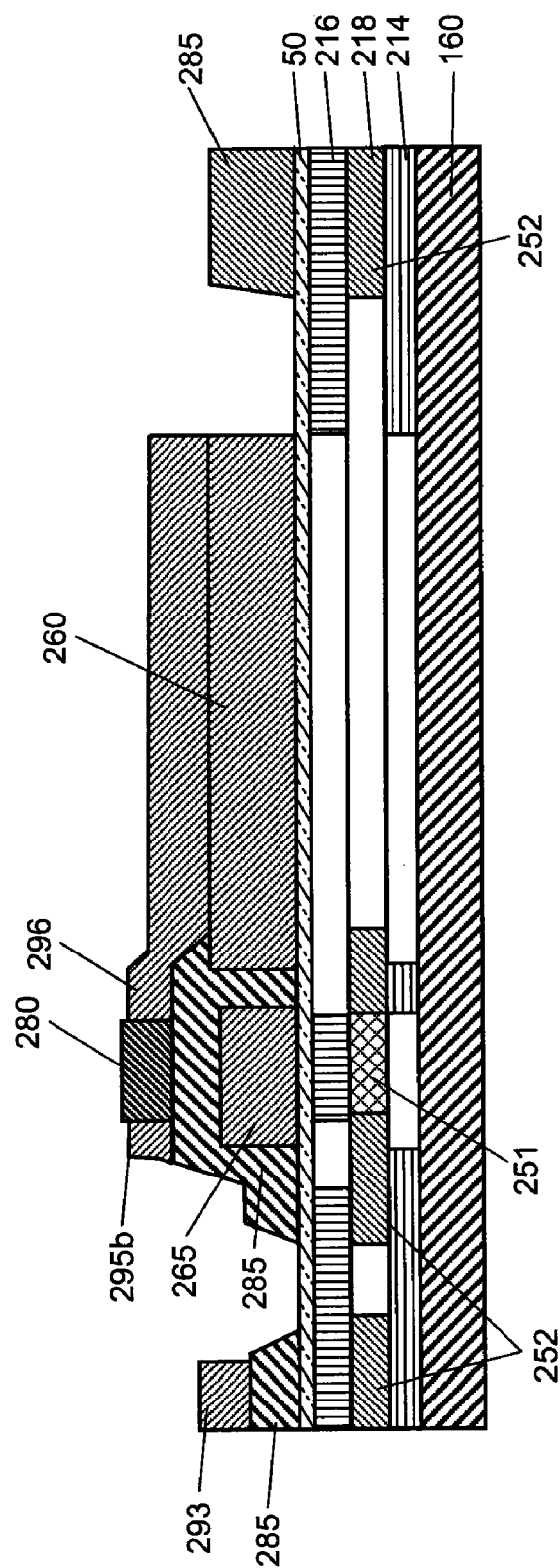
FIG. 25 is a cross-section of an EL pixel circuit formed by one embodiment of the present invention.

FIG. 16D is an illustration of the full multicolor mask assembled from the color patterns of FIG. 16A-16C. The full multicolor mask may be in a single layer, or multiple layers. The multicolor mask may be formed completely on either the frontside (active) as shown in FIG. 25, or on backside of the substrate. Alternatively, the multicolor mask may be formed such that a portion of the mask is on the frontside, and a portion of the mask is on the backside of the support. These embodiments should be understood with respect to the previous description.

FIG. 25 is a cross-section taken along line 25-25 of completed integrated electronic components formed over multicolor mask 220 of FIG. 16D. FIG. 25 also illustrates one optional feature associated with the multicolor mask, in particular, an additional optional transparent coating 50. At this point, shown in FIG. 25, the structure has most of the components of an active-matrix pixel analogous to that described with respect to FIG. 23.

In some embodiments, the electroluminescent device of FIG. 25 can have an optional overcoat or planarization layer deposited, followed by the deposition of a light emitting layer, followed by a second electrode (anode or cathode) in order to complete the light emitting device.

Figure 18:
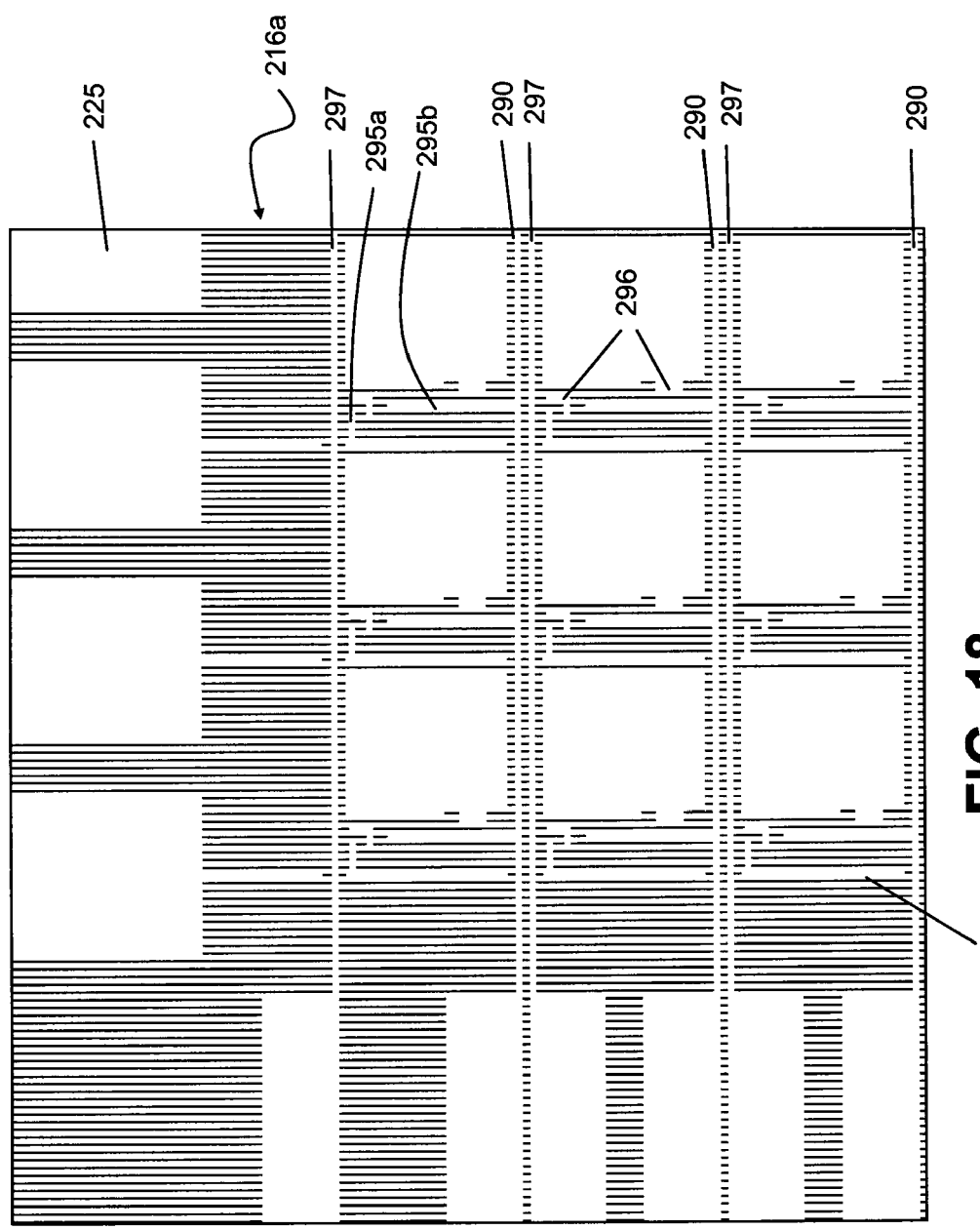
FIG. 18 shows a color pattern for a 3×3 pixel design for forming a source/drain and bus.
Figure 19:
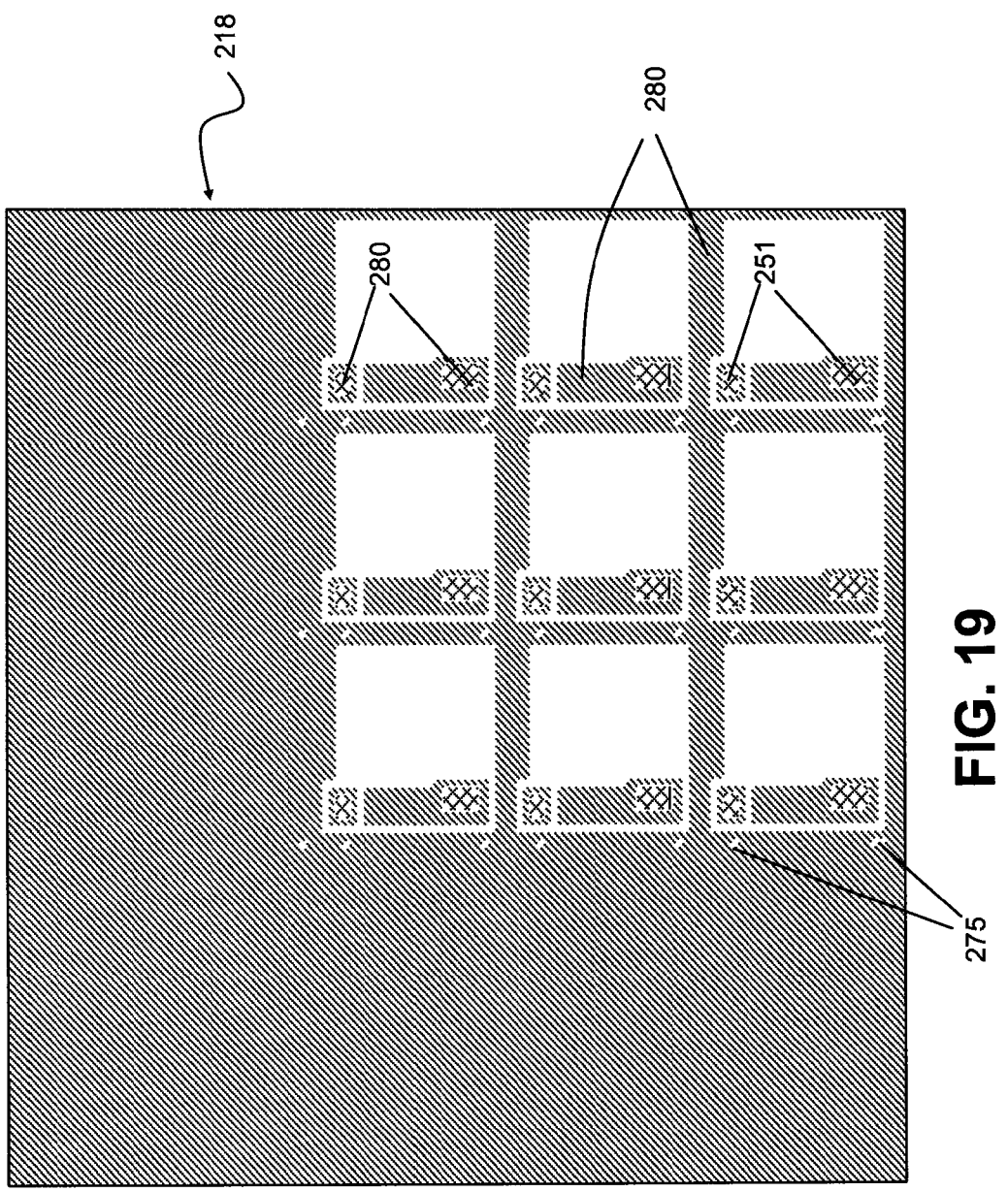
FIG. 19 shows a color pattern for a 3×3 pixel design for forming dielectric and semiconductor layers.
Figure 20:
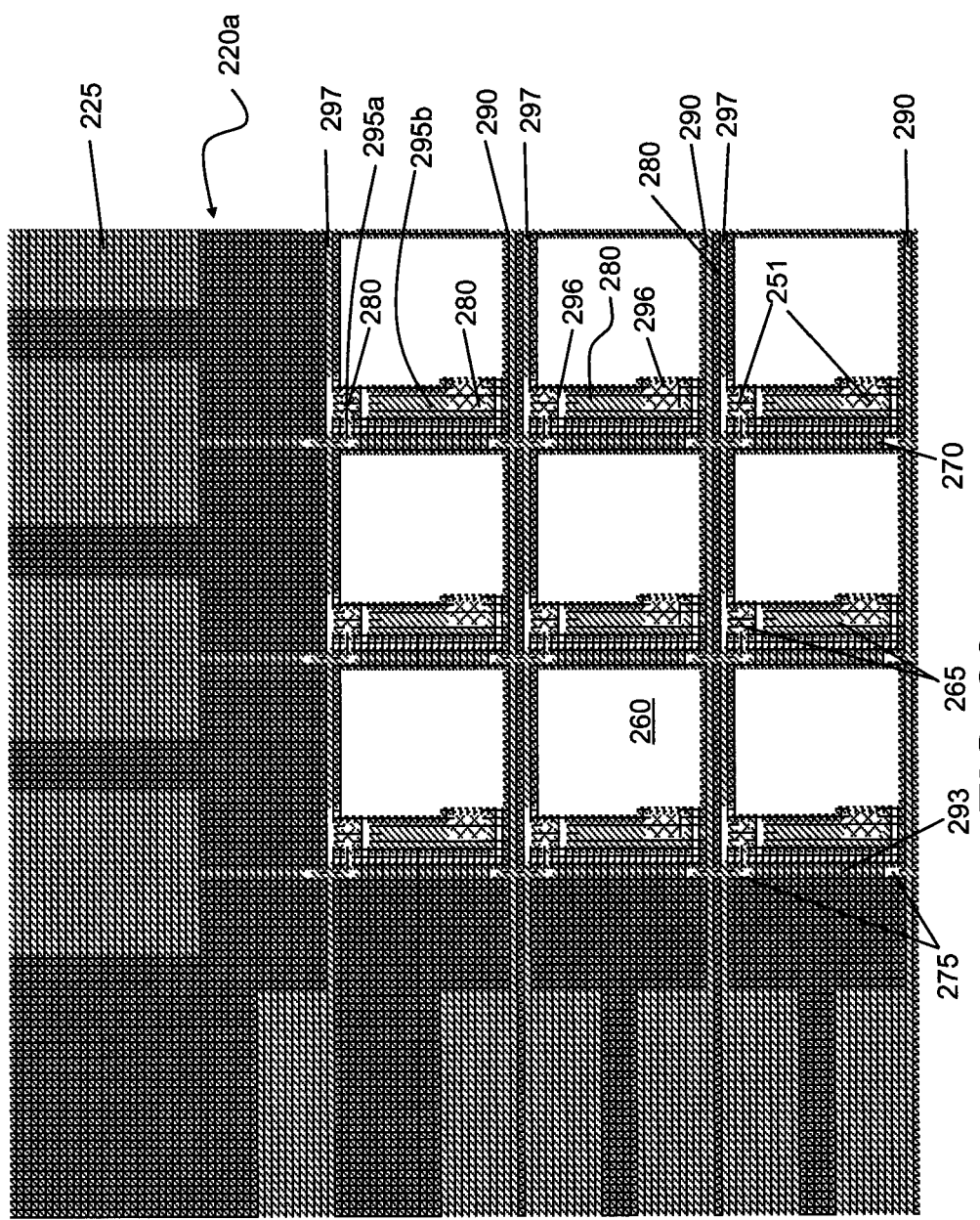
FIG. 20 shows a full multicolor mask for a 3×3 pixel design.

FIGS. 17, 18, 19 and 20 are analogous to FIGS. 16A, 16B, 16C and 16D respectively, and should be understood from the previous discussion. FIGS. 17-20 illustrate how multicolor masks of the current invention are useful for creating multiple pixel circuits. FIGS. 18 and 20 include additional contact pads 225 for making electrical connections into the nine pixel circuits shown in the same Figure. In a preferred embodiment, the multicolor mask would contain all of the patterning information for the electronic components for the backplane of a display, including all of the individual pixel circuits.

Figure 21:
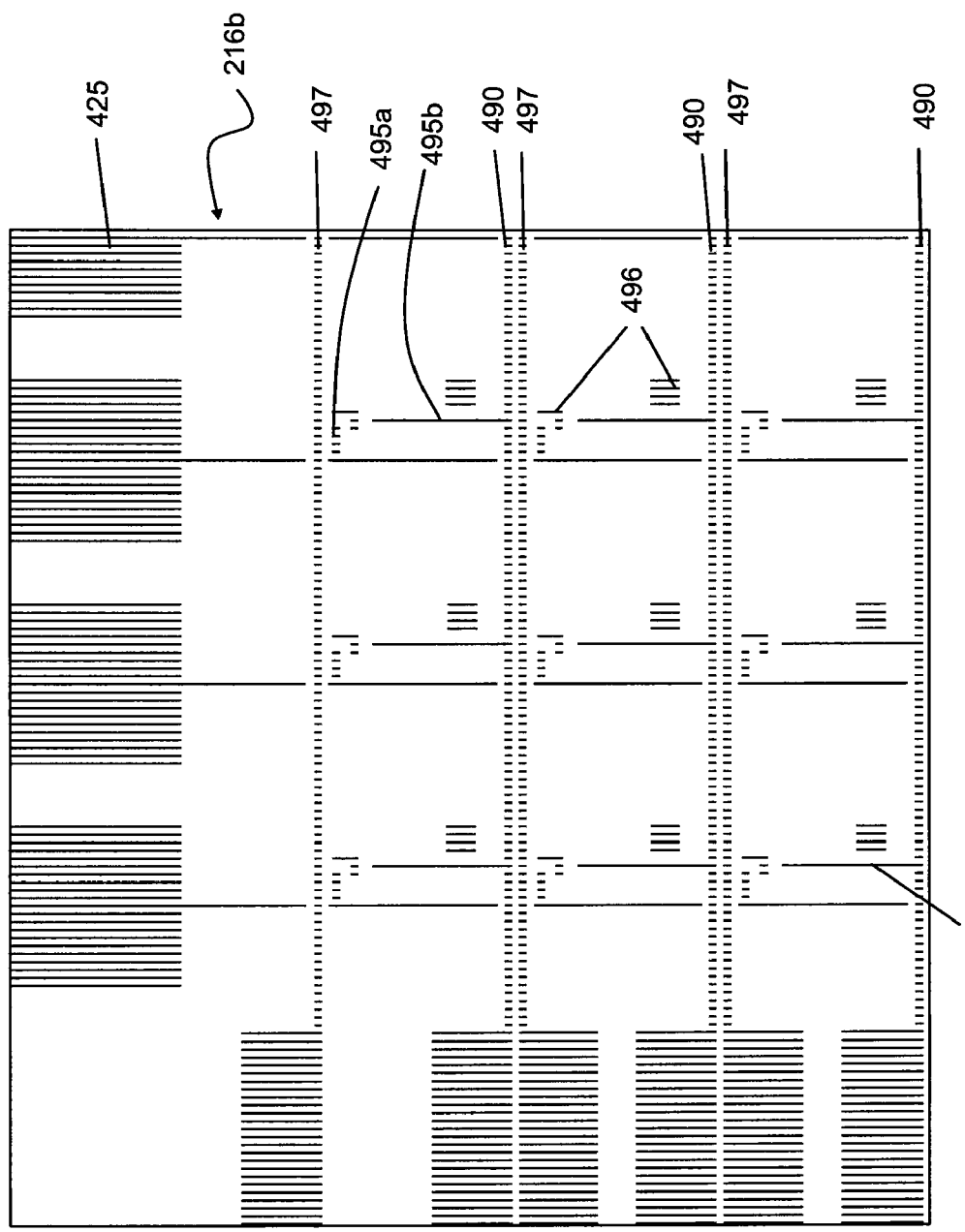
FIG. 21 shows another embodiment of a color pattern for a 3×3 pixel design for forming a source/drain, and bus.

FIG. 21 is an alternative embodiment of the green color mask used for forming the source and drain terminals for the TFTs as well as the bus structures. As shown in FIG. 21, the green mask 216b would be used in a positive patterning step to form the second patterned conductor layer. As used with the green pattern 216b of FIG. 21, the second patterned conductor may be an opaque metal layer, such as aluminum. The formation of the second conductor layer in this alternative embodiment can be understood with reference to FIGS. 11A-11H.

Figure 22:
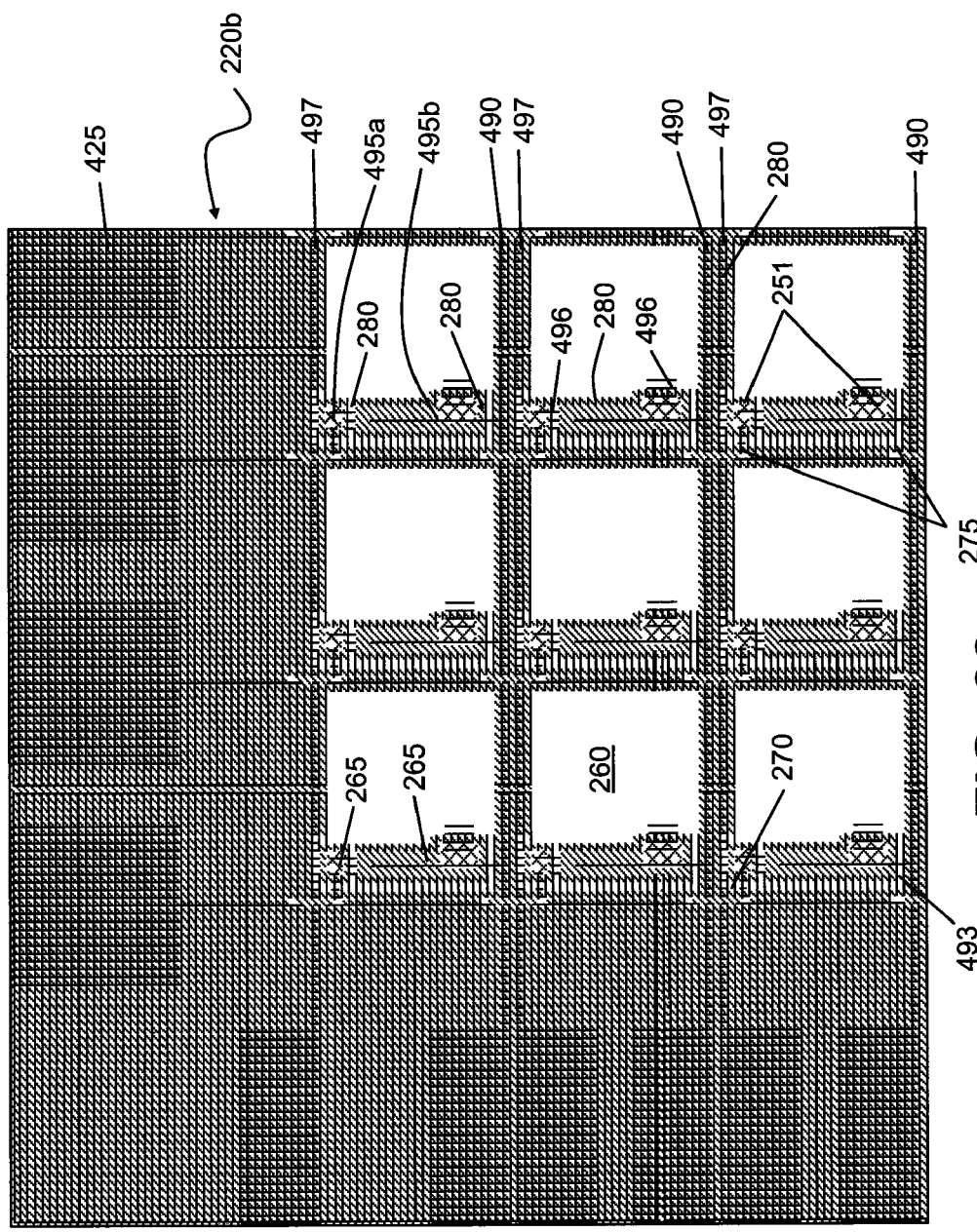
FIG. 22 shows another embodiment of a full multicolor mask for a 3×3 pixel design.

FIG. 22 is the full multicolor mask of the alternative embodiment, and is therefore the "sum" of previous FIGS. 17, 19 and 21. The use of the multicolor mask 220b of FIG. 22 should be easily understood form the previous discussion. In fact, the process flow for forming the completed electronic components of FIG. 22 can be understood from the construction of a single TFT as shown in FIGS. 9A-12H.

Although the Figures have been described with relation to specified color patterns, it should be clear that these were choices that were made for convenience and ease of description. Multicolor masks of the present invention can be made from any combination of color patterns.

It should be clear that present invention can be practiced with other active matrix electroluminescent device designs. It may also be employed in display devices. In one embodiment, the present invention is employed in a flat-panel OLED device composed of small molecule or polymeric OLEDs as disclosed in, but not limited to U.S. Pat. No. 4,769,292 by Tang et al., and U.S. Pat. No. 5,061,569 by VanSlyke et al. In another embodiment, the present invention is employed in a flat panel inorganic LED device containing quantum dots as disclosed in, but not limited to US Patent Publication No, 2007/0057263 by Kahen and pending U.S. patent application Ser. No. 11/683,479, by Kahen, which are both hereby incorporated by reference in their entirety. Many combinations and variations of organic, inorganic and hybrid light-emitting displays can be used to fabricate such a device, including both active matrix LED displays having either a top- or bottom-emitter architecture.

The present multicolor mask technology can also be used to form other electronic display devices, such as is an active-matrix liquid-crystal display (AMLCD). One such LCD device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD).

A transistor having sufficient current carrying capacity for switching the display element at such a high frequency can be formed using a multicolor mask for patterning, such that that the use of the transistor as a switching element in a liquid crystal display is possible.

A display element typically acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

Figure 26:
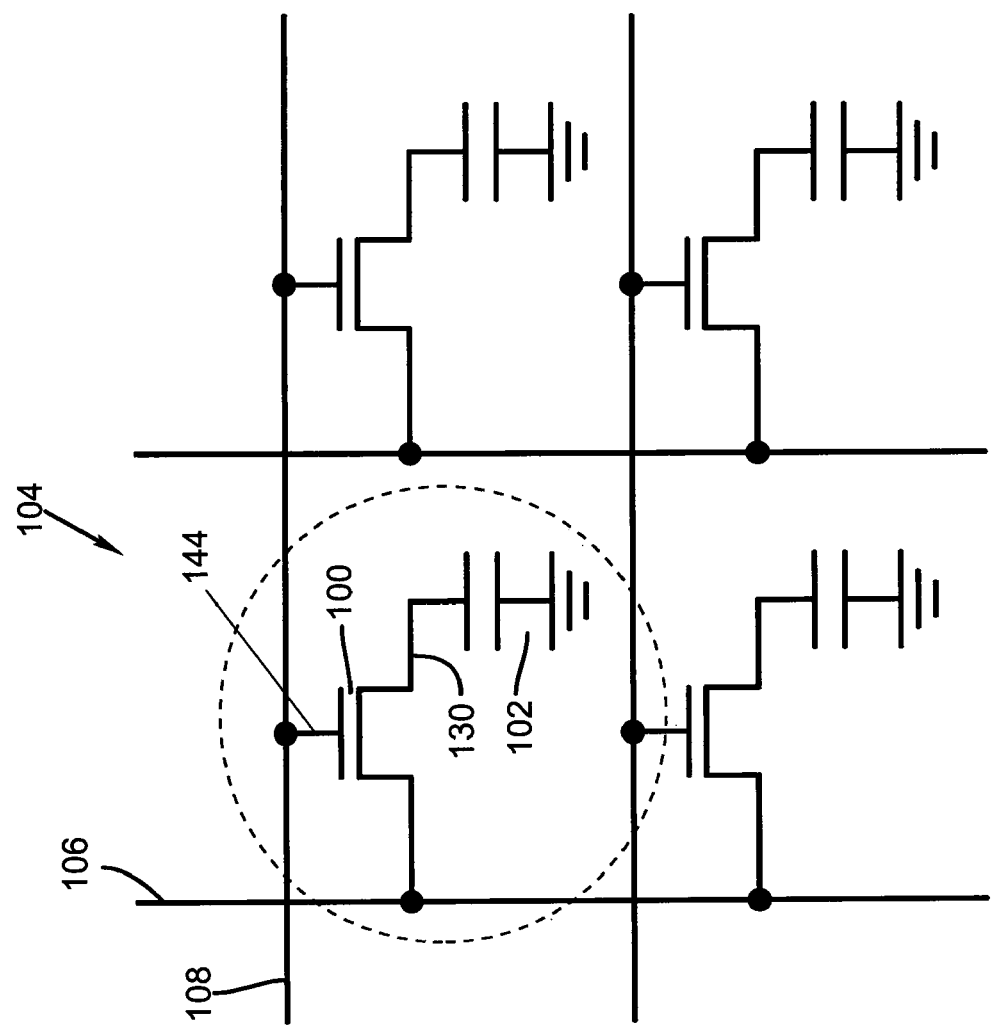
FIG. 26 illustrates a typical active matrix pixel design for a LCD comprising a select transistor and capacitor representing the capacitance due to display design.

One specific example of a basic AMLCD cell circuit is depicted in FIG. 26. The AMLCD cell circuit includes a transistor 100 as presently described, and an LCD pixel 102 electrically coupled thereto. The transistor 100 and the LCD pixel 102 together form a transistor/pixel cell 104. In the arrangement shown, the transistor 100 is electrically coupled to the LCD pixel 102 via the drain electrode 130. The gate electrode 144 of the transistor 100 is electrically coupled to a row or control line 108 (also referred to as a select or gate line) that receives on/off input for the transistor 100. The source electrode 120 of the transistor 100 is electrically coupled to a column or data line 106 that receives a signal for controlling the LCD pixel 102. Each LCD pixel 102 can also be viewed as a capacitor representing the capacitance according to display design.

Figure 27:
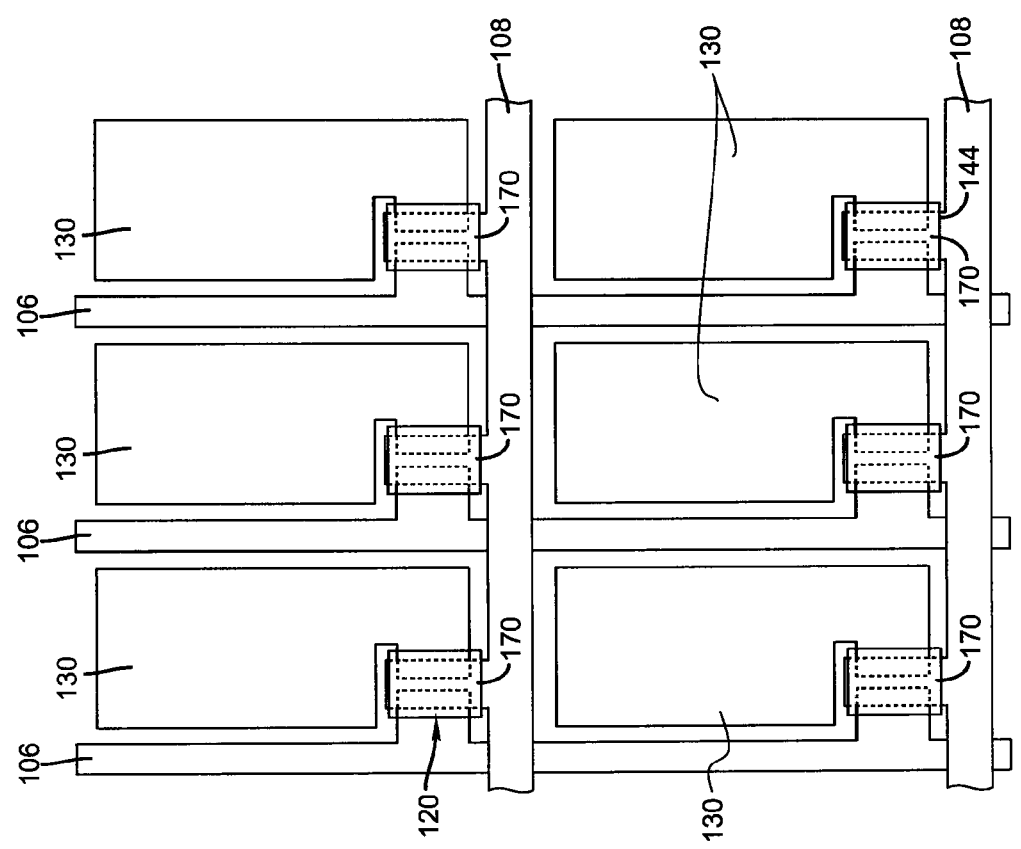
FIG. 27 illustrates a typical LCD pixel layout comprising data lines, control lines, thin film transistors, and pixel conductor pads.

FIG. 27 shows a typical pixel layout in which data lines 106 lead to individual source electrodes 124, control lines 108 lead to individual gate electrodes 144, semiconductors 170, and drain electrodes 130 each forming a pixel conductor pad. It should be understood that forming pixel circuits as shown in FIGS. 26 and 27 with a multicolor mask are readily within the scope of the current invention.

As noted above, a multicolor mask used in the present invention can contain in one structure most or all of the patterning information for the system. Such a multicolor mask can be generated by any method that produces an image containing the desired colors with sufficient precision and registration for the anticipated application.

The different color absorbers in the multicolored mask may be sequentially or simultaneously deposited and patterned by many methods. One method to produce the multicolor mask is to print the mask using inks containing dyes or pigments with the appropriate spectral qualities. Inks used in the printing could be of any common formulation, which would typically include the colorant material along with a vehicle or solvent, binders, and surfactants. Examples of such multicolor printing systems are inkjet printing, gravure printing, flexography, offset lithography, screen or stencil printing, and relief printing. Color thermographic printing may be used to produce the different color absorbing layers on the support. Thermochromic compounds, bleachable dyes, heat decomposable compounds, or chemical color formers may be used to form the different color absorbing layer patterns on the support. The different color absorbers may be applied to the support using a laser or thermal transfer process from a donor sheet. Alternately, the color absorbing patterns may be produced on the support by an ablative recording process.

Particularly useful color absorbers are those materials with maximum absorption in a selected portion of the visible band and maximum transmission in remaining portions. So-called block-type dyes and cutoff filter materials are ideal for use in the multicolor mask. The different color absorbers may be applied in any convenient order, or applied in a single layer dispersed in a binder. A receiving layer for color absorbing materials may optionally be coated on the back side of the support before the color absorbing materials are applied.

The different color absorbers in the multicolor mask may be formed by a photolithographic method using, for example, dyed photocurable coatings, such as pigmented or dyed photoresist.

It may be particularly convenient and cost effective to produce a reusable master image for subsequent duplication on the main substrate. In this embodiment, a master mask image is produced of very high accuracy and resolution. This may be accomplished with any of the above techniques. Preferably, this would be done with a photolithographic method that allows a very high quality master image to be produced. It may even be preferable to produce the master image upon a rigid transparent substrate in order to achieve highly accurate vertical alignment between color absorbing layers. The color information in the master color image can be reproduced on the main substrate using a color duplicating or color copying process. For negative-working duplication processes, the master color image would be provided as a negative copy of the multicolor mask.

In a traditional photolithographic process for large area electronic device fabrication, excellent alignment must be achieved over very large areas. In the above method of master duplication, the master may be considerably smaller and thus easier to fabricate, but then duplicated on the final substrate in a replicating pattern so as to cover a larger area. Although this method of stepping is used for individual mask layers in a conventional photolithographic process, in those processes excellent alignment is still required within the stepping operation. In the current inventive process, considerable tolerance can exist in the location of the individual duplications, since each will contain all the required information for a multilayer pattern. In display manufacturing, a mother glass will usually contain several individual displays or operational units. In a preferred embodiment, the master contains one full unit and can be reproduced several times on the mother substrate. Since the master contains the information for a full unit the tolerances on positioning between master exposures is not critical.

Color image capture processes employing light sensitive materials may be used to reproduce the master color image. The light sensitive layers can be composed of any set of materials capable of capturing a multicolor light pattern and subsequently being treated or developed in a way to produce a color pattern. Examples of such multicolor image capture materials are color negative photographic imaging layers, color reversal photographic imaging layers, color photothermographic imaging layers, Cycolor imaging layers, and diffusion transfer color photographic imaging layers such as color instant films, and color Pictrography film. A master color image may alternatively be reproduced on the main substrate using a color duplicating or copying process such as color electrophotography.

The multicolor mask can be produced on a separate roll of material and then laminated to the substrate. Preferably the lamination is done with the image side of the mask opposite the substrate and that the mask image is as close as possible to the functional layers to be patterned. For embodiments with a portion of the mask on the back side of the substrate, the lamination should be done such that the mask image is as close to the substrate as possible.

It may be particularly advantageous for optical considerations to coat the main support layer directly onto the color absorbing layers of the multicolor mask. In this embodiment, the color absorbing layers could be patterned on a carrier support roll and then the main support layer could be cast directly onto the color absorbing layers.

Alternately, the color absorbing layers can be patterned on a separate (donor) roll of material and then all of the color absorbing layers can be transferred in a single step from the donor roll onto the main substrate.

The multicolor mask layers may be separated from the electronically active layers by a barrier layer. Depending on the application, it may be preferable to place the color layers on the back of a thin support so they may be bleached or removed at the end of the fabrication process, and will not create planarity and contamination problems for the active device layers. As noted above, having a portion of the multicolor mask on the device side of the substrate, and a portion on the backside for potential removal is advantageous for some devices. Therefore, it important to understand the resolution limit for a remotely exposed photoresist layer. This type of exposure is referred to as a proximity exposure in traditional photolithography. In proximity mode, the mask does not contact the wafer, so there are resolution losses due to diffraction effects. A useful discussion of resolution in this so-called proximity printing mode can be found in "Photoreactive Polymers: The Science and Technology of Resists" by A. Reiser, Wiley-Interscience, John Wiley & Sons, 1989, pp. 234-246.

The diffraction effect in proximity printing limits the minimum feature gap on the mask as described by Equation (1):

$$W_{min} \approx \sqrt{k \lambda S} k \approx 1 \quad \text{Equation (1)}$$

where $W_{min}$ is the minimum feature gap on the mask, $\lambda$ is the exposure wavelength, and S is the separation between the mask and the wafer. Similarly, the minimum line/gap period is given by the relationship:

$$2b_{min} = 3\sqrt{\lambda\left(s + \frac{z}{2}\right)} \quad \text{Equation (2)}$$

where $b_{min}$ is the minimum line gap period, $\lambda$ is the exposure wavelength, s is the separation between the mask and the wafer, and z is the resist thickness.

These models indicate that even for a 100 μm distance typical for flexible supports, 6-8 μm features are resolvable, depending on the exposure wavelength. Again at the 100 μm distance, a line/gap periodicity in the range 9-12 μm should be resolvable, depending on the exposure wavelength. In the case of front-side masking, the barrier thickness is also highly tunable. Table A uses Equations (1) and (2) to predict the minimum feature size and periodicity as a function of the mask and resist separation. Examples using 365 nm or 650 nm exposing light are shown as representative of the two ends of the visible spectrum.

TABLE A

| | Exposing wavelength (nm) | Mask and resist layer separation | | |
|---|---|---|---|---|
| | | 1 um separation | 10 um separation | 100 um separation |
| $W_{min}$ minimum resolvable gap (μm) | 365 | 0.6 | 2 | 6 |
| | 650 | 0.8 | 2.5 | 8 |
| $b_{min}$ minimum resolvable periodicity (μm) | 365 | 1.1 | 3 | 9 |
| | 650 | 1.5 | 4 | 12 |

Based on these models, the multicolor mask can be designed to meet the resolution and transparency requirements of the final device.

Photopatternable layers used in the present process are well known in the art. Many polymers can be caused to vary their properties by exposure to light, and thus be useful as photopatternable layers. Many typical light sensitive polymers are only sensitive to UV and deep UV radiation. Preferably the photopatternable materials for this invention are rendered sensitive to visible light.

A variety of photopolymerization systems that are activated by visible radiation have been developed. A useful discussion of UV curable and visible light photopatternable materials can be found in "Photoreactive Polymers: The Science and Technology of Resists" by A. Reiser, Wiley-Interscience, John Wiley & Sons, 1989, pp. 102-129. U.S. Pat. No. 4,859,572 by Farid et al., incorporated here by reference, describes a photographic imaging system, which relies on using visible light to harden an organic component and produce an image pattern. This reference describes a variety of suitable visible light sensitive photoinitiators, monomers, and film formulation guidelines for use in the curable layers of this invention.

Sensitivity to visible light can be accomplished by the use of polymerizable compound along with a photopolymerization initiator. In a preferred embodiment of the invention, the photosensitive resist contains a polymerizable compound selected from among compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them.

As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxy-propoxy)phenyl]dimethylmethane, bis[p-(methacryloxyethoxy)-phenyl]dimethylmethane.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group can also be used in embodiments of the present process. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule.

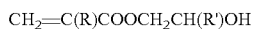

wherein R and R' each represents H or $CH_3$.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company Inc. (1999) can be used as well.

Depending upon the final design characteristics of the photosensitive material, a suitable addition polymerizable compound or combination of addition polymerizable compounds, having the desired structure and amounts can be used. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional or more functional groups are preferred.

It may be especially effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components (e.g., a binder polymer, an initiator, a functional material, etc.) in the photopolymerization composition. For example, sometimes compatibility can be improved by using a low purity compound or two or more compounds in combination. Further, it is also possible to select a compound having specific structure for the purpose of improving the adhesion property of a support, a functional material, and an overcoat layer.

Concerning the compounding ratio of the addition polymerizable compound in a photopolymerization composition, the higher the amount, the higher the sensitivity. But, too large an amount sometimes results in disadvantageous phase separation, problems in the manufacturing process due to the stickiness of the photopolymerization composition (e.g., manufacturing failure resulting from the transfer and adhesion of the photosensitive material components), and precipitation from a developing solution. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

Organic polymeric binders which can form a part of the film forming component of a photopatternable layer include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having average weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation such as polymerized forms of any of the various ethylenically unsaturated monomers, such as polyalkylenes—e.g. polyethylene and polypropylene; poly(vinyl alcohol); polystyrene; poly(acrylic and methacrylic acids and esters)—e.g. poly(methyl methacrylate) and poly(ethyl acrylate), as well as copolymer variants.

A polymerizable compound and polymeric binder can be employed together in widely varying proportions, including polymerizable compound ranging from 3 to 97 percent by weight of the film forming component and polymeric binder ranging from 97 to 3 percent by weight of the film forming component. A separate polymeric binder, although preferred, is not an essential part of the photopatternable film and is most commonly omitted when the polymerizable compound is itself a polymer.

Various photoinitiators can be selected for use in some embodiments of the present process. Preferred photoinitiators consist of an organic dye. The amount of organic dye to be used is preferably in the range of from 0.1 to 5% by weight based on the total weight of the photopolymerization composition, preferably from 0.2 to 3% by weight.

Organic dyes for use as photoinitiators may be suitably selected from conventionally known compounds having a maximum absorption wavelength falling within a range of 300 to 1000 nm. High sensitivity can be achieved by selecting a desired dye having an absorption spectrum that overlaps with the absorption spectrum of the corresponding color absorbing material of the multicolor mask described above and, optionally, adjusting the absorption spectrum to match the light source to be used. Also, it is possible to suitably select a light source such as blue, green, or red, or infrared LED (light emitting diode), solid state laser, OLED (organic light emitting diode) or laser, or the like for use in image-wise exposure to light.

Specific examples of photoinitiator organic dyes include 3-ketocoumarin compounds, thiopyrylium salts, naphthothiazolemerocyanine compounds, merocyanine compounds, and merocyanine dyes containing thiobarbituric acid, hemioxanole dyes, and cyanine, hemicyanine, and merocyanine dyes having indolenine nuclei. Other examples of organic dyes include the dyes described in Chemistry of Functional Dyes (1981, CMC Publishing Co., Ltd., pp. 393-416) and Coloring Materials (60 [4], 212-224, 1987). Specific examples of these organic dyes include cationic methine dyes, cationic carbonium dyes, cationic quinoimine dyes, cationic indoline dyes, and cationic styryl dyes.

Examples of the above-mentioned dyes include keto dyes such as coumarin dyes (including ketocoumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

A preferred photoinitiator organic dye is a cationic dye-borate anion complex formed from a cationic dye and an anionic organic borate. The cationic dye absorbs light having a maximum absorption wavelength falling within a range from 300 to 1000 nm and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos.: 5,112,752; 5,100,755; 5,057,393; 4,865,942; 4,842,980; 4,800,149; 4,772,530; and 4,772,541, which are incorporated herein by reference.

When a cationic dye-borate anion complex is used as an organic dye in a photopolymerization composition, the organoborate salt is not required. However, to increase photopolymerization sensitivity, it is preferred to use an organoborate salt in combination with the cationic dye-borate complex. The organic dye can be used singly or in combination.

Specific examples of the above-mentioned cationic dye-borate salts are given below. However, it should be noted that the present invention is not limited to these examples.

Dye 1

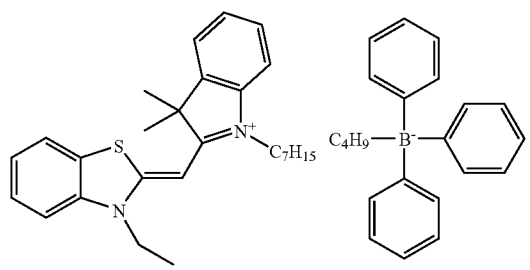

Dye-2

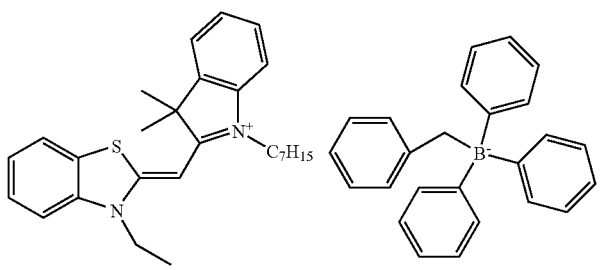

-continued
Dye-3 Dye-4
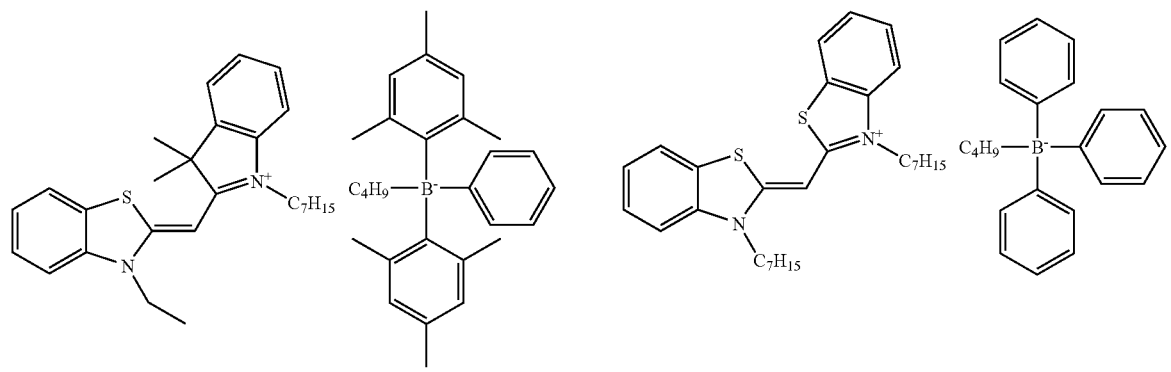
Dye-5 Dye-6
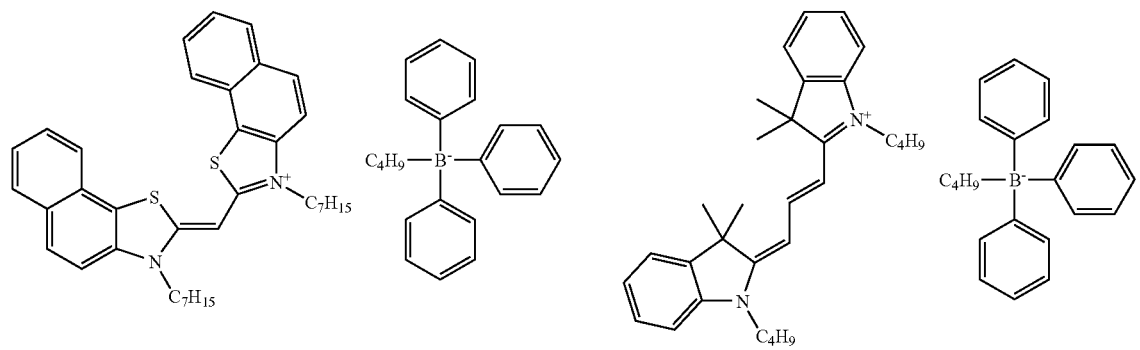
Dye-7 Dye-8
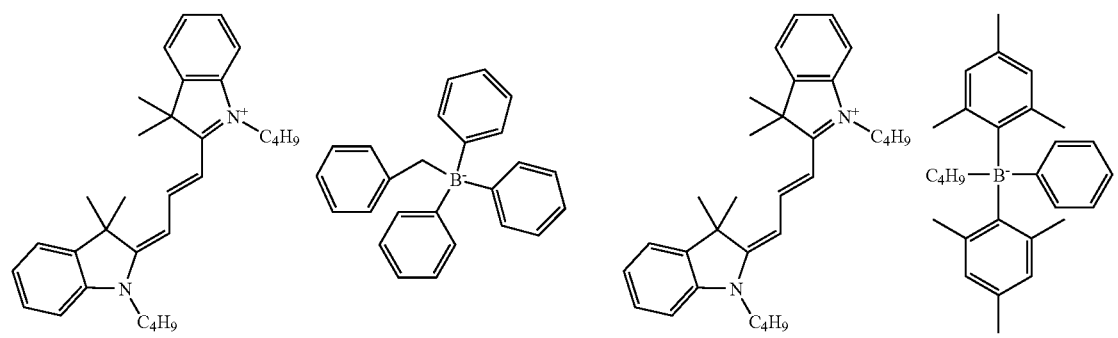
Dye-9 Dye-10
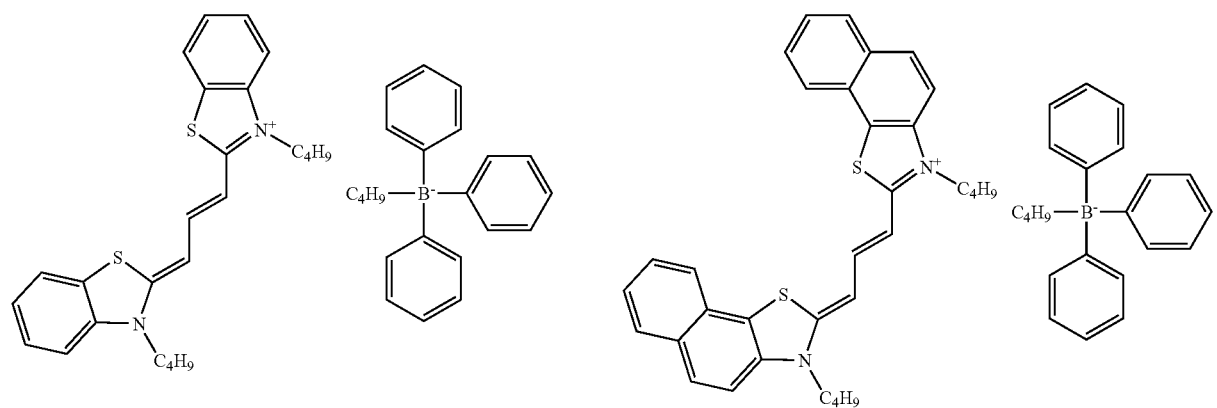

-continued
Dye-11
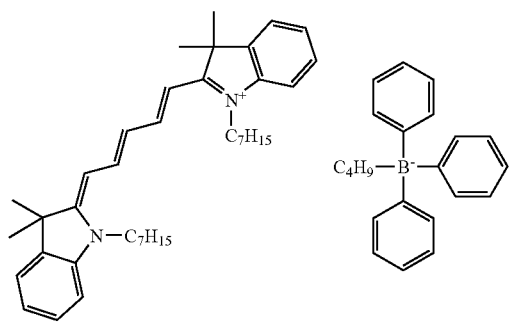
Dye-12
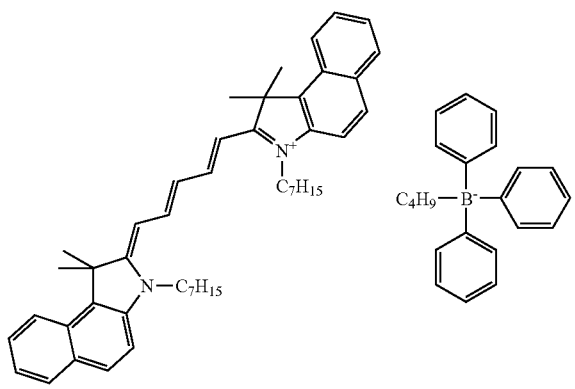
Dye-13
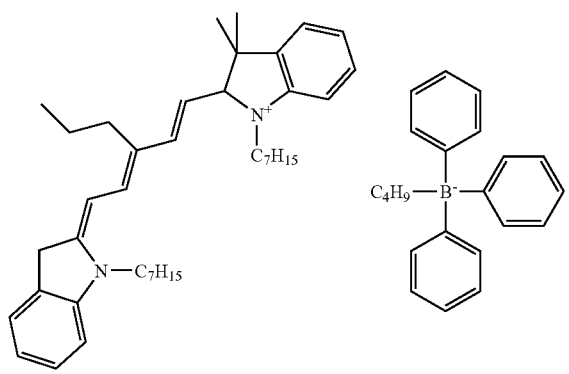
Dye-14
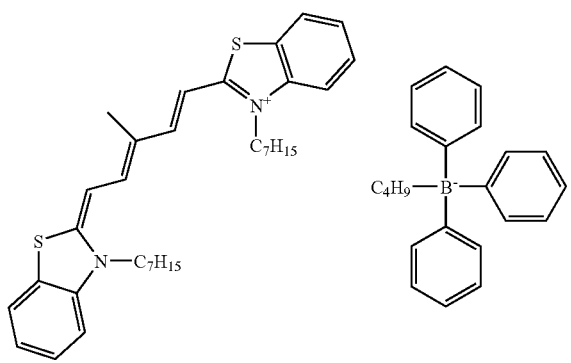
Dye-15
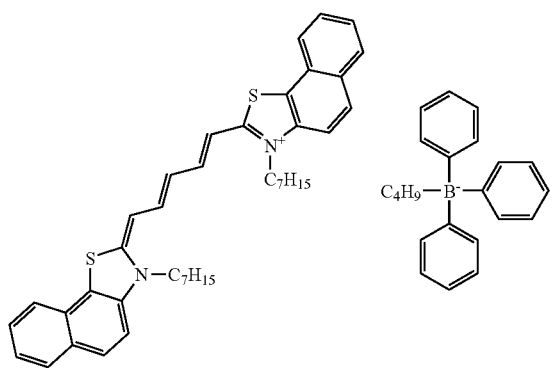
Dye-16
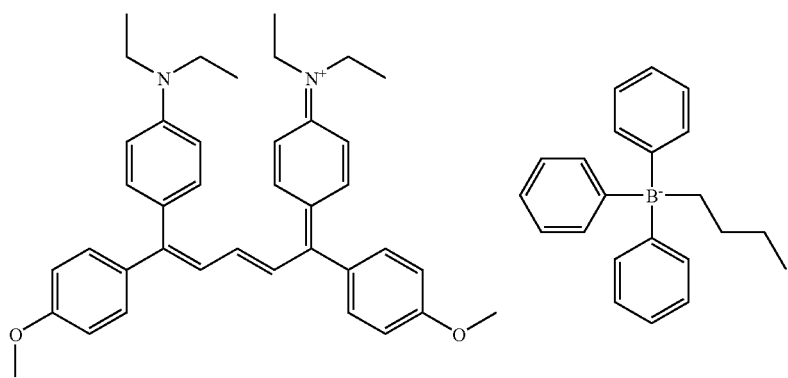

-continued

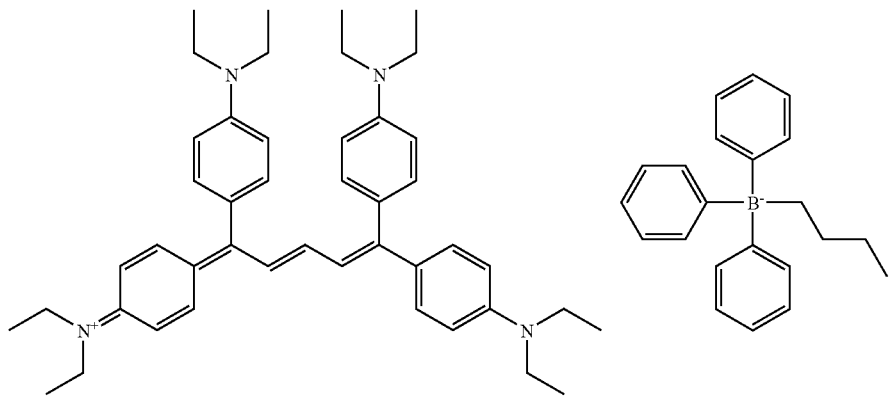

Dye-17

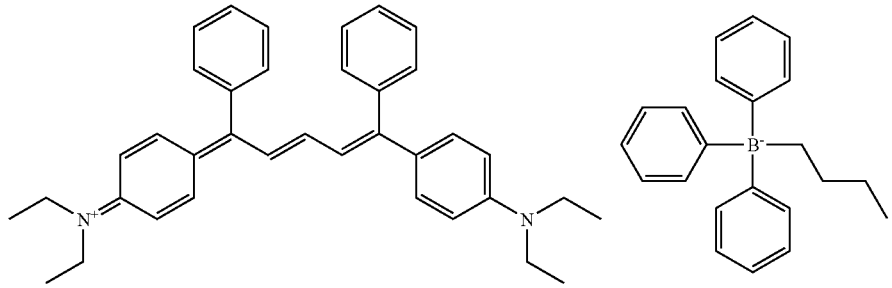

Dye-18

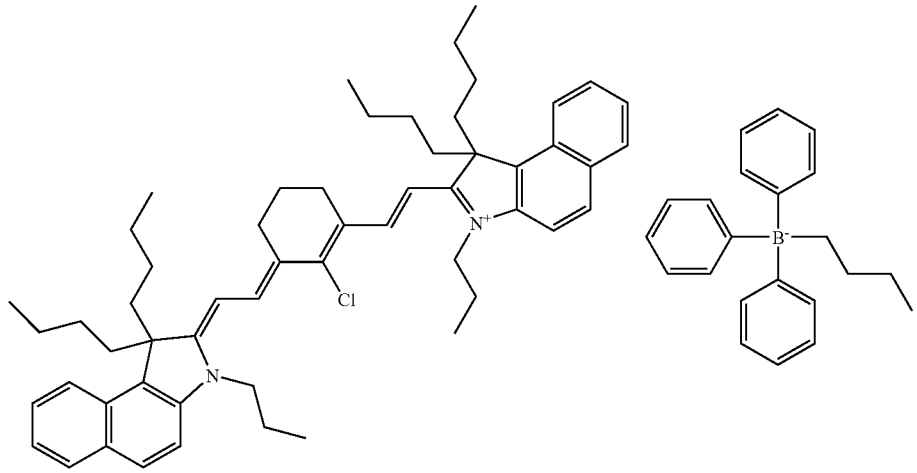

Dye-19

It may be preferable to use the photoinitiator in combination with an organic borate salt such as disclosed in U.S. Pat. Nos.: 5,112,752; 5,100,755; 5,057,393; 4,865,942; 4,842,980; 4,800,149; 4,772,530; and 4,772,541. If used, the amount of borate compound contained in the photopolymerization composition of the invention is preferably from 0% to 20% by weight based on the total amount of photopolymerization composition. The borate salt useful for the photosensitive composition of the present invention is represented by the following general formula (I).

[BR$_4$]$^-$Z$^+$ where Z represents a group capable of forming cation and is not light sensitive, and [BR4]$^-$ is a borate compound having four R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle. Z+ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned borate salts are given below. However, it should be noted that the present invention is not limited to these examples.

BS-1 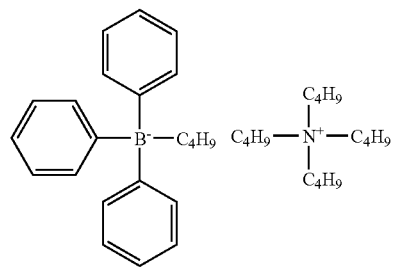
BS-2 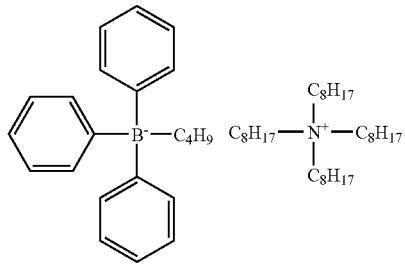
BS-3 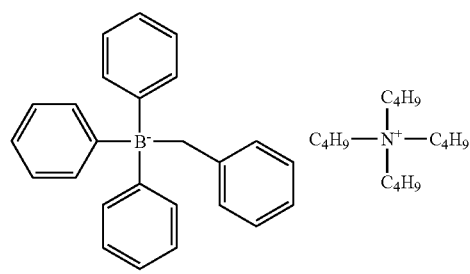
BS-4 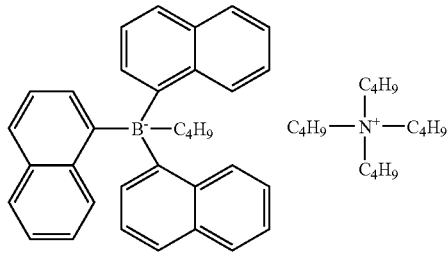
BS-5 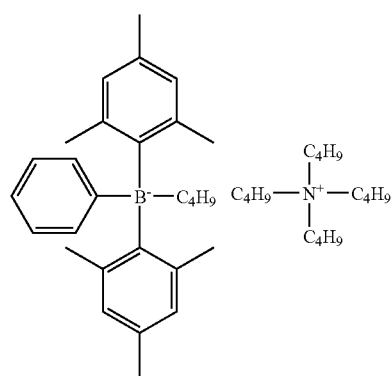
BS-6 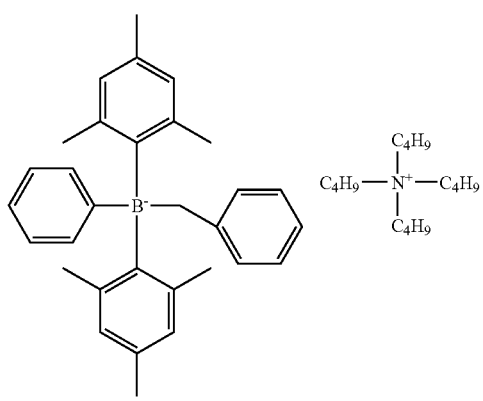
BS-7 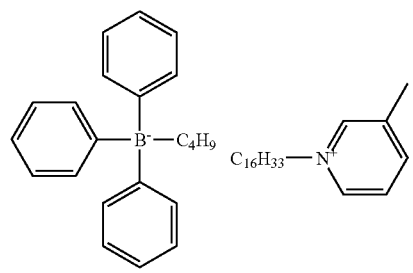
BS-8 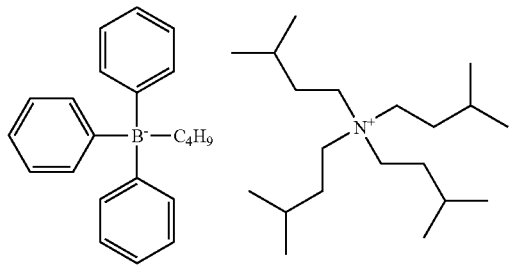
BS-9 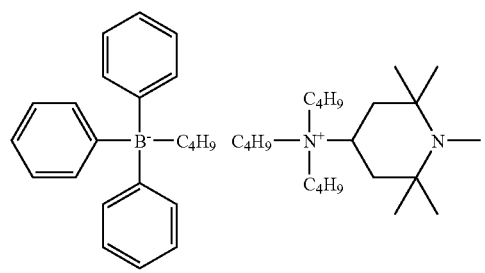
BS-10 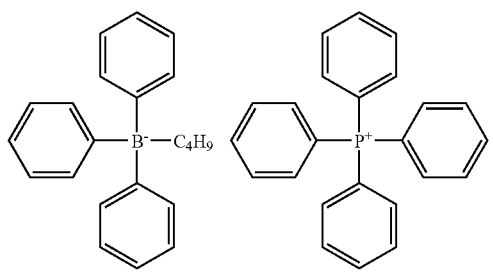

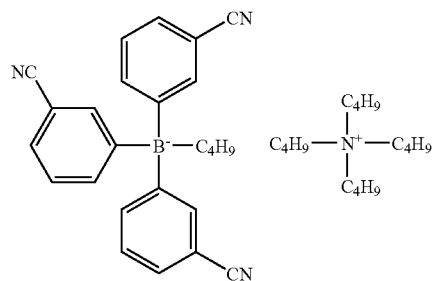
BS-11

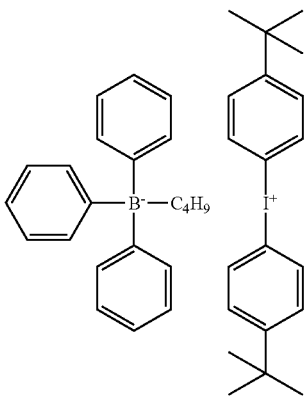
BS-12

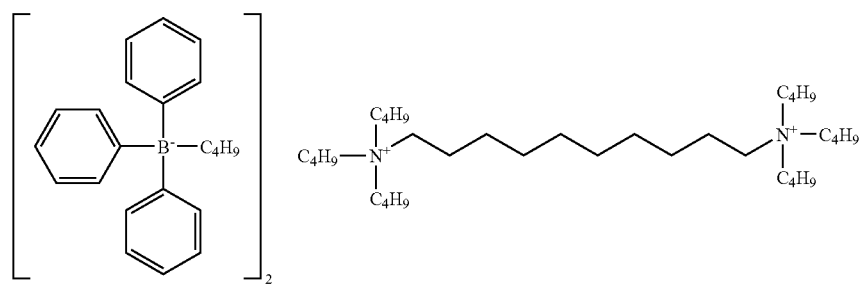
BS-13

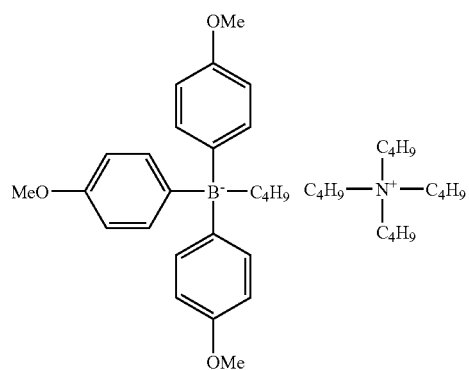
BS-14   BS-15

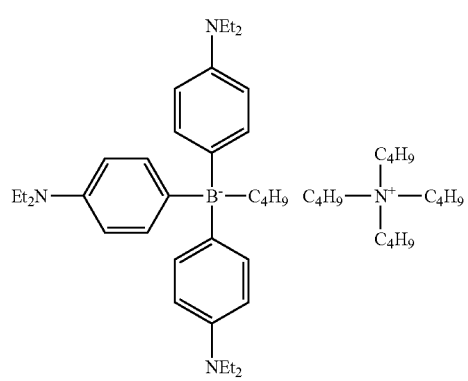
BS-16   BS-17

Various additives can be used together with the photoinitiator system to affect the polymerization rate. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio- (mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N, N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N, 2,4,6-pentamethylaniline (PMA) and p-t-butyl-N,N-dimethylaniline.

It may be preferable to use a photoinitiator in combination with a disulfide coinitiator. Examples of useful disulfides are described in U.S. Pat. No. 5,230,982 by Davis et al. which is incorporated herein by reference. Two preferred disulfides are mercaptobenzothiazo-2-yl disulfide and 6-ethoxymercaptobenzothiazol-2-yl disulfide. In addition, thiols, thioketones, trihalomethyl compounds, lophine dimer compounds, iodonium salts, sulfonium salts, azinium salts, organic peroxides, and azides, are examples of compunds useful as polymerization accelerators.

Other additives that can be incorporated into the photopatternable coatings include polymeric binders, fillers, pigments, surfactants, adhesion modifiers, and the like. To facilitate coating on the support and functional layers the photopatternable film composition is usually dispersed in a solvent to create a solution or slurry, and then the liquid is evaporatively removed, usually with heating, after coating. Any solvent can be employed for this purpose which is inert toward the film forming components and addenda of the photopatternable film.

It may be preferable to practice the invention with positive-working photopatternable materials. By way of example, U.S. Pat. No. 4,708,925 by Newman (hereby incorporated by reference) describes a positive-working photopatternable composition containing novolak phenolic resins, an onium salt, and a dye sensitizer. In this system, there is an interaction between alkali-soluble phenolic resins and onium salts which results in an alkali solvent resistance when it is cast into a film. Photolytic decomposition of the onium salt restores solubility to the resin. Unlike the quinine diazides which can only be poorly sensitized, if at all, onium salts can be readily sensitized to a wide range of the electromagnetic spectrum from UV to infrared (280 to 1100 nm).

Examples of compounds which are known to sensitize onium salts are those in the following classes: diphenylmethane including substituted diphenylmethane, xanthene, acridine, methine and polymethine (including oxonol, cyanine, and merocyanine) dye, thiazole, thiazine, azine, aminoketone, porphyrin, colored aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyaryl-phenylene, coumarin and polyaryl-2-pyrazoline. The addition of a sensitizer to the system renders it sensitive to any radiation falling within the absorption spectrum of the said sensitizer. Other positive-working systems are known to those skilled in the art.

It may be preferable to practice certain embodiments of the present process by forming 3-D structures from the variable density colorscale masks. Generally, due to a threshold exposure effect, binary microstructures are typically produced with conventional photolithographic processes employing conventional photomasks. However, even with a binary photoresist, there exists a dynamic range where the developed resist thickness is a function of the optical density of the photomask. By modifying the developing and baking conditions of the photoresist and carefully mapping the response curve it is possible to further exploit this dynamic range, forming the desired 3-D structures in both positive-working and negative-working photopatternable materials.

Once a photopatternable layer is exposed, it can be developed by any means known the art. Development is the process by which the soluble portions of the photopatternable layer are removed. Methods for developing typically include exposure to a selective solvent, heating, or combinations thereof. A liquid developer can be any convenient liquid that is capable of selectively removing the photopatternable layer based on exposure level. The exposed photopatternable layer can be sprayed, flushed, swabbed, soaked, sonicated, or otherwise treated to achieve selective removal. In its simplest form the liquid developer can be the same liquid employed as a solvent in coating the photopatternable film. In some instances the photoresist is not rendered soluble where it is ultimately to be removed, but is instead rendered susceptible to a particular reaction that occurs during exposure to a development solution which then permits solubility.

In patterning steps where the photopatterned film is not intended to be part of the final article, it needs to be removed after it has been used to successfully pattern an area. This removal can be accomplished with any means known in the art, included plasma treatments, especially plasmas including oxygen, solvent based stripping, and mechanical or adhesive means.

In many embodiments, the photopatternable layer is simply a layer used to pattern another functional layer. However, circumstances may exist in which the photopatterned layer is also the functional layer. Examples of this are the use of a photopatternable as a dielectric due to its insulating behavior, or as a structural element such as a small wall or microcell due to its mechanical properties. This use of photopatterned layers as functional layers is not limited to the above examples.

A process of making an article by the present process, typically involves a light source that emits light of some spectrum, a multicolor mask that contains at least two color records in which each is capable of absorbing light of some spectrum, and a photopatternable layer that is capable of responding to light of some spectrum.

The process function in several modes, including the following:

(1) White light, defined as light of a very broad visible spectrum, can be used as the illumination source. In this case, it is required that the photopatternable layer have a sensitivity distribution that substantially matches the absorption spectrum of the target color record of the color mask. Substantially matching spectrum is defined as the integrated product of the two spectra, each normalized to an area of 1, exceeding 0.5, preferably exceeding 0.75, most preferably exceeding 0.9.

(2) Colored light, as defined by light of a narrow spectrum, can be used as the illumination source. In this case, the absorption spectrum of photopatternable layer can be made to substantially match the spectrum of the emitted light, or the absorption spectrum can be broad. The former case may be desirable for improved sensitivity of the photopatternable layer and reduced cross talk between layers, while the latter case may be desirable for allowing several process steps to employ a single photopatternable layer formulation.

In some cases it may be desirable to apply a black layer to part of the multicolor mask. Such a black layer has the property of absorbing substantially all of the light in those areas of the mask having the black layer. If, for example, large areas of the final product are desired to have no patterning, a black printed mask can be used in those areas.

In much of the preceding discussion the color mask is referred to as having color absorption corresponding to the traditional observable colors of the visible spectrum. However, this applies a limitation to the number of individual mask levels that can be accomplished with this approach. In principle a high number of individual color records can be used provided that each color record can be independently addressed in the process. In addition, by utilizing infrared and ultraviolet portions of the spectrum, the number of mask levels may further be increased. It is envisioned that upwards of 6 individual mask levels can be achieved with the current invention.

In this process, light passes through the multicolor mask and then through the previously applied functional layers on the front of the substrate. As a result, the light must pass through the previously applied layers with weak enough modulation as to not overly affect the resulting images formed on the applied photopatternable layers. The requirement for transparency of the applied functional layers is thus limited to having an acceptably low effect on the curable layer imaging process. In principle therefore, the previously applied materials can absorb light uniformly as long as this absorption is low, preferably having an optical density of less than 0.5. Furthermore, the materials can absorb very strongly but only in regions where the imaging chemistry is not being used, or where these spectral ranges have been used but in prior stages of the manufacture of the article. Furthermore, the final layer in the process can be of any opacity, since additional patterning is not required on top.

An aspect of this invention is the ability to at will use one of the colors of the multicolor mask to form a pattern on the front side of the item by the direction light through the substrate to cause an effect. A number of methods can be used to cause the patterning, for example:

(a) A functional material can be coated uniformly over the multicolor mask of the item and then overcoated with a photopatternable resist material that hardens when it is exposed to light through the substrate. The hardened material is then more difficult to remove, so in a subsequent development step, the photopatternable resist is patterned to have openings where no light has struck. The item can then be exposed to a material that attacks the functional layer, thus removing it where no light has struck. This is a negative etch process. FIG. 9 illustrates how in the present invention a multicolor mask is used in a negative etch patterning sequence.

(b) A functional material can be coated uniformly upon over the multicolor mask of the item and then overcoated with a photopatternable resist material that softens when it is exposed to light from the back side. The softened materials is then easier to remove, so in a subsequent development step, the resist is patterned to have openings where light has struck. The item can then be exposed to a material that attacks the functional layer, thus removing it where light has struck. This is a positive etch process. FIG. 10 illustrates how in the present invention a multicolor mask is used in a negative etch patterning sequence.

(c) A photopatternable resist material can be coated followed by exposure and development step as outlined in (a) or (b). This will yield a resist pattern that has holes in it. This can then be overcoated with a uniform layer of a functional material. If the entire item is then treated with a material that attacks the remaining photoresist under the functional material, it can remove material where photoresist resides. This will leave functional material where there was originally no photoresist. This is a liftoff process. FIG. 11 illustrates how in the present invention a multicolor mask is used in a liftoff patterning process (d) A number of deposition processes employing both liquids and vapor phase chemical delivery can be tailored to operate in a manner where material selectively deposits only in certain areas. For example, a photopatternable resist material can be coated followed by exposure and development step as outlined in (a) or (b). Next, a deposition process that leads to material being deposited only in those regions where no resist material remains. The entire item is then treated with a material that attacks the remaining resist. This is selective deposition. FIG. 12 illustrates how a multicolor mask can be used in the present invention using a selective deposition patterning process.

A support can be used for supporting the device during manufacturing, testing, and/or use. As used in this disclosure, the terms "support" and "substrate" may be used interchangeably. The skilled artisan will appreciate that a support selected for commercial embodiments may be different from one selected for testing or screening various embodiments. In some embodiments, the support does not provide any necessary electrical function for the device. This type of support is termed a "non-participating support" in this document. Useful materials can include organic or inorganic materials. For example, the support may comprise inorganic glasses, ceramic foils, polymeric materials, filled polymeric materials, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP).

A flexible support is used in some embodiments. This allows for roll-to-roll or roll-to-sheet processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

If flexibility is not a concern, then the substrate may be a wafer or sheet made of materials including glass as well as any other transparent material. The thickness of the substrate may vary, and according to particular examples it can range from about 10 µm to about 1 mm. Preferably, the thickness of the substrate is in the range from about 10 µm to about 300 µm. Provided the exposing light source is sufficiently collimated to limit the angular spread of light through the support layer, even thicker substrates can be tolerated. Particularly for embodiments where a portion of the multicolor mask is on the back side of the support it may be advantageous, for optical considerations, to coat or cast the main support layer directly onto the color absorbing layers of the second portion of the multicolor mask. In some embodiments, the support is optional, particularly when support layer is a functional layer or a color absorbing layer of the multicolor mask.

In addition, the multicolor mask and support may be combined with a temporary support. In such an embodiment, a support may be detachably adhered or mechanically affixed to the multicolor mask.

Any material that can form a film on the substrate can be patterned with this invention, as long as the appropriate etching and or deposition conditions are chosen. General classes of functional materials that can be used include conductors, dielectrics or insulators, and semiconductors. Functional materials of the present invention may be deposited in using any convenient method. Typical deposition processes include chemical vapor deposition, sputtering, evaporation, thermal transfer or solution processing. One embodiment of the current invention, the functional materials are applied using gravure or inkjet. In another embodiment the functional material is deposited using Atomic Layer Deposition (ALD). In a preferred embodiment of the present invention, the functional material is deposited by an ALD system consisting of a gas distribution manifold having a plurality of openings through which first and second reactive gases flow as the manifold and the substrate move relative to each other. Co-pending, commonly assigned US Patent Publication No. 2007/0238311 describes such a method in detail and the disclosure of which is hereby incorporated in its entirety by reference.

Conductors can be any useful conductive material. A variety of conductor materials known in the art, are also suitable, including metals, degenerately doped semiconductors, conducting polymers, and printable materials such as carbon ink, silver-epoxy, or sinterable metal nanoparticle suspensions. For example, the conductor may comprise doped silicon, or a metal, such as aluminum, chromium, gold, silver, nickel, copper, tungsten, palladium, platinum, tantalum, and titanium. Conductors can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be most useful.

The thickness of the conductor may vary, and according to particular examples it can range from about 5 to about 1000 nm. The conductor may be introduced into the structure by chemical vapor deposition, sputtering, evaporation and/or doping, or solution processing.

A dielectric electrically insulates various portions of a patterned circuit. A dielectric layer may also be referred to as an insulator or insulating layer. The dielectric should have a suitable dielectric constant that can vary widely depending on the particular device and circumstance of use. For example, a dielectric constant from about 2 to 100 or even higher is known for a gate dielectric. Useful materials for a dielectric may comprise, for example, an inorganic electrically insulating material. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used as a dielectric. Of these materials, aluminum oxides, silicon oxides, and silicon nitride are useful. The dielectric may comprise a polymeric material, such as polyvinylidenedifluoride (PVDF), cyanocelluloses, polyimides, polyvinyl alcohol, poly(4-vinylphenol), polystyrene and substituted derivatives thereof, poly(vinyl naphthalene) and substituted derivatives, and poly(methyl methacrylate) and other insulators having a suitable dielectric constant. The gate electric may comprise a plurality of layers of different materials having different dielectric constants.

The thickness of a dielectric layer may vary, and according to particular examples it can range from about 15 to about 1000 nm. The dielectric layer may be introduced into the structure by techniques such as chemical vapor deposition, sputtering, atomic layer deposition, evaporation, or a solution process.

Semiconductors used in this system may be organic or inorganic. Inorganic semiconductors include classes of materials exhibiting covalently bonded lattices, and may also include amorphous materials where the lattice exhibits only short range order. Examples of useful semiconducting materials are single elements such as silicon or germanium, and compound semiconductors such as gallium arsenide, gallium nitride, cadmium sulfide, and zinc oxide. Useful organic semiconductors include linear acenes such as pentacenes, naphthalenediimides such as those described in co-pending patent applications, perylenediimides, polythiophenes, polyfluorenes.

In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the charge carrier concentration. Furthermore, it is desired that the device be weakly or not at all influenced by visible light. In order for this to be true, the semiconductor band gap must be sufficiently large (>3 eV) so that exposure to visible light does not cause an inter-band transition. A material that is capable of yielding a high mobility, low carrier concentration, and high band gap is ZnO.

The entire process of making a thin film transistor or electronic device, is preferably carried out below a maximum support temperature of about 200° C., more preferably below 150° C., most preferably below about 140° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports and the multicolor mask. Thus, the invention enables production of relatively inexpensive circuits containing thin film transistors.

EXAMPLES

The following non-limiting examples further describe the practice of the instant invention.

A. Visible Light Curable Film Components

The following materials and coating solutions were used to prepare the visible light patternable films.

Stock solution CF-1 was a commercial product CT2000L supplied by Fuji Photochemicals containing a methacrylate derivative copolymer and polyfunctional acrylate resin in a mixture of 2-propanol-1-methoxyacetate and 1-ethoxy-2-propanol acetate. Stock solution CF-2 was a positive-working commercial resist SC-1827, (purchased from Rohin and Haas Electronic Materials). Stock solution CF-3 was prepared as follows. To a solution containing 2 g of a 10% dispersion of a cyan pigment and 7.4 g of water, 0.5 g of gelatin were dissolved in a 55° C. water bath, and 0.8 g of a 10% solution of potassium dichromate was added. Stock solution CF-4 was prepared as follows. To a solution containing 2.6 g of a 10% dispersion of a yellow pigment and 7.4 g of water, 0.5 g of gelatin were dissolved in a 55° C. water bath, and 0.8 g of a 10% solution of potassium dichromate was added. Stock solution CF-5 was prepared as follows. To a solution containing 2 g of a 10% dispersion of magenta pigment and 7.4 g of water, 0.5 g of gelatin were dissolved in a 55° C. water bath, and 0.8 g of a 10% solution of potassium dichromate was added. Stock solution CF-1 was sensitized to visible light by addition of a dye photoinitiator. Photoinitiator structures appear in Table 1. Photoinitiator solutions were prepared as follows. YPI-1 was a 1% solution of yellow photoinitiator A in cyclohexanone. MPI-1 was a 1% solution of magenta photoinitiator in cyclohexanone. CPI-1 was a 1% solution of photoinitiator C in cyclohexanone. Developer D-1 was an aqueous solution containing 0.002 M tetramethylammonium hydroxide and 0.002 M diethanolamine. Developer D-2 was Microposit™ MF™-319, purchased from Rohm and Haas Electronic Materials. Developer D-3 was 55° C. water.

oxide coatings were applied using this ALD coating device with diethyl zinc and water as reactive materials entrained in a nitrogen carrier gas. Indium tin oxide (ITO) coatings were applied using a sputter coater. Aluminum coatings (Al) were evaporated.

The following solutions were used to etch the functional materials. E-1 was a 50/50 mixture of HCl and water. E-2 was a 0.25 molar solution of acetic acid in water. E-3 was Microposit™ MF™-319 Developer purchased from Rohm and Haas Electronic Materials. Subbing layer S-1 was a 7.5% solution of polycyanoacrylate in a 50/50 mixture of acetonitrile and cyclopentanone. S-2 was Omnicoat™, purchased from MicroChem.

TABLE 1

| | Dye | $\lambda_{max}$ |
|---|---|---|
| Photoinitiator A | [structure] | 450 nm |
| Photoinitiator B | [structure] | 555 nm |
| Photoinitiator C | [structure] | 645 nm |

B. Electronic Materials Deposition and Patterning

The following materials and methods were used to deposit electronic materials. The device used to prepare the $Al_2O_3$ layers and ZnO layers has been described in detail in U.S. patent application Ser. No. 11/627,525, hereby incorporated by reference in its entirety. Alumina coatings were applied using this coating device with trimethylaluminum and water as reactive materials entrained in a nitrogen carrier gas. Zinc C. Electrical Characterization of Transistor Structures Electrical characterization of the fabricated devices was performed with a Hewlett Packard HP 4156® parameter analyzer. Device testing was done in air in a dark enclosure.

The results were averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. Vg was swept from minus 10 V to 40 V for each of the drain voltages measured, typically 5 V, 20 V, and 35 V, and 50 V. Mobility measurements were taken from the 35V sweep.

Parameters extracted from the data include field-effect mobility (μ), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L} \mu C_{ox}(V_g - V_{th})^2$$

where, W and L are the channel width and length, respectively, and $C_{OX}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

Example 1

Colorscale Mask For Active Matrix Display

In this example, an active matrix multicolor mask AM-1 was prepared that contained the patterning information to create an array of pixel circuits for an active matrix display. A schematic diagram of the color absorbing layers for the multicolor mask is shown in FIGS. 17-20. Although the layout shown in FIGS. 17-20 is not drawn exactly to scale, the color-coding of the various components in the active matrix display design is consistent with the previous description. An expanded view of the color patterns in multicolor mask AM-1 for the individual active matrix display pixel circuit is also shown schematically in FIGS. 16A-D. Multicolor mask AM-1 contained red color absorbing layer RCA-1, green color absorbing layer GCA-1, a variable density blue-absorbing layer BCA-1 (an overlay of BCA-1Lo and BCA-1Hi patterns) and planarizing layer P-2. The four patterns in this mask corresponded to separate functional layers of the array of pixel circuits. Cyan (SC3200L), magenta (SM3000L), yellow (SY3000L), and clear (CT-2000L) UV curable photoresists were purchased from Fujifilm Electronic Materials Co., Ltd. Laser-written molybdenum on glass masks were prepared for the first conductor layer (CG-1), dielectric layer (CG-2), second conductor layer (CG-3), and semiconductor layer (CG-4) of the array of thin film transistor devices. Photoresist coatings were aligned and exposed to UV light using a contact aligner equipped with a 200 W Mercury-Xenon lamp.

Red color absorbing layer RCA-1 was applied to a clean glass support by the following method. The glass substrate was spin coated (at 1000 RPM) with the cyan photoresist SC3200L, baked for 1 minute at 95° C., and exposed using mask CG-1. The coating was developed, and baked for 5 minutes at 200° C., forming red color absorbing layer RCA-2. The cyan color absorbing pattern RCA-1 was a negative of the desired first conductor layer, shown schematically in FIGS. 16A and 17. The first conductor layer forms the gate of both a drive and a select TFT, as well as a portion of the pixel electrode. Additionally, the red color pattern contained the patterning information for forming electrical interconnects for the V-data line.

Green color absorbing layer GCA-1 was subsequently applied to the sample by the following method. The sample was spin coated (at 1000 RPM) with the magenta photoresist SM3000L, baked for 1 minute at 95° C., and exposed using mask CG-3. The coating was developed, and baked for 5 minutes at 200° C. forming green color absorbing layer GCA-1. The green color absorbing pattern GCA-1 was a negative of the desired second conductor layer, shown schematically in FIGS. 16B and 18. GCA-1 included patterning information to form the source and drain terminals for both the drive and select TFTs as well as the bus structures power line, select line and data line. The patterning information in GCA-1 is also necessary to complete the capacitor in this pixel circuit; the capacitor is defined by the overlap of the gate electrode and the source-capacitor of the drive transistor. Additionally, the patterning information in GCA-1 provides for an additional thickness of conductor over the pixel electrode. GCA-1 also included patterning information to form additional contact pads for making electrical connections into the array of pixel circuits.

Blue color absorbing layer BCA-1Lo was subsequently applied to the sample by the following method. The sample was then spin coated (at 1000 RPM) with yellow photoresist, SY3000L, baked for 1 minute at 95° C., and exposed using mask CG-2 (contact exposure). The yellow photoresist layer was developed, and baked for 5 minutes at 200° C. forming blue color absorbing layer BCA-1Lo. The desired dielectric layer pattern was a positive of the blue color absorbing layer BCA-1Lo, and corresponded to both density portions of the variable density pattern shown schematically in FIGS. 16C and 19. BCA-1Lo included patterning information to create the gate insulator for both the select and drive TFTs, the dielectric material for the capacitor, and via-holes to form electrical interconnects between the first and second conductor layers.

Blue color absorbing layer BCA-1Hi was subsequently applied to the sample by the following method. The sample was then spin coated (at 1000 RPM) with yellow photoresist, SY3000L, baked for 1 minute at 95° C., and exposed using mask CG-2 (contact exposure). The yellow photoresist layer was developed, and baked for 5 minutes at 200° C. forming blue color absorbing layer BCA-1Hi. The desired semiconductor layer pattern was a positive of the blue color absorbing layer BCA-1Hi, and corresponded to the high density portion of the variable density pattern shown schematically in FIGS. 16C and 19. BCA-1Hi included patterning information to create the semiconductor layer for both the select and drive TFTs in the array of active matrix display pixel circuits. Planarizing layer P-2 was subsequently applied. The sample was spin coated (at 1000 RPM) with clear photoresist CT2000L, exposed to UV light and baked for 5 minutes at 200° C. The resulting multicolor mask AM-1 contained an array of registered cyan (RCA-1), magenta (GCA-1), a variable density yellow (BCA-1Lo and BCA-1Hi) patterns and a clear planarizing layer P-2.

Example 2

Array of Active Matrix Display Pixel Circuits

In this example, an array of active matrix display pixel circuits was prepared using the multicolor mask AM-1 to pattern transparent electronic materials. The array of pixel circuits were prepared on the same side of the substrate as the multicolor mask.

The first conductor layer was patterned using a negative etch process and red-sensitive photopatternable material. The sample was coated with 1000 Angstroms of sputtered indium-tin-oxide, which was used as the first conductor layer, applied directly over the planarizing layer P-2. A coating solution was prepared containing 4 g of CF-1 and 0.5 g of the photoinitiator solution CPI-1. The coating solution was spin coated at 2000 RPM for one minute and dried for 2 minutes at 90° C. A 10% PVA coating was applied at 1000 RPM for 2 minutes and dried at 90° C. for 2 minutes. The coating was exposed using red light in such fashion that exposing light passed through the glass support and multicolor mask layers AM-1 before reaching the photosensitive coating, and coatings were developed using developer solution D-1. These steps resulted in formation of an aligned polymer film that was a negative of the red color absorbing layer RCA-1. The sample was treated with oxygen plasma as a descum step. The sample was immersed in etch bath E-1, rinsed, and dried in order to pattern the ITO layer. Residual photosensitive material was removed from the sample in an acetone bath and an oxygen plasma treatment. This sequence of steps resulted in formation of a pattern of the first conductor (ITO), aligned with the red color absorber pattern RCA-1. The first conductor pattern was a negative copy of this red color absorber layer.

The dielectric material was patterned using a positive etch process and blue-sensitive photopatternable material. The sample was then coated with 1000 Angstroms of alumina dielectric material applied using an atmospheric pressure deposition process. Stock solution CF-2 was spin coated at 3000 RPM for 1 minute and baked for 1 minute at 100° C. The coating was exposed using blue light in such fashion that exposing light passed through the glass support and multicolor mask layers AM-1 before reaching the photosensitive coating. The exposure level was set for the first density level (Blue Level 1) of multicolor mask AM-1, and the coating was developed using developer solution D-2. These steps resulted in formation of an aligned polymer film that was a positive of the blue color absorbing layer BCA-1Lo. The sample was immersed in etch bath E-3, rinsed, and dried in order to pattern the alumina dielectric layer. Residual photosensitive material was removed from the sample in an acetone bath and an oxygen plasma treatment. This sequence of steps resulted in formation of a pattern of the dielectric material (alumina), aligned with the blue color absorber pattern BCA-1Lo. The dielectric material pattern was a positive copy of the blue color absorber pattern.

The second conductor layer was patterned using a negative etch process and green-sensitive photopatternable material. The sample was coated with 1000 Angstroms of sputtered indium-tin-oxide, which was used as the second conductor layer. A coating solution was prepared containing 4 g of CF-1 and 0.5 g of the photoinitiator solution MPI-1. The coating solution was spin coated at 2000 RPM for one minute and dried for 2 minutes at 90° C. A 10% PVA coating was applied at 1000 RPM for 2 minutes and dried at 90° C. for 2 minutes. The coating was exposed using green light in such fashion that exposing light passed through the glass support and multicolor mask layers AM-1 before reaching the photosensitive coating, and coatings were developed using developer solution D-1. These steps resulted in formation of an aligned polymer film that was a negative of the green color absorbing layer GCA-1. The sample was treated with oxygen plasma as a descum step. The sample was immersed in etch bath E-1, rinsed, and dried in order to pattern the second conductor layer. Residual photosensitive material was removed from the sample in an acetone bath and an oxygen plasma treatment. This sequence of steps resulted in formation of a pattern of the second conductor (ITO), aligned with the green color absorber pattern GCA-1. The second conductor pattern was a negative copy of this green color absorber layer.

The zinc oxide semiconductor material was patterned using a blue-sensitive photocrosslinkable material in a selective deposition process. A coating solution was prepared containing 4 g of CF-1 and 0.5 g of the photoinitiator solution YPI-1. The coating solution was spin coated at 2000 RPM for one minute and dried for 2 minutes at 90° C. A 10% PVA coating was applied at 1000 RPM for 2 minutes and dried at 90° C. for 2 minutes. The coating was exposed using blue light in such fashion that exposing light passed through the glass support and multicolor mask layers AM-1 before reaching the photosensitive coating. The exposure level was set for the second density level (Blue Level 2) of multicolor mask AM-1, and the coating was developed using developer solution D-1. These steps resulted in formation of an aligned polymer film that was a negative of the blue color absorbing layer BCA-1Hi. A 100 Angstrom thick layer of zinc oxide semiconductor material was selectively applied using an atmospheric deposition process. This procedure resulted in formation of a pattern of the semiconductor (ZnO), aligned with the blue color absorber pattern BCA-1Hi. The semiconductor pattern was a positive copy of this blue color absorber pattern.

Electrical testing verified that this fabrication process resulted in the formation of the desired array of active matrix pixel circuits, consisting of both a drive and select TFT, a capacitor, a pixel electrode, as well as the bus structures power line, select line and data line. The four functional layers in this array of active matrix pixel circuits were fully self-aligned.

Example 3

Array of Active Matrix Display Pixel Circuits on Flexible Support

In this example, an array of active matrix display pixel circuits was prepared using a multicolor mask AM-2 to pattern transparent electronic materials on a 100 um thick flexible (PEN) support. The display pixel circuits were prepared on the opposite side of the substrate as the color mask. The color absorbing layers in AM-2 had essentially the same layout as for multicolor mask AM-1. A schematic diagram of the color absorbing layers for the multicolor mask is shown in FIGS. 17-20. Although the layout shown in FIGS. 17-20 is not drawn exactly to scale, the color-coding of the various components in the active matrix display design is consistent with the previous description. An expanded view of the color patterns in multicolor mask AM-1 for the individual active matrix display pixel circuit is also shown schematically in FIGS. 16A-D.

The first step in fabricating the array of display pixel circuits was to prepare the multicolor mask on one side of the PEN support. This multicolor mask contained color absorbing layers RCA-2, GCA-2, BCA-2Lo, and BCA-2Hi, with each layer corresponding to an individual functional layer of an array of display pixel circuits, as has been described above. Color absorbing layers were applied using the following procedure. The PEN support material was warmed to 90° C. on a hot plate. Approximately 6 g of warm (55° C.) color absorber solution was spin-coated at 2000 RPM, exposed to a pattern of UV light using a laser-written photomask. The exposed coating was developed for 3 minutes in D-3. The developed coating was rinsed and dried. Red color absorbing layer RCA-2 was applied using color absorber solution CF-3 and exposed with mask CG-1. Blue color absorbing layer BCA-2Lo and BCA-2Hi were applied using blue color absorber solution CF-4 and exposed with masks CG-2 and CG-4, respectively. Green color absorbing layer GCA-4 was applied using green color absorber solution CF-5, and exposed with mask CG-3. The PEN support material carrying the multicolor mask was heat stabilized for 1 hour at 180C. in an oven.

The array of active matrix pixel display circuits was prepared on the opposite side (front side) of the substrate from the color absorbing layers (back side). During the exposure steps described below, the sample was illuminated from the back side, so that exposing light was filtered by the color absorbing layers before reaching the photosensitive coatings.

The first conductor layer, dielectric layer, and semiconductor layer were deposited and patterned according to the same procedures described above. The zinc oxide semiconductor material was patterned using a blue-sensitive photopatternable material in an etch process using the following procedure. The sample was coated with 200 Angstroms of zinc oxide semiconductor material using an atmospheric deposition process. Stock solution CF-2 was spin coated at 3000 RPM for 1 minute and baked for 1 minute at 100° C. The coating was exposed using blue light in such fashion that exposing light passed through the glass support and multicolor mask layers AM-2 before reaching the photosensitive coating. The exposure level was set for the high density level (Blue Level 2) of multicolor mask AM-1, and the coating was developed using developer solution D-2. These steps resulted in formation of an aligned polymer film that was a positive of the blue color absorbing layer BCA-2Hi. The sample was immersed in etch bath E-2, rinsed, and dried in order to pattern the zinc oxide layer. This procedure resulted in formation of a pattern of the semiconductor (ZnO), aligned with the blue color absorber pattern BCA-1Hi. The semiconductor pattern was a positive copy of this blue color absorber pattern.

Electrical testing verified that this fabrication process resulted in the formation of the desired array of active matrix pixel circuits, consisting of both a drive and select TFT, a capacitor, a pixel electrode, as well as the bus structures power line, select line and data line. The four functional layers in this array of active matrix pixel circuits were fully self-aligned.

The above Examples illustrate that the process of the current invention allows for accurate placement of any number of transparent functional layers on the substrate even while exposing the substrate to varying temperature and solvent treatments. Further, even for large area substrates, there are no issues with dimensional distortion of the substrate or mechanical alignment errors leading to cumulative and catastrophic alignment errors. Because a single mask that is part of the substrate can contain pattern information for all of the layers in a process, the fabrication is fully self-aligning, and catastrophic overlay errors arising from dimensional change of supports, web weave, and transport errors are avoided.

The invention claimed is:

1. A process for forming a pixel circuit, comprising:
 a) providing a transparent support having a first side;
 b) forming a multicolor mask having at least four different color patterns; and
 c) forming integrated electronic components of the pixel circuit having at least four layers of patterned functional material comprising a first conductor, a dielectric, a semiconductor, and a second conductor each layer of patterned functional material corresponding to said at least four different color patterns of the multicolor mask, each layer of patterned functional material formed by:
   i) coating a layer of a photopatternable material sensitive to visible light on the first side of the transparent support after forming the multicolor mask;
   ii) exposing the layer of photopatternable material through the multicolor mask with visible light to form a photopattern corresponding to one color pattern of said color patterns of the multicolor mask, wherein the photopattern is composed of photopatternable material in a second exposed state that is different from a first as-coated state;
   iii) depositing a layer of a functional material before or after coating the photopatternable material; and
   iv) patterning the functional material using the photopattern such that the resulting patterned functional material corresponds to said one color pattern;
 wherein the multicolor mask comprises:
   i) a first color pattern corresponding to the first conductor, wherein a color portion of the first color pattern comprises a negative copy of the first conductor's pattern;
   ii) a second color pattern corresponding to the dielectric, wherein a color portion of the second color pattern comprises a positive copy of the dielectric's pattern;
   iii) a third color pattern corresponding to the semiconductor, wherein a color portion of the third color pattern comprises positive copy of the semiconductor's pattern; and
   iv) a fourth color pattern corresponding to the second conductor, wherein a color portion of the fourth color pattern comprises a positive or negative copy of the second conductor's pattern.

2. The process of claim 1 wherein two of the color patterns have the same absorption spectral range and different optical densities.

3. The process of claim 1 wherein at least one color pattern of the multicolor mask is on the first side of the transparent support.

4. The process of claim 1 wherein at least three of the color patterns each have a different absorption spectral range.

5. The process of claim 1 further comprising forming a light emitting or light modulating layer over at least a portion of the pixel circuit.

6. The process of claim 5 wherein forming a light emitting layer comprises depositing organic or inorganic materials.

7. The process of claim 1 wherein said multicolor mask comprises a multicolor layer formed by photographic replication of a master color image onto said transparent support.

8. The process of claim 1 wherein said multicolor mask is laminated onto said transparent support after being preformed onto a separate substrate.

9. The process of claim 1 wherein said multicolor mask is directly printed onto said transparent support.

10. The process of claim 1 wherein said transparent support comprises glass or flexible polymer.

11. The process of claim 1 wherein the integrated electronic components of the pixel circuit comprises at least one thin film transistor.

12. The process of claim 1 wherein the pixel circuit comprises a transparent pixel electrode.

13. The process of claim 1 wherein the second conductive material is metal.

14. The process of claim 1 wherein the dielectric comprises a material selected from the group consisting of aluminum oxide, silicon oxide, silicon nitride, and mixtures thereof.

15. The process of claim 1 wherein the first conductor comprises a transparent material that is selected from the group consisting of indium-tin-oxide, ZnO, $SnO_2$, or $In_2O_3$, metals, degenerately doped semiconductors, conducting polymers, carbon ink, silver-epoxy, sinterable metal nanoparticle suspensions, and mixtures thereof.

16. The process of claim 1 wherein the semiconductor comprises a material selected from the group consisting of zinc oxide based semiconductors, tin-oxide based semiconductors, and mixtures thereof.

* * * * *